(12) United States Patent
de Rochemont

(10) Patent No.: US 9,490,414 B2
(45) Date of Patent: Nov. 8, 2016

(54) FULLY INTEGRATED THERMOELECTRIC DEVICES AND THEIR APPLICATION TO AEROSPACE DE-ICING SYSTEMS

(76) Inventor: L. Pierre de Rochemont, Austin, TX (US)

(*) Notice: Subject to any disclaimer, the term of this patent is extended or adjusted under 35 U.S.C. 154(b) by 1105 days.

(21) Appl. No.: 13/602,019

(22) Filed: Aug. 31, 2012

(65) Prior Publication Data

US 2013/0061605 A1 Mar. 14, 2013

Related U.S. Application Data

(60) Provisional application No. 61/529,302, filed on Aug. 31, 2011.

(51) Int. Cl.

| F25B 21/02 | (2006.01) |
|---|---|
| H01L 35/34 | (2006.01) |
| H01L 35/32 | (2006.01) |
| H01L 35/18 | (2006.01) |
| H01L 35/30 | (2006.01) |
| B64D 15/12 | (2006.01) |

(52) U.S. Cl.
CPC ............ H01L 35/32 (2013.01); B64D 15/12 (2013.01); H01L 35/18 (2013.01); H01L 35/30 (2013.01)

(58) Field of Classification Search
None
See application file for complete search history.

(56) References Cited

U.S. PATENT DOCUMENTS

| 6,130,471 A | 10/2000 | Boles |
|---|---|---|
| 6,278,049 B1 | 8/2001 | Johnson et al. |
| 6,314,741 B1 | 11/2001 | Hiraishi |
| 6,940,087 B2 | 9/2005 | Komoda et al. |
| 7,033,927 B2 | 4/2006 | Cohen et al. |
| 7,957,137 B2 | 6/2011 | Prasher |
| 2002/0026856 A1 | 3/2002 | Suzuki et al. |
| 2004/0070334 A1 | 4/2004 | Buckley et al. |
| 2004/0145874 A1 | 7/2004 | Pinel et al. |
| 2005/0127389 A1 | 6/2005 | Fujiwara |
| 2006/0189104 A1 | 8/2006 | Yan |
| 2007/0181906 A1 | 8/2007 | Chik et al. |
| 2009/0020148 A1 | 1/2009 | Boukai et al. |
| 2009/0025771 A1 | 1/2009 | Stark |
| 2009/0293930 A1 | 12/2009 | Yang et al. |
| 2010/0019619 A1 | 1/2010 | Hagg |
| 2010/0108986 A1 | 5/2010 | Fuertes Maron et al. |
| 2010/0155786 A1 | 6/2010 | Heald et al. |
| 2010/0186794 A1 | 7/2010 | Chen et al. |
| 2010/0236937 A1 | 9/2010 | Rosvall et al. |
| 2011/0000224 A1 | 1/2011 | Ghoshal et al. |
| 2011/0038729 A1 | 2/2011 | Shymanki et al. |

FOREIGN PATENT DOCUMENTS

CN 1450580 A 10/2003

OTHER PUBLICATIONS

International Search Report dated Feb. 5, 2013 for PCT/US2012/053549.

*Primary Examiner* — Robert Carpenter
(74) *Attorney, Agent, or Firm* — Burns & Levinson, LLP; David W. Gomes; Jerry Cohen

(57) ABSTRACT

A thermoelectric module and methods for making and applying same provide an integrated, layered structure comprising first and second, thermally conductive, surface volumes, each in thermal communication with a separate respective first and second electrically conductive patterned trace layers, and an array of n-type and p-type semiconducting elements embedded in amorphous silica dielectric and electrically connected between the first and second patterned trace layers forming a thermoelectric circuit.

16 Claims, 55 Drawing Sheets

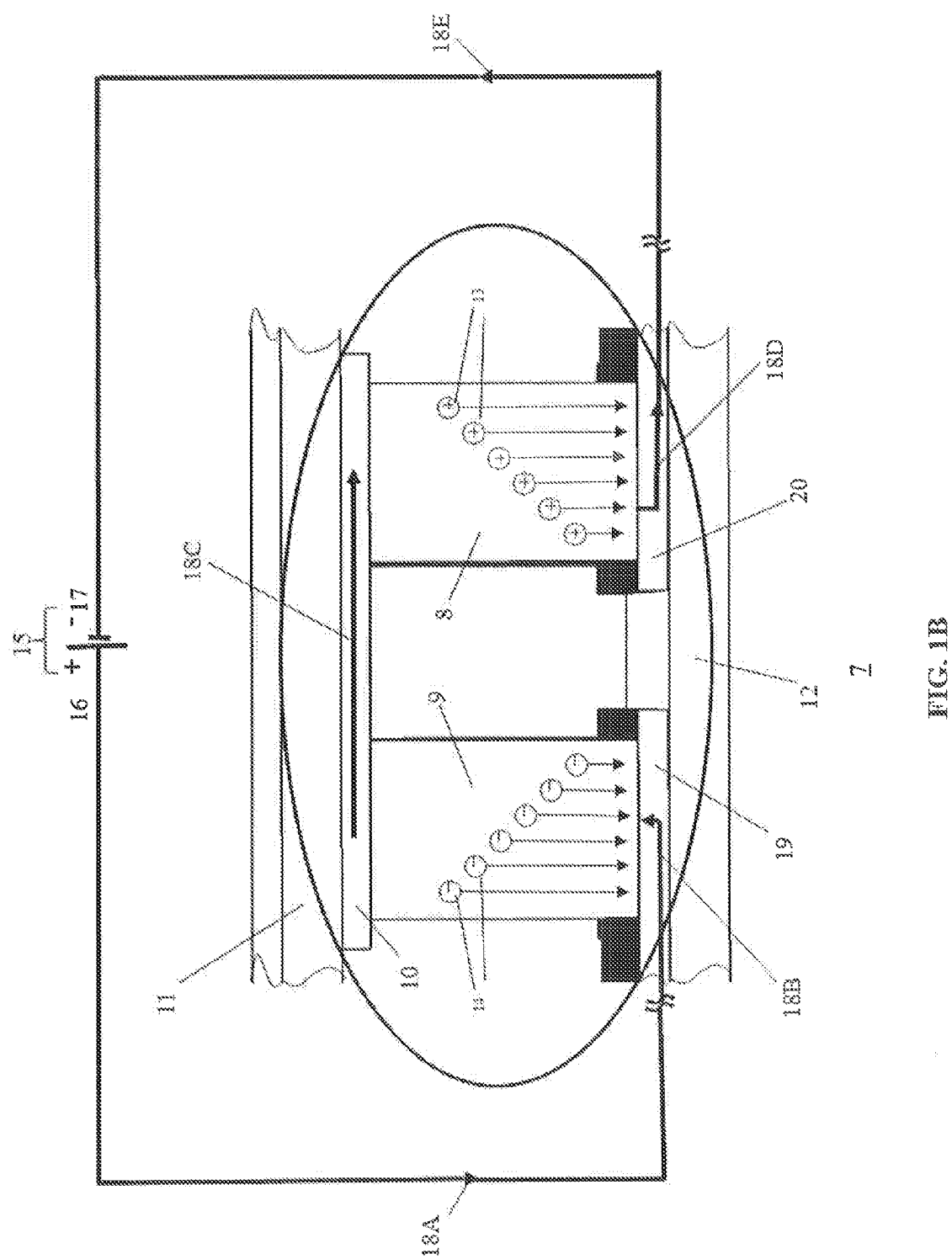

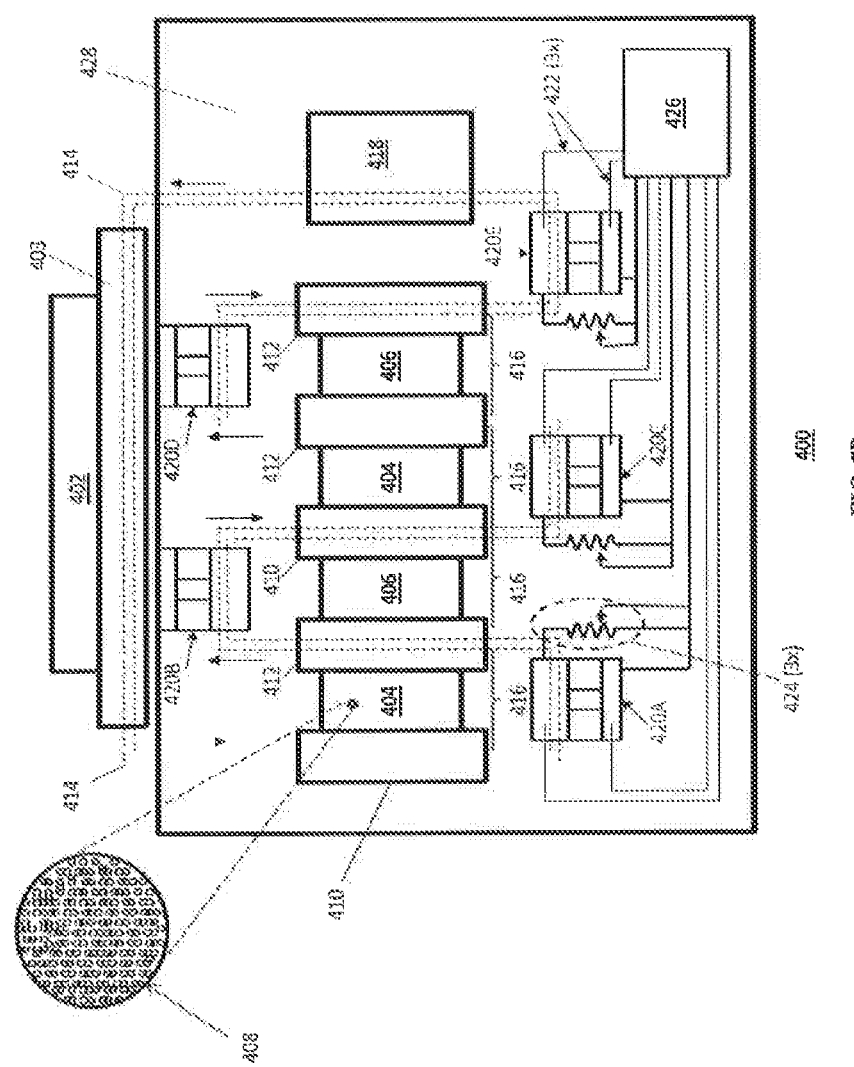

CROSS SECTION: A'—A'

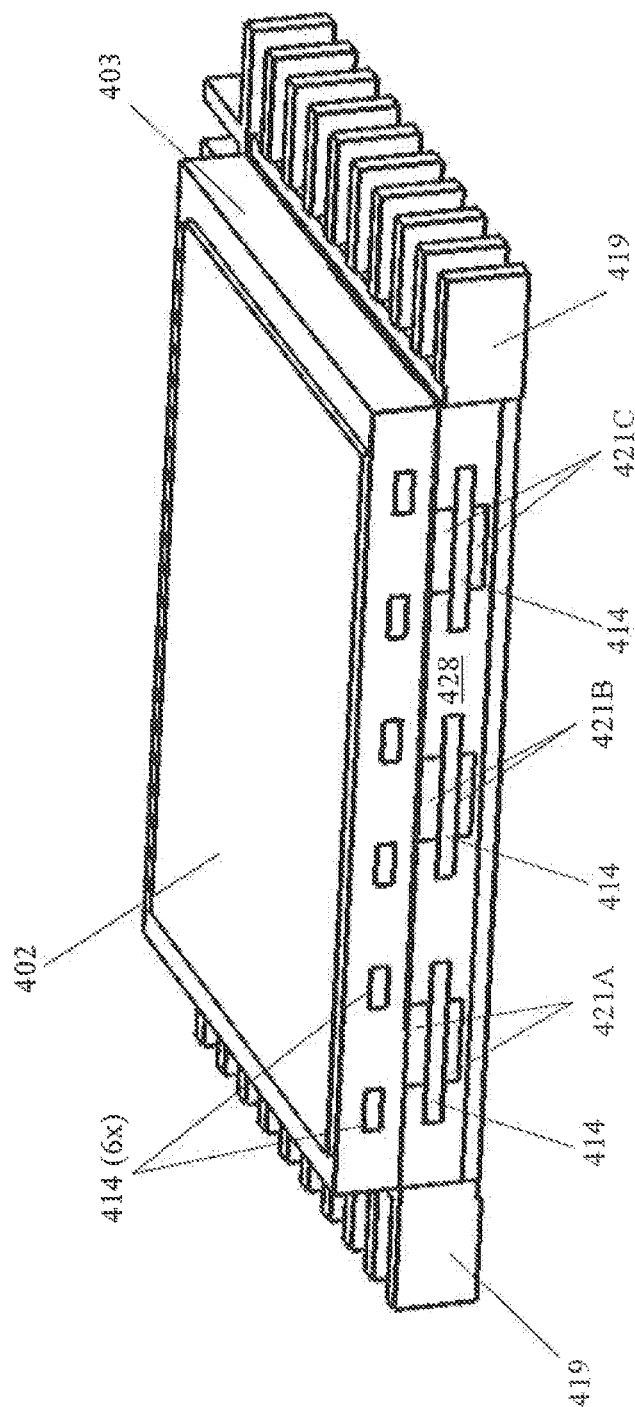

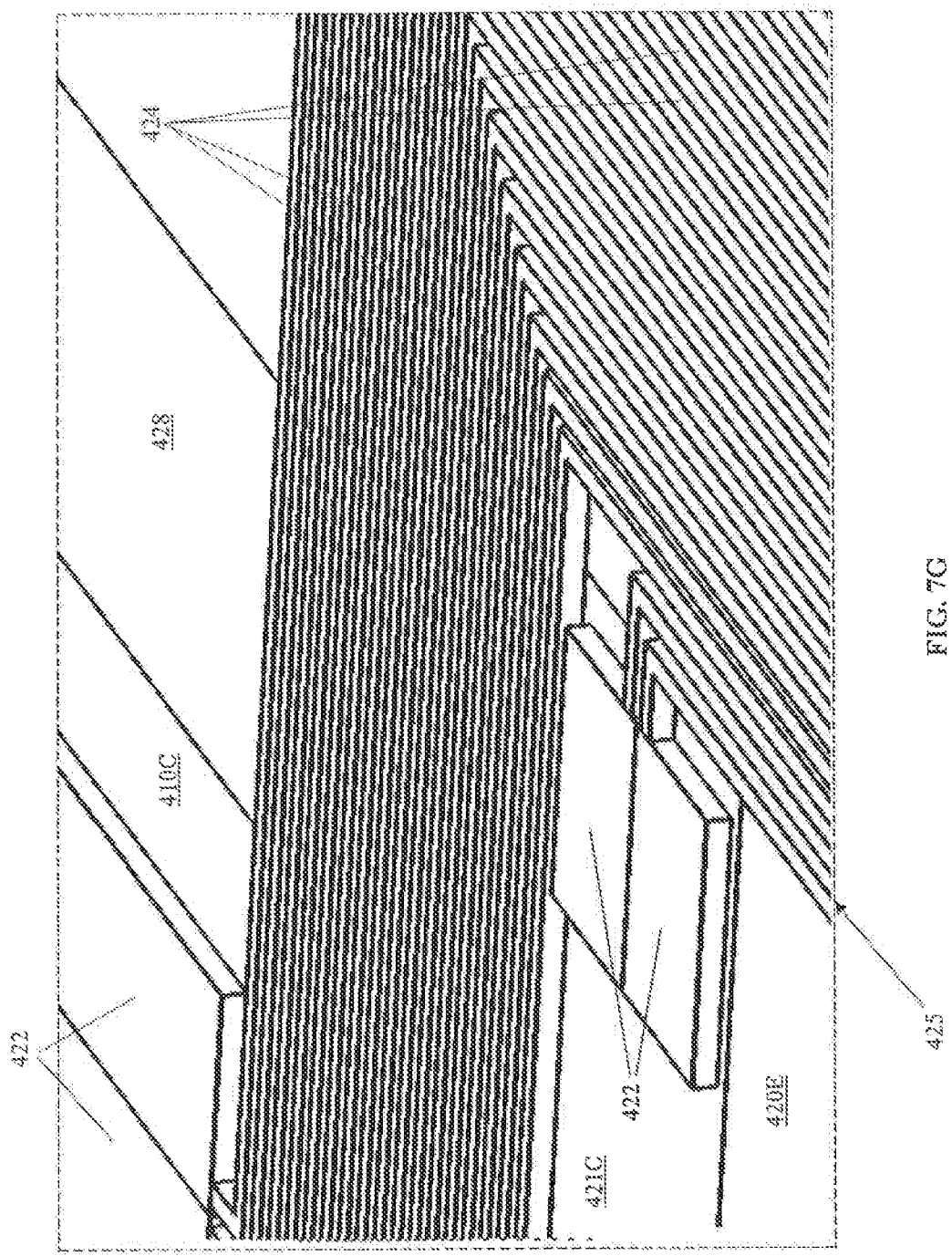

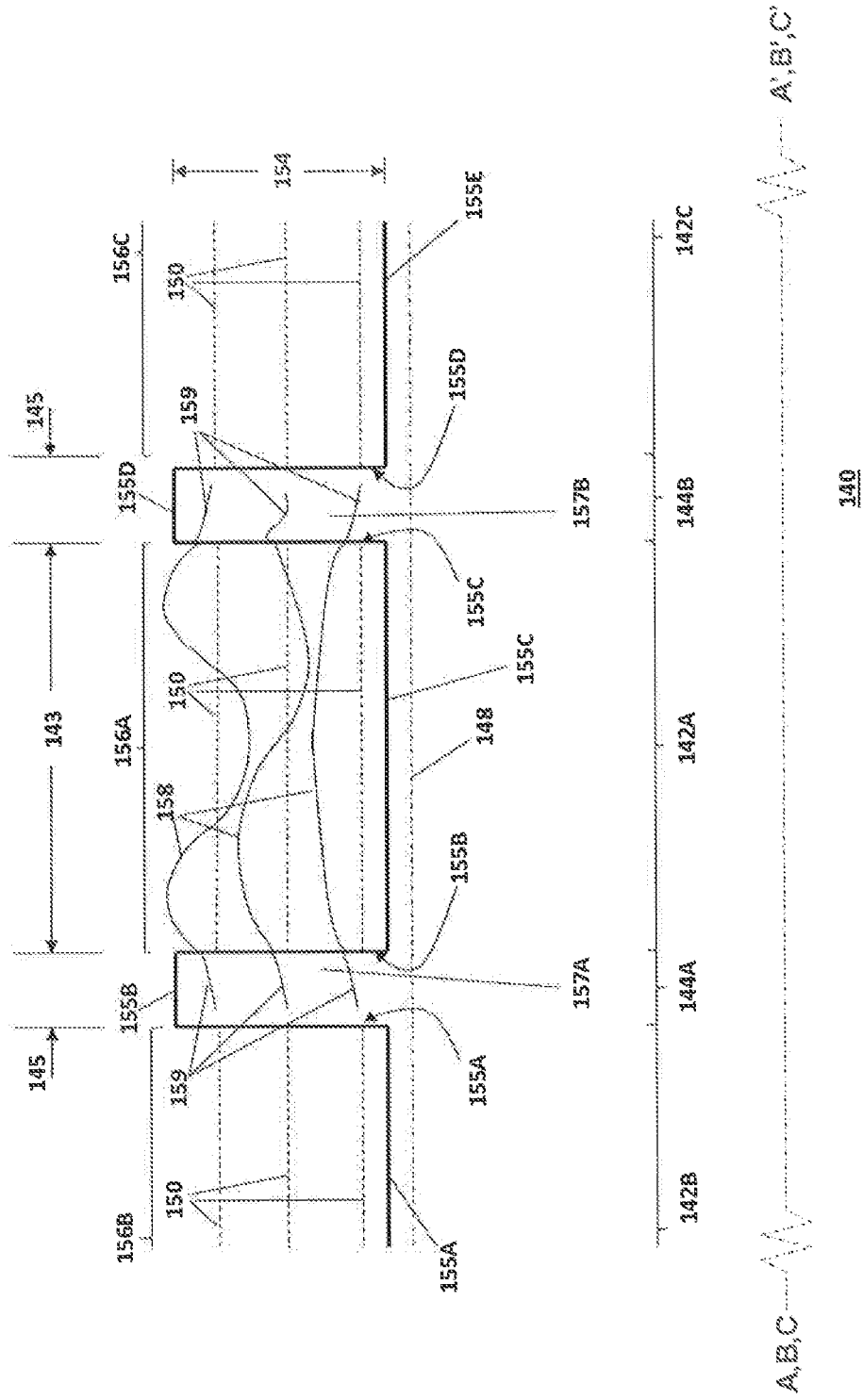

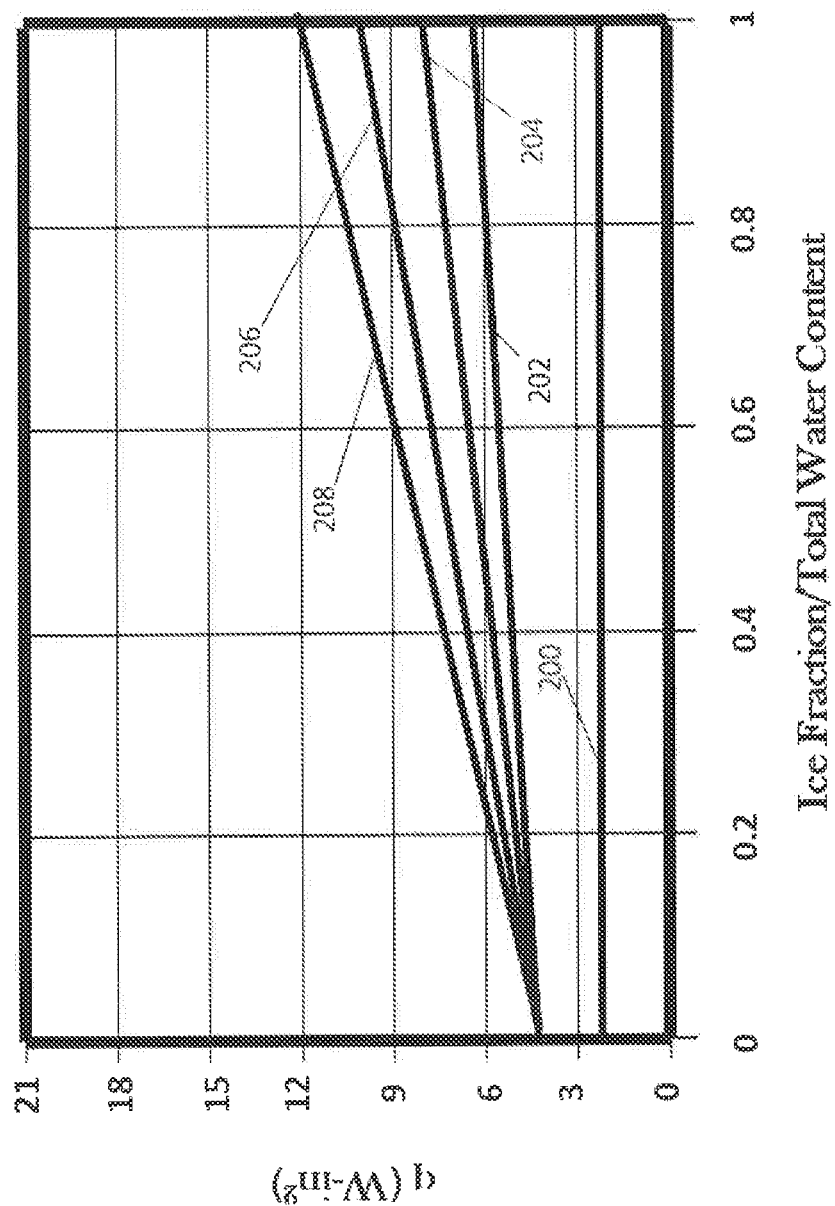

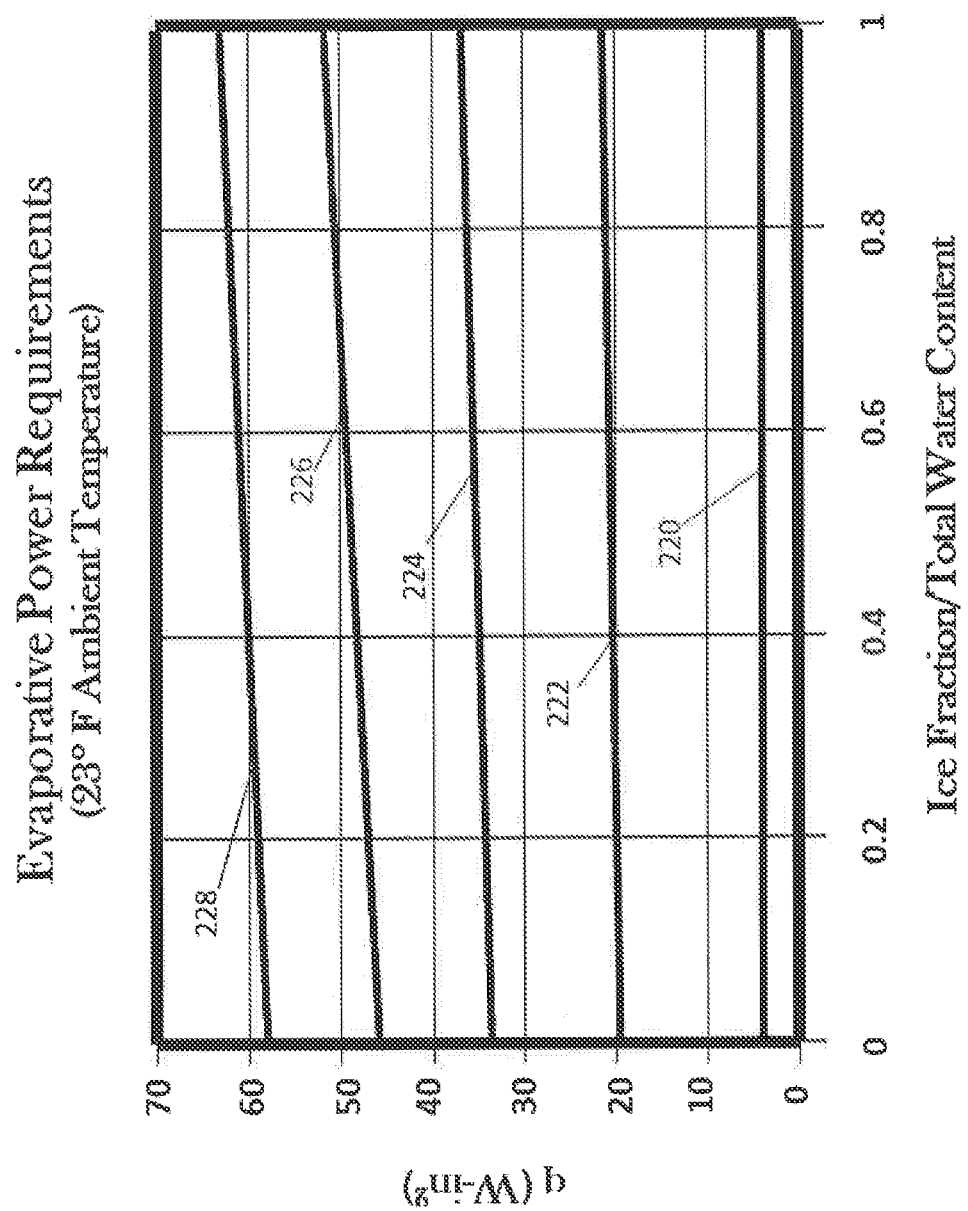

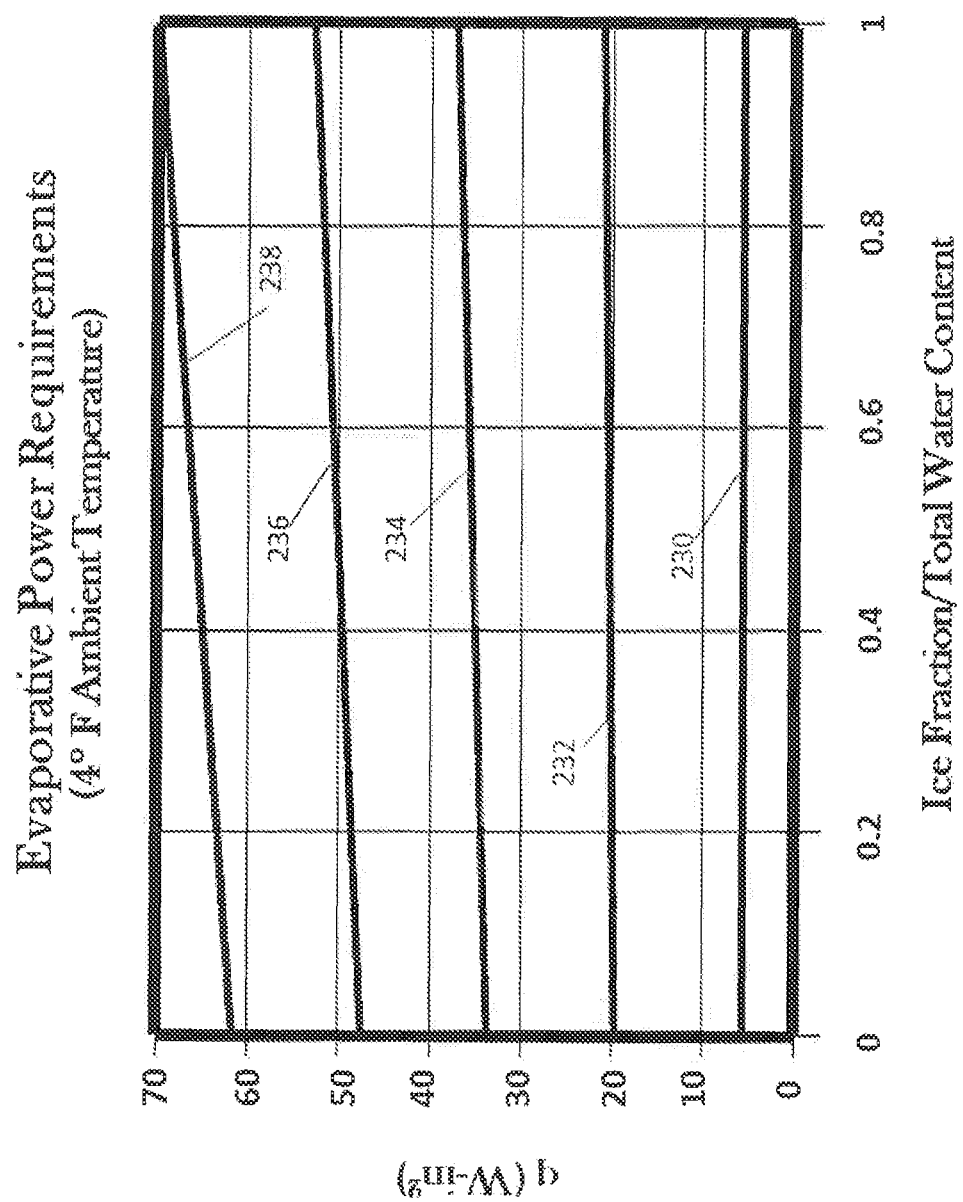

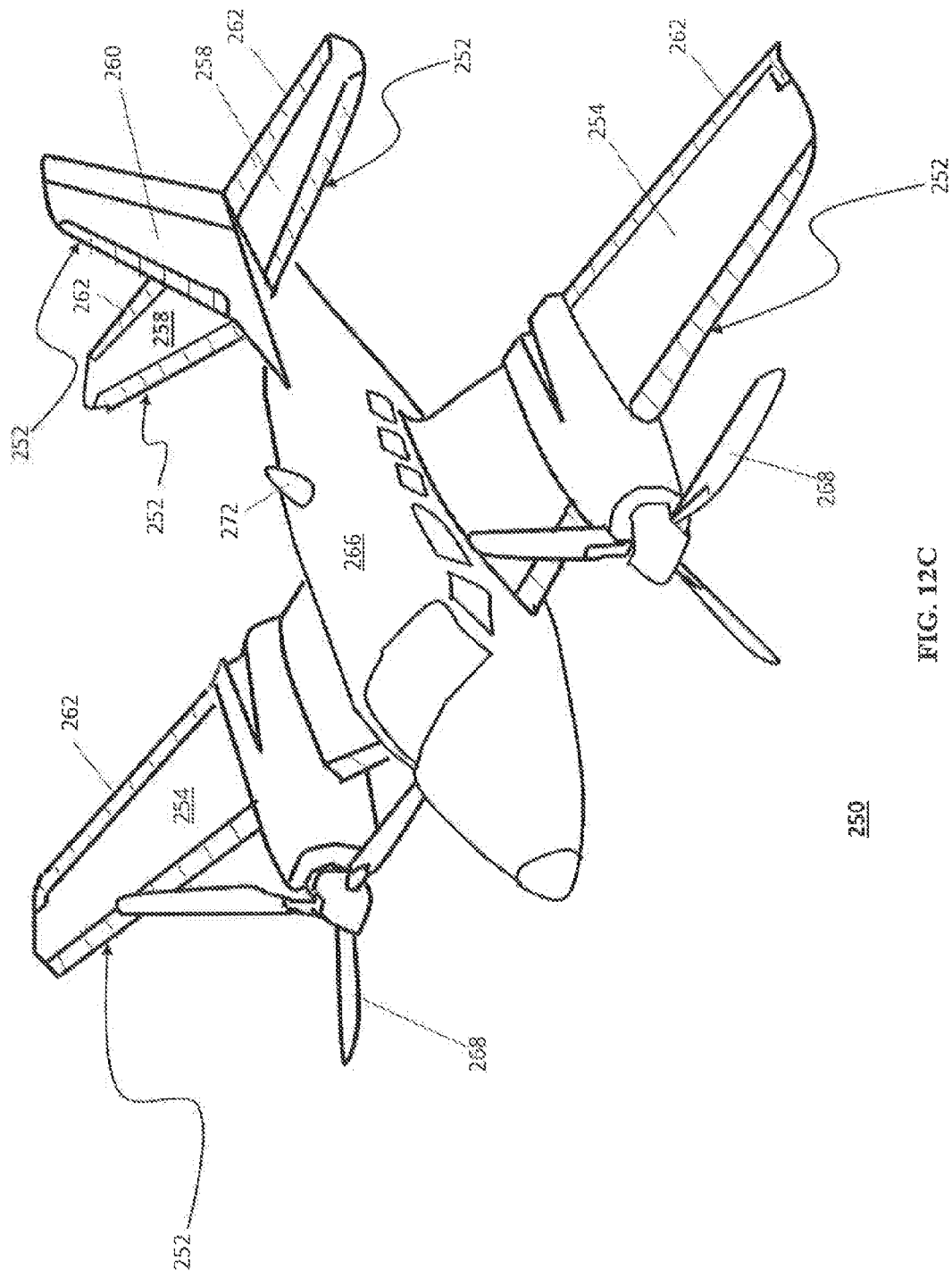

FULLY INTEGRATED THERMOELECTRIC DEVICES AND THEIR APPLICATION TO AEROSPACE DE-ICING SYSTEMS

CROSS REFERENCE TO RELATED APPLICATIONS

This application claims priority from US. Provisional Patent Application Ser. No. 61/529,302, filed Aug. 31, 2011, titled FULLY INTEGRATED THERMOELECTRIC DEVICES AND THEIR APPLICATION TO AEROSPACE DE-ICING SYSTEMS, and incorporated herein by reference in its entirety.

FIELD OF THE INVENTION

The present invention relates generally to the construction of a fully integrated thermoelectric module and to its various applications including but not limited to the application of a fully integrated thermoelectric module to de-icing aerodynamic surfaces and other systems on board aircraft or space vehicles.

BACKGROUND OF THE INVENTION

1. Background on Thermoelectric Systems

Temperature control is integral to the proper functioning of many modern systems and technologies. Mechanical heat pumps, comprising mechanically actuated expansion and compression chambers, are the most efficient heat transfer systems available today. However, there are many instances where a smaller, planar, or shape flexible system would be desirable. Thermoelectric ("TE") systems have the potential to address these needs, and capture wasted heat energy. However, the efficiencies of TE systems remain well below that of their mechanical counterparts and their high cost often limits prior art embodiments to niche applications. Therefore, methods that achieve higher thermopower and greater reliability at lower cost are desirable. As discussed below, the limitations are due primarily to the methods used to manufacture thermoelectric systems.

Thermoelectric systems are often configured as a Peltier module 1 depicted in FIGS. 1A,1B. Peltier modules 1 consist of an array of thermoelectric elements 2 sandwiched between thermally conducting top 3 and bottom 4 plates or surfaces. The Peltier module 1 has an electrical input 5 and an electrical output 6, through which electrical stimulus in the form of a current and voltage is applied to generate a temperature differential across the top 3 and bottom 4 surface volumes. Semiconductor elements 2 are actually configured as element pairs 7, wherein one element in the pair 7 comprises p-type electronic material 8 and the other element in the pair comprises n-type electronic material 9. Within a given element pair 7, the p-type 8 and n-type 9 materials are in electrical communication with each other through a first conducting element 10, which is also in thermal communication with an upper surface volume 11. The application of a temperature differential that causes the upper surface volume 11 to be hotter than the colder lower surface volume 12 will excite heat-mediating charge carriers in the semiconductor elements 8,9 to higher kinetic energy. The heat stimulus from the applied temperature differential causes the excited charge carrier to move at higher speeds within the solid than the charge carriers in close proximity to the cold side of the element. The faster charge carriers quickly diffuse from the first conducting element 10 in thermal contact with the hotter upper surface volume 11 towards the colder lower surface volume 12. In p-type semiconducting electronic material 8, positively charged holes 13 migrate from the first conducting element 10 towards the colder lower surface volume 12. Conversely, negatively charged electrons 14 migrate from the first conducting element 10 towards the colder lower surface volume 12 in the n-type semiconducting electronic material 9. The higher charge carrier densities generated in the semiconducting regions in thermal contact with the colder lower surface volume 12 by the applied temperature gradient induce internal electric fields between the hot charge carriers that have accumulated in the colder regions of the semiconducting element pair 7 and their donor atoms (not shown) in the hotter regions. At steady-state conditions, the internal electric fields generated by the non-equilibrium charge carrier density gradients induce a voltage bias 15 that causes charge carriers to electrically drift back towards their donor atoms. The electronic drift driven by the induced voltage bias 15 balances the diffusion process activated by the temperature gradient that produce the non-equilibrium charge carrier density gradients, so there is no net flow of charge. The generation of an internal voltage bias 15 through the application of a thermal gradient is known as the Seebeck effect. The relative strength of the phenomenon within a given semiconductor material is characterized by the Seebeck coefficient, S.

A thermally induced voltage bias 15 can be tapped to recover wasted heat energy when a temperature differential from the heat energy source is applied to induce a temperature gradient across a pair of upper 11 and lower 12 surface volumes of a thermoelectric module 1. Conversely, a voltage bias 15 that is externally applied across a thermoelectric element pair 7 by means of a DC potential having a positive terminal 16 and a negative terminal 17 can be used to generate a temperature differential by attracting heat carrying charge carriers from the upper surface volume 11 to the lower surface volume 12. This is accomplished by driving a (positively charged) current 18A emanating from the positive terminal 16 of the voltage bias 15 that is externally applied to a second conducting electrode 19 in electrical communication with the n-type semiconducting electronic material 9. The second conducting electrode is configured to maintain simultaneous thermal communication with the bottom surface volume 12. The applied current 18B stimulated in the second conducting electrode 19 draws negatively charged electrons 14 in the n-type electronic material 9, towards the lower surface volume 12. This movement of charge stimulates a current 18C in the first conducting electrode 10 in thermal communication with the upper surface volume 10 and the flow of positively charged holes 13 in the semiconductor element containing p-type electronic material 8 towards the lower surface volume 12. A current 18D is stimulated in a third conducting element 20 in thermal communication with the lower surface volume 12. The thermoelectric circuit is completed by sending a return current 18E to the negative terminal 17 of the externally applied voltage bias 15.

In the case of an externally applied voltage bias 15, higher charge carrier densities develop in the regions of the semiconductor elements 89 that are in immediate proximity to the lower surface volume 12 as electrically excited holes/electrons 13,14 drift in response to the applied electrical potential. As is the case with an ideal gas, the localized regions in which charge carriers electrically accumulate will have elevated temperatures in response to their higher particle/charge carrier densities. This action causes the upper surface volume 11 to cool as its heat is pumped by the thermoelectric circuit to a now hotter bottom surface volume 12. Since thermoelectric systems comprise thermodynamically reversible process, driving the current under a reverse bias would cause the upper surface volume 11 to heat, and the lower surface volume 12 to cool.

The figure of merit of a given Peltier module is characterized by a dimensionless parameter $ZT_{ave}$, where $T_{ave}$ is the average temperature of the Peltier module given by:

$$T_{ave}=(T_{hot}+T_{cold})/2 \qquad (1)$$

where $T_{hot}$ representing the temperature of the hot electrode(s) and $T_{cold}$ the temperature of the cold electrode.

Z is given by:

$$Z = \frac{\sigma \cdot S^2}{K} \qquad (2)$$

where σ and κ are the electrical and thermal conductivities, respectively, of the semiconducting elements and their cladding material (if any) in the module. The Seebeck coefficient, S, is a measurable parameter of the semiconducting elements in units of V/K that specifies how much voltage (thermopower) is generated in the semiconducting material per degree Kelvin of differential temperature applied across the material. Conversely, the Seebeck coefficient also specifies how much temperature differential will be induced in the material by an applied voltage. The Seebeck coefficient is a function of the p-type and n-type element pairs, and is not an intrinsic property of the material itself, but rather the configuration of the elemental pairs within the Peltier module.

The discrete assembly process is a principal drawback to modern TE systems. Discrete assemblies require semiconductor elements to be individually prepared (manufactured, finished, and in some instances tested) prior to qualifying for final assembly. For instance, n-type and p-type semiconductor elements all have to be sliced, diced and polished after being cut from the bulk ingot. Manufacturing methods that involve a large number of steps do not lend themselves to low cost production, nor are they suitable in very small scale microfluidic systems. Therefore, methods and means to simplify construction using techniques practiced in integrated circuit technology are desirable for developing lower cost TE systems and devices suitable for microfluidic applications.

State of the art Peltier modules having figures of merit $(ZT_{ave})$ approaching 1 are considered "good". Peltier modules with figures of merit in the range of 2-3 have been reported in thin film embodiments microscopically patterned at nanometer scales (discussed below) and in stacked bulk structures 30 comprising a plurality of element arrays 31,32, 33 as depicted in FIG. 1C. These systems are restricted in their commercial utility either through the higher cost of stacking lower efficiency modules and/or the limited applications realm of thin films devices where thermopower quotients are geometrically limited by the thickness of the thin films. Figures of merit in the range of 3-4 need to be achieved for thermoelectric heat pumping systems to have heating and cooling efficiencies that approach those of mechanical systems.

Another useful thermoelectric device architecture involving fluidic systems is depicted in FIG. 1D. In this configuration TE devices 35,36,37,38,39 are interposed between electrically conductive and thermally conductive means 40,41,42,43,44,45 that are in thermal communication with working fluid media through a series of heat exchangers or heat transfer devices. The TE elements 35,36,37,38,39 may either comprise an array of n-type and p-type semiconductor elements as depicted in FIG. 1A,1B, or may otherwise be bulk semiconductor material forming the TE system by alternating between n-type semiconductor in devices 35,37, 39 and p-type semiconductor in devices 36,38. Additionally, the thermally conductive means 40,41,42,43,44,45 are segregated into "cold side" (shown with hatching) and "hot side" (shown with cross hatching) systems. Under this configuration, a cooling fluid that is sequentially fed through the heat exchangers or heat transfer devices communicating with thermally conductive means 41,43,45, respectively, gets progressively cooler through the thermoelectric action driven by the current by power supply 46. Similarly, a fluid to be heated gets progressively hotter as it is sequentially pumped through the heat exchangers or heat transfer devices communicating with thermally conductive means 44,42,40, respectively.

As inferred through equation (2), higher TE figures of merit can be achieved by maximizing the electrical conductivity, σ, and the Seebeck coefficient, S, of the semiconductor material, while minimizing the thermal conductivity of the materials inserted between the module's hot and cold electrodes. Seebeck coefficients approaching −287 µV/K have been reported in bismuth telluride ($Bi_2Te_3$) thin films prepared by magnetron sputtering. These thin films were reported to have grain sizes ranging between 0.9 µm (900 nm) and 1.5 µm (1,500 nm).

TABLE 1

| Required Voltage | $V_{max}$ | 24.6 V |
|---|---|---|
| Current Draw | $I_{max}$ | 11.3 A |
| Heat Transfer | $Q_{max}$ | 172 W |
| Differential Surface Temperature | $\Delta T_{max}$ | 70° C. |

Representative performance values for commercially available 40 mm×40 mm (2.6 inch²) Peltier modules having ZT≈1 are given in Table I. Despite the impressive heat-transfer quotients, the cost of these systems needs to be dramatically reduced before thermoelectric technology will gain widespread commercial use in heating/cooling and power generation applications. The leading cause for their high cost is the discrete assembly of the module components. These discrete assemblies include costs associated with semiconductor crystal growth, which can take weeks, ingot slicing, wafer dicing and element polishing, in addition to the discrete assembly process itself, which add cumulative labor and supply chain management costs to the module's construction.

Despite the above mentioned drawbacks (cost and lower efficiencies), current state-of-the-art Peltier modules have demonstrated commercial utility in niche applications including: portable heaters/coolers, temperature controllers that prevent overclocking in microprocessors and runaway in laser repeaters, systems that cool satellites and spacecraft that emerge from the Earth's shadow and have sides that are exposed to direct sunlight, the conversion of thermal energy generated by a radioactive pile to electricity on board deep space satellites, astronomical telescopes, dehumidifiers, and low profile temperature controllers that thermally cycle minute materials. It would therefore be desirable to enable the broader commercialization of thermoelectric systems by reducing overall TE system cost while boosting performance to levels competitive with mechanical systems.

2. Background on Higher Thermopower Materials

Cursory inspection of equation 2 shows that higher thermoelectric figures of merit can be achieved by maximizing electrical conductivity, σ, of the semiconductor element(s) while simultaneously minimizing thermal conductivity, κ, of all the materials sandwiched between the top 3 and bottom 4 surfaces of a thermoelectric module 1. The primary challenge to this phenomenon is that charge carriers (electrons and holes) that conduct electrical currents also convey thermal currents. Heat is mediated in the n-type and p-type semiconducting materials through the flow of charge carriers and lattice vibrations. Electrons and holes represent the indivisible quanta of electrical charge, whereas phonons represent the individual quanta of vibrational energy. Since both quantum mechanical systems carry heat, the thermal conductivity κ of materials is comprised of two fundamental components:

$$\kappa = \kappa_{electron(hole)} + \kappa_{phonon}. \quad (3)$$

In an operational TE module, electron/hole charge carriers will drift under the influence of an applied electric field to produce the temperature differential ΔT. In turn, the temperature differential ΔT causes charge carriers and phonons to diffuse from the hotter surface to the colder one. Therefore, it is desirable to the development of higher performance thermoelectric modules to have low-cost manufacturing methods that enable integration of advanced semiconductor materials possessing intrinsic and extrinsic properties that maximize the current flow, while simultaneously minimizing the thermal flow.

In recent years, higher $ZT_{ave}$ parameters 90 have been reported for bismuth telluride ($Bi_2Te_3$) semiconductor and its alloys with selenium (Se) and antimony (Sb) as better controls for the synthesis of ultra-fine materials are developed and understood (see FIG. 2). These enhanced thermopower properties occur predominantly in thin film structures and are attributed to nanoscale defects and inclusions found in the semiconductor body.

These nanoscale irregularities either facilitate electron transport through the semiconductor in some way, or impede thermal conduction through the semiconductor element. Heterojunction defects can also occur in bulk alloys wherein a chemical non-uniformity in a highly localized region produces a semiconducting compound within micro-volume that is chemically distinct from the bulk material. A heterostructure is created when the band gap of the dissimilar alloy contained within the micro-volume forms a heterojunction interface with the enveloping bulk material by virtue of the different electronic band gaps of the two chemically distinct materials. If the micro-volume is physically small enough (10-100 nm) it can form a quantum dot within the bulk semiconductor. Thin film structures that form quantum dot superlattices ("QDSL") 47 have demonstrated the potential for higher thermopower. QDSL embed a plurality of quantum dots 48 on the surface of a semiconducting thin film substrate 49. (See FIGS. 3A,3B). The quantum dots 48 are formed by first depositing a layer of a first type of semiconductor 50, usually a narrow band gap semiconductor, on the semiconducting thin film substrate 49. The thin film substrate may optionally include a buffer layer 51 to facilitate the epitaxial formation of succeeding layers deposited thereupon. Advanced photolithographic techniques or methods of tensile-strain heteroepitaxy are used to pattern the first type semiconductor 50 and are applied to reform the first type semiconductor 50 material into an array of desired geometric shapes 52. A second type semiconductor 53 (not shown in FIG. 3B), usually having a wider semiconductor band gap than the first type semiconductor 50 to create the electronic potential barrier, overlays the residual first type semiconductor material 50 and the array of geometric shapes 52 formed therefrom. The process is repeated to form a plurality of such layers that build the thermoelectric material to greater thickness.

While QDSL 47 structures have been useful in mapping a path towards higher thermopower materials, they have limited widespread commercial value due to their geometric limitations and have lower Seebeck coefficients than pure superlattice systems. Furthermore, measurements of QDSL 47 structures report thermopowers that are approximately an order of magnitude lower that those observed in conventional superlattice systems, which comprise alternating first-type and second-type semiconductor layers having thicknesses ranging from 10-100 nm thick. QDSL 47 structures formed by heteroepitaxy manufacturing methods require the second-type semiconductor 53 layer(s) to have a thickness 54 of at least 200 nm to replanarize the layer surface 54A so it is suitable for further heteroepitaxial processing of successive layers. As a result, the enhanced thermopower in QDSL 47 structures is achieved in the lateral plane where resonant charge transport is facilitated by quantum tunneling processes due to the close relative proximity (2-100 nm) of the desired geometric shapes 52 forming the quantum dots in x-y dimensions. The large distance (~150 nm or more) in QDSL structures separating quantum dots 48 in the z-dimension frustrates resonant charge transport in the vertical direction. Since, for reasons provided below, it would be advantageous to enhance thermopower by means of isotropic QDSL structures.

The physical mechanism(s) whereby quantum dots improve thermopower are still being defined and are most likely numerous and varied. It has been concluded that thermopower can be enhanced in bulk semiconductors by forming a dilute alloy with an electronic dopant, wherein the dopants to form a sub-band that modifies the semiconductor's normal charge carrier density of states ρ(E) profile 55 (thick dashed line), so as to create a distortion 56 in the charge carrier density of states ρ(E) profile 57 (thin solid line) as shown in FIG. 4. To be effective, the alloying component must induce a sub-band within the electronic structure of the undoped semiconductor that "resonates" with a major band of the undoped semiconductor. To enhance thermopower, the distortion 56 must lie within a small range $E_R$ 58 of the semiconductor's Fermi-level $E_F$ 59. Consequently, the dopant must induce sub-bands that resonate (align) with (energetically located in) the conduction band of an undiluted n-type semiconductor material, or induce sub-bands 60 that resonate (align) with the valence band of an undiluted p-type semiconductor material. The mechanism by which thermopower is enhanced in a suitably diluted semiconducting alloy is described through Mott expression, which defines the Seebeck coefficient, S, in terms of the diluted alloy's energy-dependent conductivity σ(E). The energy-dependent conductivity σ(E) is expressed as:

$$\sigma(E) = n(E) \cdot q \cdot \mu(E) \quad (4a)$$

$$n(E) = \rho(E) \cdot f(E) \quad (4b)$$

where:
  n(E) is the charge carrier density
  q is electric charge of an electron (hole)
  μ(E) is the energy-dependent charge carrier mobility,
  ρ(E) is the energy-dependent density of states
  ƒ(E) is the Fermi function.

Using these descriptive parameters the Seebeck coefficient, S, can be expressed in terms of the logarithmic derivative of the energy-dependent conductivity σ(E), which correlates to:

$$S = \frac{\pi^2 k_B^2 T}{3q} \left\{ \frac{d[\ln(\sigma(E))]}{dE} \right\} \Bigg|_{E=E_r} \quad (5a)$$

$$= \frac{\pi^2 k_B^2 T}{3q} \left\{ \frac{1}{n}\frac{dn(E)}{dE} + \frac{1}{\mu}\frac{d\mu(E)}{dE} \right\} \Bigg|_{E=E_r} \quad (5b)$$

Using the expression given in equation 4b, the two mechanisms through which the Seebeck coefficient, S, can be enhanced by means of materials design and engineering is by introducing a solid-state structure that sharply increases the energy-dependence of the mobility, μ(E), of the conducting charge carriers, or by sharply increasing the energy-dependence of the charge carrier density, n(E). A larger energy dependence in n(E) can be achieved (through equation 3b) by introducing sub-bands 60 that produce a strong distortion 56 in the carrier density of states ρ(E) at energy-levels that closely align with the materials Fermi energy, $E_F$.

Not all semiconductor systems are amenable to forming diluted alloys that distort the carrier density of states with sub-bands that align with the Fermi-level. For instance, lead telluride (PbTe) semiconductor can be alloyed with gallium (Ga) to form a diluted p-type Ga—PbTe alloy, but it is not clear where the energy levels of the gallium (Ga) sub-bands are located. Diluting PbTe with indium (In) induces energy sub-bands that fall within the energy gap at room temperature, making In—PbTe alloys unsuitable for many applications. Diluting PbTe with thallium (Tl) has produced sub-bands that are favorably located for p-type Tl—PbTe diluted alloys, validating the physics articulated in equations 4b & 5b, but it has not been possible to fabricate n-type bulk materials with favorable distortions in their density of states that are needed to complete the thermoelectric circuit. Therefore, it would be desirable to integrate advanced n-type and p-type semiconductor materials that have enhanced thermopower by virtue of distortions to the bulk semiconductor material's normal charge carrier energy density of states.

Thermoelectric systems are often limited to operational ranges that are determined by intrinsic characteristics of bulk semiconductor materials, such as the semiconductor band gap and its density of states. FIG. 5A illustrates the ZT figures of merit as functions of temperature for various n-type semiconductor compositional systems, including: bismuth telluride ($Bi_2Te_3$) 64, optimized bulk lead telluride (PbTe) 65, non-optimized bulk telluride (PbTe) 66, cobalt antimonide ($CoSb_3$) 67, silicon germanium (SiGe) 68, lanthanum telluride ($La_3Te_4$) 69. Similarly, FIG. 5B illustrates the ZT figures of merit as functions of temperature for various p-type semiconductor compositional systems, including: antimony telluride ($Sb_2Te_3$) 70, lead telluride (PbTe) 71, optimized lead tellurium-selenide (PbTeSe) 72, germanium-telluride alloyed with silver-antimony telluride $(GeTe)_{0.85}(AgSbTe_2)_{0.15}$ which is known in the art as TAGS 73, modified skutterudite ($CeFe_4Sb_{12}$) 74, non-optimized lead telluride (PbTe) 75, ytterbium manganese antimonide ($Yb_{14}MnSb_{11}$) 76, silicon-germanium (SiGe) 77.

In addition to improving the Seebeck coefficient, S, through the introduction of suitable electronic sub-bands in the semiconductor material, thermoelectric figures of merit (ZT) can be improved by increasing the semiconductors' electrical conductivity, σ. Bulk semiconductor systems are generally constrained in this regard as the factors that enhance Seebeck coefficients, S, deteriorate electrical conductivity, σ. FIG. 6 illustrates how a semiconductor's Seebeck coefficient 80 and electrical conductivity 81 generally vary in relationship to the semiconductor's free carrier concentration. Standard semi-conductive properties 82 are commonly observed in materials that have carrier concentration falling in the range of $10^{17}$ and $10^{19}$ carriers/cm³, whereas metallic conduction 83 is prominent in materials endowed with carrier concentrations greater than $10^{21}$ carriers/cm³. Heavily-doped semiconductors 84 fall in the range of $10^{19}$ and $10^{21}$ carriers/cm³. Seebeck coefficients 80 are maximal at lower carrier concentrations, whereas electrical conductivity 81 increases with higher carrier concentrations. As a result of these tradeoffs, thermopower factors 85 are generally maximized in conventional bulk semiconductors doped to levels in the vicinity of $10^{20}$ carriers/cm³.

3. Background on Electrical Aircraft De-Icing Systems

Aircraft de-icing systems is a particular application in which thermoelectric de-icing systems could have significant value, but to date a means to meet the necessary requirements for efficiency, mechanical flexibility, and temperature differential have not been developed. It has been a long sought goal to prevent or reverse atmospheric ice formation on an aerodynamic surface of an aircraft, such as the wings, ailerons, rudder, stabilizers, propellers, rotors, fuselage and the like. Ice accumulation on an aerodynamic surface during flight or while on the ground can alter air foil configuration or add excessive weight that leads to dangerous flying conditions, particularly for general aviation aircraft. In winter conditions, de-icing chemical sprays are required prior to take-off on all commercial aircraft to remove any ice formations on the wings and fuselage. Current de-icing methods pose an environmental hazard as chemical sprays leach into ground water systems. Electrical de-icing systems are deployed on the larger air frames, but their efficiency not sufficient to eliminate chemical de-icing prior to take-off, so they only assist in the de-icing process.

Conventional approaches have been to apply resistive (Joule) heating systems to the surfaces or directly beneath surfaces, such as that described in Rutherford et al. '986, and the references contained therein, only supply a few Watts-inch$^{-2}$. As noted in Table I, the heat output of 68 W-inch$^{-2}$ available in contemporary thermoelectric systems is vastly superior to standard Joule heating de-icing systems. However, discretely assembled Peltier modules are wholly unsuited for application as aircraft de-icing systems due to both the fragility of the mechanical assembly and their high cost, among numerous other reasons. Therefore, it is desirable to produce thermoelectric systems that meet the mechanical, performance, and cost requirements that enable aerospace de-icing systems.

For the purposes of the de-icing embodiment articulated below, the cold electrode 11 serves the purpose of being a thermal reservoir, which could be the body off the aircraft, such as the fuselage, or an interior or exterior surface of an aerodynamic component of the vehicle or flight system. The heated surface volume 12 them forms the outer skin of the aircraft. While it is a particular aspect of the present invention to produce Peltier modules satisfying the robust conditions required to be useful as aerospace de-icing skins, it is a primary aspect of the invention to produce higher efficiency Peltier modules at far lower cost than currently available to allow thermoelectric technology solutions to be generally available for broad commercial uses that go well beyond aircraft de-icing applications. There are numerous instances on board aircraft where it is desirable to transfer excess heat from one location to another. This is usually done by piping heated air through relatively heavy pneumatic systems. Thermoelectric skins, such as those proposed herein, would allow a lighter weight system (the skins and wire) to convert the excess heat into an electrical current that could be used to power a thermoelectric heat pumping system or a resistive heater at the cold area of the flight system. It is therefore an additional aspect of this invention to apply improved thermoelectric skins to hot surfaces, such as those found on combustion engines or cappuccino machines, as thermopower generators to further improve power management on a mobile or stationary platform.

4. Definition of Terms

The term "aerodynamic surface" is herein defined as a surface that directs the flow of a fluid medium, notably air, so as to create aerodynamic forces that contribute to lift or controlled motion of a vehicle traveling through the medium.

The term "airflow surface" is herein understood to mean any surface over which heated or cooled gases flow over and create a temperature differential with that surface.

The term "alkali metal" is herein understood to refer to its conventional definition meaning the group of metallic elements in column IA of the periodic table, consisting of lithium, sodium, potassium, rubidium, cesium, and francium.

The term "alkaline earth metal" is herein understood to refer to its conventional definition meaning the group of metallic elements found in column IIA of the periodic table, consisting of magnesium, calcium, strontium, barium, and radium.

The term "amorphous material" is herein understood to mean a material that does not comprise a periodic lattice of atomic elements, or lacks mid-range (over distances of 10's of nanometers) to long-range crystalline order (over distances of 100's of nanometers).

The term "anti-ice" is herein understood to mean the prevention of ice formations on the leading edge of an aerodynamic surface.

The terms "chemical complexity", "compositional complexity", "chemically complex", or "compositionally complex" are herein understood to refer to a material, such as a metal or superalloy, compound semiconductor, or ceramic that consists of three (3) or more elements from the periodic table.

The term "de-ice" is herein understood to mean the removal of ice that has already formed on any aerodynamic surface or other aircraft surface.

The term "evaporative mode" is herein understood to mean an aircraft de-icing system that supplies sufficient heat so as to cause the ice either not to accrete or to evaporate from the aerodynamic surface.

The term "flight system" is herein understood to mean any manned or unmanned vehicle that is capable of powered or non-powered flight through the earth's atmosphere, low-earth orbit or in outer space.

The term "integrated circuit" is herein understood to mean a semiconductor chip into which a large, very large, or ultra-large number of transistor elements have been embedded.

The term "LCD" is herein understood to mean a method that uses liquid precursor solutions to fabricate materials of arbitrary compositional or Chemical complexity as an amorphous laminate or free-standing body or as a crystalline laminate or free-standing body that has atomic-scale chemical uniformity and a microstructure that is controllable down to nanoscale dimensions.

The term "liquid precursor solution" is herein understood to mean a solution of hydrocarbon molecules that also contains soluble metalorganic compounds that may or may not be organic acid salts of the hydrocarbon molecules into which they are dissolved.

The term "MAX phase material" is herein understood to define a chemically complex intermetallic ceramic material having the general chemical formula $M_{(n+1)}AX_n$, wherein M is first row transition-metal element, A is an "A-group" element found in columns III-VI of the periodic table, and X is either carbon (C) or nitrogen (N).

The term "mean free path" is herein understood to refer to its traditional definition, which describes the physical length a quantum particle (in this instance, an electron, a hole, or a phonon) travels within a solid before it is scattered off of its original path through its electromagnetic, electromechanical, or mechanical interaction with an object found within the solid known to function as a scattering center.

The term "microstructure" is herein understood to define the elemental composition and physical size of crystalline gains forming a material substance.

The term "mismatched materials" is herein understood to define two materials that have dissimilar crystalline lattice structure, or lattice constants that differ by 5% or more, and/or thermal coefficients of expansion that differ by 10% or more.

The term "n-type electronic material" is herein understood to refer to the conventional definition as a material that conducts Charge and heat through an unpaired electron that is free to move throughout the solid through heat diffusion or electrical drift by having been energetically promoted to an electronic conduction band.

The term "nanoscale" is herein understood to define physical dimensions measured in lengths ranging from 1 nanometer (nm) to 100's of nanometers (nm).

The term "p-type electronic material" is herein understood to refer to the conventional definition as a material that conducts charge and heat through an electron vacancy or hole in the valence band of a solid that is free to move as a positive charge in response to heat diffusion or electrical drift.

The term "pnictogen" is herein understood to refer to the Group V elements of the periodic table consisting of: nitrogen (N), phosphorous (P), arsenic (As), antimony (Sb), and bismuth (Bi).

The term "running wet" is herein understood to mean a level of de-icing that is sufficient to melt the ice, causing water droplets to run over the aerodynamic surface.

The term "standard operating temperatures" is herein understood to mean the range of temperatures between −40° C. and +125° C.

The term "surface volume" is herein understood to mean a layer of thermally conducting material that essentially encompasses the active thermal transport major surfaces of a thermoelectric circuit.

The term "thermoelectric effect" is herein understood to refer to its conventional definition as the physical phenomenon wherein a temperature differential applied across a material induces a voltage differential within that material, and/or an applied voltage differential across the material induces a temperature differential within that material.

The term "thermoelectric material" is herein understood to refer to its conventional definition as a solid material that exhibits the "thermoelectric effect".

The terms "tight tolerance" or "critical tolerance" are herein understood to mean a performance value, such as a capacitance, inductance, or resistance that varies less than ±1% over standard operating temperatures.

The term "II-VI compound semiconductor" is herein understood to refer to its conventional meaning describing a compound semiconductor comprising at least one element from column IIB of the periodic table consisting of: zinc (Zn), cadmium (Cd), or mercury (Hg); and, at least one element from column VI of the periodic table consisting of: oxygen (O), sulfur (S), selenium (Se), or tellurium (Te).

The term "III-V compound semiconductor" is herein understood to refer to its conventional meaning describing a compound semiconductor comprising at least one semi-metallic element from column III of the periodic table consisting of: boron (B), aluminum (Al), gallium (Ga), and indium (In); and, at least one gaseous or semi-metallic element from the column V of the periodic table consisting of: nitrogen (N), phosphorous (P), arsenic (As), antimony (Sb), or bismuth (Bi).

The term "IV-IV compound semiconductor" is herein understood to refer to its conventional meaning describing a compound semiconductor comprising a plurality of elements from column IV of the periodic table consisting of: carbon (C), silicon (Si), germanium (Ge), tin (Sn), or lead (Pb).

The term "IV-VI compound semiconductor" is herein understood to refer to its conventional meaning describing a compound semiconductor comprising at least one element from column IV of the periodic table consisting of: carbon (C), silicon (Si), germanium (Ge), tin (Sn), or lead (Pb); and, at least one element from column VI of the periodic table consisting of: sulfur (S), selenium (Se), or tellurium (Te).

SUMMARY OF THE INVENTION

The present invention relates generally to the complete integration of all electrical elements needed to form a thermoelectric circuit into a fully integrated solid state Peltier module. More specifically, the present invention instructs methods and means to form semiconducting circuit elements that are endowed with a nanoscale polycrystalline microstructure that is chemically uniform at the atomic scale to enhance thermoelectric efficiencies of the fully integrated thermoelectric device. In particular, the invention teaches the use of one or more of these enhanced efficiency solid state modules to redistribute thermal loads within an aircraft or on at least one of its aerodynamic surfaces. In one instance, the invention establishes means to improve the figure of merit of Peltier modules through superior polycrystalline microstructures. In another instance, the invention provides means to fully integrate a thermoelectric system into a solid state device. In yet another instance, the invention provides means to de-ice the aerodynamic surfaces of an aircraft through the direct construction of the fully integrated Peltier module(s) on said aerodynamic surface or by first forming a pliable tape structure that can be laminated onto the aerodynamic surfaces using an adhesive agent. In a further instance, the invention provides means to convert heat to electricity, wherein said heat is collected on hot surfaces of an aircraft or flight system, and to use said electricity to power other systems, including the generation of heat in locations of the flight system where it is desired.

A first embodiment of the present invention provides a thermoelectric module comprising an integrated, layered structure comprising first and second, thermally conductive, surface volumes, each in thermal communication with a separate respective first and second electrically conductive patterned trace layers, and an array of n-type and p-type semiconducting elements embedded in amorphous silica dielectric and electrically connected between the first and second patterned trace layers forming a thermoelectric circuit.

The amorphous silica dielectric may include distributed added crystalline compounds arranged to improve thermal insulation over that of pure amorphous silica. The crystalline compounds may include skutterudite crystals separated by atomic layers of alkali ions. The module may further comprise input and output ports providing external electrical connection to at least one of the first or second patterned trace layers. The n-type and p-type semiconductors may be formed from materials selected from the group consisting of: Skutterudites (AB3), complex Skutterudites ($Z_2A_8B_{13}$), elemental group IV semiconductor Si, Ge, alloyed group IV semiconductor consisting of Si, Ge, Sn, Bi, III-V compound semiconductor, II-VI compound semiconductor, IV-VI compound semiconductor, semiconducting metal-oxide or mixed metal-oxide materials. The semiconducting elements may have carrier concentrations in the range of $10^{17}$ to $10^{19}$ carriers-$cm^{-3}$. The module may further comprise ohmic contacts formed in the semiconductor elements having heavily doped layers in the range of $10^{19}$ to $10^{21}$ carriers-$cm^{-3}$, that electrically connect the semiconductor elements to the first and second patterned trace layers. The first and second surface volumes may comprise a MAX-phase materials. The module may further comprise an insulating layer comprising an aluminum nitride MAX-phase material that electrically insulates the first and second surface volumes from their respective first and second patterned trace layers. The first or second surface volume may form a leading edge of an air-flow surface. The semiconducting elements may have a polycrystalline microstructure wherein the size of polycrystalline grains is less than 100 nm. The polycrystalline grains may form quantum dots comprising a semiconducting granular core with a chemically distinct grain boundary material.

Another embodiment of the present invention provides a microelectronic circuit module comprising a heat producing semiconductor chip mounted on a packaging element that has micro-channels through which a working fluid is passed to collect and transfer heat from the semiconductor chip, a thermoelectric module comprising a network of micro-channels embedded within silica dielectric through which the heated working fluid is circulated, and a first thermally isolated thermoelectric circuit embedded within silica dielectric that consists of a linear array of MAX-phase electrodes interleaved between alternating n-type and p-type semiconducting elements, wherein the MAX-phase electrodes contain micro-channels through which the working fluid is circulated and progressively cooled.

The module may further comprise a set of thermally isolated secondary thermoelectric circuits embedded within the silica dielectric adjacent to the first thermoelectric circuit and consist of a n-type and p-type semiconducting elements configured in parallel between MAX-phase electrodes, wherein a hot electrode of the secondary thermoelectric circuits contain micro-channels through which the working fluid is passed and cooled, and a cold electrode of the secondary thermoelectric circuits is in thermal communication with a thermal reservoir. The module may further comprise a controller circuit that monitors the temperature of the various MAX-phase electrodes and adjusts the voltage drops across the different thermoelectric circuits used in the circuit. The thermoelectric circuits may include the elements describe above for the first embodiment.

Yet another embodiment of the present invention provides an anti-icing system, comprises a thermoelectric layer forming a leading edge of an aerodynamic surface. The thermoelectric layer may be pliable or conformal in its construction. The thermoelectric layer may be embedded in a carbon composite. The thermoelectric layer may include area sections separated by parting strips, which parting strips are adapted to be powered separately from the area sections to reduce energy consumption for periods of time by just powering the parting strips rather than all or most of the thermoelectric layer. The thermoelectric layer may include the elements describe above for the first embodiment.

Another embodiment of the present invention provides a de-icing system, comprises a thermoelectric layer applied to an aerodynamic or an air-flow surface. The thermoelectric layer may be pliable or conformal in its construction. The thermoelectric layer may be embedded in a carbon composite. The thermoelectric layer may include area sections separated by parting strips, which parting strips are adapted to be powered separately from the area sections to reduce energy consumption for periods of time by just powering the parting strips rather than all or most of the thermoelectric layer. The thermoelectric layer may include the elements describe above for the first embodiment.

Still another embodiment of the present invention provides a method for forming an integrated thermoelectric layer using metalorganic spray deposition techniques comprising selectively forming one or more first electrical contact pads on a first side of a substrate surface, selectively forming a lower surface volume adjacent to said formed first electrical contact pad, selectively forming a lower patterned electrical trace layer from an electrically conductive material upon said first electrical contact pad and lower surface volume, selectively forming n-type and p-type semiconductor elements to a predetermined thickness upon select portions of said lower patterned electrical trace layer, selectively forming an electrically and thermally insulating medium between said n-type and p-type semiconductor elements to the predetermined thickness to produce an integrated body, selectively forming an upper patterned electrical trace layer upon the integrated body that includes one or more second electrical contacts, and electively forming an upper surface volume on the integrated body and the one or more second electrical contacts.

The method may further comprise inserting a thermally conducting and electrically insulating material between said upper and lower surface volumes and said upper and lower patterned electrical trace layers. The thermally conducting and electrically insulating material may include an aluminum nitride MAX-phase material. The electrically and thermally insulating medium may be amorphous silica. The n-type and p-type semiconductor elements may have a polycrystalline microstructure limited to 100 nm and may be formed with quantum dots. Semiconductor elements may be from elemental semiconductors such as silicon (Si), germanium (Ge), alloyed mixtures of elemental semiconductors, complex carbides, complex nitrides, III-V compound semiconductors, II-VI compound semiconductors, IV-VI compound semiconductors, semiconducting Skutterudites or modified Skutterudites, and semiconducting oxides or mixed metal oxides. Sub-arrays of n-type and p-type semiconductor elements may be formed that have distinct chemical composition to form thermoelectric circuits with different optimal temperature ranges. Sub-arrays of n-type and p-type semiconductor elements may be formed that have distinct polycrystalline microstructure to form thermoelectric circuits with different optimal temperature ranges. The second electrical contacts may be formed on a side of the upper surface of said integrated body that is mirror-opposed to the first side of the substrate face. MAX-phase materials may be used within the upper and lower surface volumes.

Mechanical constraint layers may be embedded within the first and second electrical contacts and the upper and lower patterned trace layers. The upper and lower patterned trace layers may be to function as separate thermoelectric circuits having separate input and output pads. Parting strips may be formed from the separate thermoelectric circuits. The integrated thermoelectric layer may be formed as a skin directly upon an aerodynamic surface or an air-flow surface. Bonding areas may be embedded within the upper and lower surface volumes of the integrated thermoelectric skin. A metallurgical bond may be formed between a plurality of stacked fully integrated thermoelectric layers by applying a distribution of nanoparticles having composition similar to the bonding areas and first and second electrical contact areas and applying pressure and heat to melt the nanoparticles. One or more thermoelectric layers may be embedded within a carbon fiber composite that is in the shape of an aerodynamic surface. The thermoelectric layer may be applied to an aerodynamic surface of a flight system.

An even further embodiment of the present invention provides a method for forming an integrated microelectronic module including a heat-producing integrated circuit mounted upon, the method comprising: selectively forming thermoelectric electrodes for a first thermoelectric circuit that contains embedded micro-channels through which a working fluid can be passed; locating by means of selective deposition alternating regions of n-type and p-type semiconducting elements between the first thermoelectric circuit electrodes to form a series-configured thermoelectric circuit; selectively forming the hot thermoelectric electrodes for one or more second thermoelectric: circuits, wherein the hot electrode(s) of the second thermoelectric circuit are positioned in close proximity to the first thermoelectric circuit and contain(s) an embedded micro-channel through which a working fluid can be passed; selectively forming the cold electrode(s) of the second thermoelectric circuit(s) to be in thermal communication with a thermal reservoir; selectively forming n-type and p-type semiconducting elements between the hot and cold electrodes of the second thermoelectric circuit(s); selectively depositing a thermally and electrically insulating material that thermally isolates the electrodes in the first thermoelectric circuit from each other and the one or more second thermoelectric circuit(s) having their hot electrodes positioned in close proximity to the electrodes of the first thermoelectric circuit; forming a micro-channel within the thermally and electrically insulating material through which the working fluid from an electrode in the first thermoelectric is passed to a hot electrode in the second thermoelectric circuit to further thermally isolate the electrodes of the first thermoelectric circuit; configuring the micro-channels in the thermally and electrically and pass through a fluid pumping station; selectively forming thin film thermocouples upon the electrodes of both thermoelectric circuits; selectively forming contact pads on the electrodes of both thermoelectric circuits; selectively forming patterned traces that electrically connect the thin film thermocouples and the contact pads to a controller circuit; configuring the micro-channels to return cooled fluid to a system of micro-channels in good thermal contact with the heat-producing integrated circuit.

Amorphous silica may be deposited as the thermally and electrical insulating material. A MAX-phase material may be deposited to form an electrode within the first or second thermoelectric circuit.

N-type and p-type semiconductor elements may be formed that have a polycrystalline microstructure limited to 100 nm. Quantum dots may be formed within said n-type, and p-type semiconductor elements. Semiconductor elements may be formed from elemental semiconductors such as silicon (Si), germanium (Ge), alloyed mixtures of elemental semiconductors, complex carbides, complex nitrides, III-V compound semiconductors, II-VI compound semiconductors, IV-VI compound semiconductors, semiconducting Skutterudites or modified Skutterudites, and semiconducting oxides or mixed metal oxides. Mechanical constraint layers may be embedded within the contact pads, or patterned traces.

BRIEF DESCRIPTION OF THE DRAWINGS

The present invention is illustratively shown and described in reference to the accompanying drawings, in which:

FIGS. 1A,1B,1C,1D illustrate basic structural and operational characteristics of Peltier modules.

FIG. 7B provides a schematic of a thermoelectric module claimed to cool heat producing integrated circuits.

FIGS. 7C-7G provide a perspective view with various cross-sections and cut-outs of thermoelectric system embedded within a microelectronic module that is claimed to cool heat producing integrated circuits, where the cutaways reveal integrated components located within the module's interior.

FIGS. 10A,10B,10C,10D,10E illustrates quantum dot potential well structures, their associated density of states, and resonant tunneling charge-transfer processes.

DESCRIPTION OF THE PREFERRED EMBODIMENT

Figure 1A:
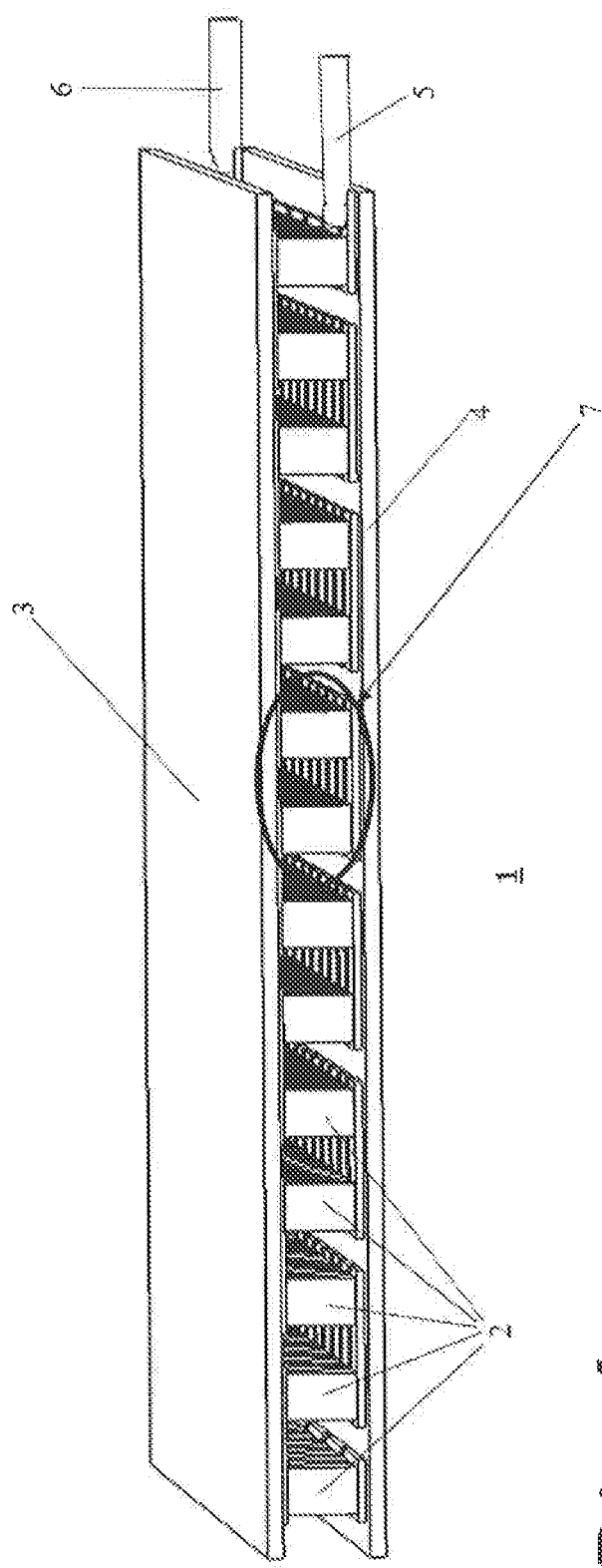

This application incorporates by reference all matter contained in de Rochemont and Farmer, "METAL-CERAMIC COMPOSITES WITH IMPROVED INTERFACIAL PROPERTIES AND METHODS TO MAKE SUCH COMPOSITES", U.S. Pat. No. 5,866,252 (the '252 application), de Rochemont and Farmer, "CERAMIC COMPOSITES WITH IMPROVED INTERFACIAL PROPERTIES AND METHODS TO MAKE SUCH COMPOSITES", U.S. Pat. No. 6,143,432 (the '432 application), de Rochemont and Farmer, "Ceramic Composite Wiring, Structures for Semiconductor Devices and Method of Manufacture", U.S. Pat. No. 6,323,549 B1, (the '549 application), de Rochemont U.S. Pat. No. 7,405,698 entitled "CERAMIC ANTENNA MODULE AND METHODS OF MANUFACTURE THEREOF" (the '698 application), de Rochemont U.S. Pat. No. 8,178,457 B2 entitled "CERAMIC ANTENNA MODULE AND METHODS OF MANUFACTURE", (the '457 application, de Rochemont U.S. Ser. No. 11/479,159, filed Jun. 30, 2006, entitled "ELECTRICAL COMPONENT AND METHOD OF MANUFACTURE" (the '159 application), U.S. Ser. No. 11/620,042 (the '042 application), filed Jan. 6, 2007 entitled "POWER MANAGEMENT MODULES", de Rochemont and Kovacs, "LIQUID CHEMICAL DEPOSITION PROCESS APPARATUS AND EMBODIMENTS", U.S. Ser. No. 12/843,112, (the '112 application), de Rochemont, "MONOLITHIC DC/DC POWER MANAGEMENT MODULE WITH SURFACE FET", U.S. Ser. No. 13/152,222 (the '222 application), de Rochemont, "SEMICONDUCTOR CARRIER WITH VERTICAL POWER FET MODULE", U.S. Ser. No. 13/168,922 (the '922A application), de Rochemont, "CUTTING TOOL AND METHOD OF MANUFACTURE", U.S. Ser. No. 13/182,405 (the '405 application), de Rochemont, "POWER FET WITH A RESONANT TRANSISTOR GATE", U.S. Ser. No. 13/216,192 (the '192 application), and de Rochemont, "SEMICONDUCTOR CHIP CARRIERS WITH MONOLITHICALLY INTEGRATED QUANTUM DOT DEVICES AND METHOD OF MANUFACTURE THEREOF", U.S. Ser. No. 13/288,922 (the '922B application). The application further incorporates by reference all matter contained in, de Rochemont et al., "SUPERCONDUCTING METAL-CERAMIC COMPOSTE", de Rochemont et al., "METHOD FOR MAKING METAL-CERAMIC COMPOSITES AND THE RESULTING COMPOSITES", U.S. Pat. No. 5,866,252, (the '252 application), de Rochemont et al., "SUPERCONDUCTING METAL-CERAMIC LAMINATE", U.S. Pat. No. 6,027,826, (the '826 application), de Rochemont, "METHOD FOR ENCLOSING A CERAMIC FILAMENT", U.S. Pat. No. 6,553,646 B1, (the '646 application), and de Rochemont, "ENCLOSED CERAMIC FILAMENT" U.S. Pat. No. 7,268,099 B1, (the '099 application).

de Rochemont et al. '252 and '432 instruct on methods to relieve thermally-induced stress between metal and ceramic layers integrated within a single-body structure. de Rochemont et al. '549 instruct on methods to incorporate micro channels within a passive circuit substrate through which coolant fluids are circulated to disperse heat generated by a semiconductor die attached to the substrate, de Rochemont '159 and '042 instruct on methods to fully integrate microelectronic circuits into a single body structure. de Rochemont '040, '835, '192, '222, '922A instruct on methods and embodiments related to a fully integrated high power density power management module within a single body structure. de Rochemont '698, '012 instructs on methods and embodiments that provide meta-material dielectrics that have dielectric inclusion(s) with performance values that remain stable as a function of operating temperature within a single body. de Rochemont et al. '112 discloses the liquid chemical deposition (LCD) process and apparatus used to produce macroscopically large compositionally complex materials, that consist of a theoretically dense network of polycrystalline microstructures comprising uniformly distributed grains with maximum dimensions less than 50 nm. Complex materials are defined to include semiconductors, metals or super alloys, and metal oxide ceramics. de Rochemont '405 instructs methods to form complex carbide, silicon-carbide, and nitride laminates. de Rochemont '922 discloses methods to fabricate bulk quantum-dot semiconducting material.

It should be noted that within the prior art the term thermoelectric has been broadly used to encompass thermoresistive elements, which are heat producing elements wherein heat is generated with high-efficiency by passing a current through the thermoresistive element. This application limits the definition of thermoelectric to mean a heat-transferring element, wherein a current passed through circuitry contained within the element transfers heat from one major surface of the heat-transferring element to the element's opposing major surface.

There is a general need to introduce higher efficiency thermoelectric ("TE") systems that have figures of merit that are both comparable in efficiency to mechanical heat pumps and to produce physical embodiments that broaden their utility as power generators. One particular application in which they could find widespread application is aircraft de-icing or flight system thermal management if these systems can be rendered into a usable form. While aircraft de-icing is an illustrated embodiment of the current invention, the methods and means disclosed herein can be applied to any surface on any vehicle, mobile system, or stationary structure where there is a need for a low profile heat transfer device or a desire to convert a heat differential across an integral surface to electrical power. Aircraft de-icing is a special instance of the invention in that it requires high-efficiency thermoelectric modules to be functionally applied to non-planar surfaces forming the leading edge of aerodynamic surfaces, which are provided by the present invention by either flexible, pliable or conformal thermoelectric module construction.

Reference is now made to FIGS. 7A thru 15E to illustrate salient features of the present invention that enable a high performance thermoelectric module 100, and in particular, one that is thin enough to be suitable for the intended application of de-icing the leading edges of aerodynamic surfaces. The thermoelectric module 100 may be made to significantly eater thickness for use in power generating and heat transferring applications that require high performance, but do not need mechanical pliability of the thermoelectric system. In order to achieve high performance and reliable mechanical pliability, thermoelectric modules will have to be rendered into the form of thin sheets that withstand mechanical manipulation under conditions of flexure and thermal cycling, and be comprised of higher performance materials than currently available in the prior art that allow very large temperature gradients to be applied over very thin devices. These systems must also be made to very large surface areas to be practically implemented. LCD manufacturing methods and techniques (de Rochemont '112, in combination with the '252, '826, '068) are applied to satisfy the combined requirements for low-temperature, scalable, and continuous manufacturing of integrated materials, wherein the composition (stoichiometry) and microstructure of the integrated materials are held to extreme chemical ($\leq \pm 1.5$ mol %), dimensional ($\leq 1$ mil), and nanoscale tolerances on microstructure that can produce a dense, uniform distribution of polycrystalline grains limiting their size to 10-50 nm even when manufacturing a system of integrated materials to large physical size.

The LCD process, as described fully in de Rochemont '042, and '159, and in de Rochemont et al. '112, which are incorporated herein by way of reference, utilizes liquid metalorganic precursors to fully integrate complex materials into a single solid state structure by means of spray deposition. The LCD deposit initial forms as an amorphous solid having chemical uniformity varying less than $\pm 0.5$ mol % at the atomic scale throughout the material deposit. LCD selectively deposits materials to any desired thickness using direct-write techniques on any kind of substrate. The substrate temperatures are so modest ($\leq 400°$ C.) that the deposited material initially forms as an amorphous solid. Polycrystalline deposits having uniform microstructure that is controllable down to nanometer scales are produced using at least one subsequent organic bake-out and plasma annealing steps. Repeating the cycle of deposit, bake-out, and plasma annealing allows deposits to be formed to or arbitrary thickness, including any thickness that would optimize the performance of a fully integrated thermoelectric circuit.

The fast deposition rates (on the order of 25 μm/minute) using direct-write techniques are key attributes that allows LCD to reduce the cost of a finished good. However, its principal inventive value to thermoelectric module applications is its ability to combine new materials structures that could not previously be integrated together with physical dimensions (thicknesses exceeding well beyond 5 μm) that are not possible using traditional thin film techniques. It further allows the microstructure of a previously known material to be optimized specifically for any given thermoelectric applications that strongly differentiate the invention from the prior art.

A thermoelectric device that maintains a steep thermal gradient across the thickness of its major surfaces is a first instance of the invention. (See FIG. 7A). A steep thermal gradient is requisite to a system that is mechanically pliable because a mechanically pliable surface needs to be thin, and therefore must have a thickness 102 that is less than 1 mm, preferably less than 100 μm (0.1 mm). Consequently, the thermoelectric module 100 must be constructed from materials that provide strong thermal insulation within its interior body, and are integrated within surface materials that are remarkable thermal conduction properties on the surface. To satisfy this requirement, the thermoelectric module 100 comprises amorphous silica insulating medium 104 inserted between semiconducting n-type 106 and p-type 108 thermoelectric elements. The amorphous silica insulating medium 104, and semiconducting elements 106,108 principally fill the space between the upper 110 and lower 112 surface volumes that make thermal contact with the thermodynamic system the TE module is intended to regulate or extract electrical power from. Amorphous silica has a low thermal conductivity of 1.8 $W \cdot m^{-1} \cdot K^{-1}$, which is about one one-hundredth ($\frac{1}{100}^{th}$) that of silicon crystal. Although mechanically brittle, amorphous silica is the transparent medium used to make optical fiber and is pliable and mechanically robust when made very thin. The semiconducting elements 106,108 are electrically connected by upper 107 and lower 109 conductive traces in a manner that allows the circuit to function as a thermoelectric module when provided electrical stimulus between an input port 111 and an output port 113.

It is similarly advantageous to employ semiconducting elements 106,108 that have comparably low thermal conductivity. Heat is mediated in solids through the flow of energized charge carriers and lattice vibrations. Electrons and holes represent the indivisible quanta of electrical charge, whereas phonons represent the individual quanta of vibrational energy. Since both forms of energy carry heat, the thermal conductivity κ of materials is comprised of two fundamental components, $\kappa_{electron/(hole)} + \kappa_{phonon}$, as shown in equation (3). A good thermoelectric semiconductor is characterized as a material in which the electrical component ($\kappa_{electron/(hole)}$) of its thermal conductivity κ has a higher value than its vibrational component ($\kappa_{phonon}$). This reduces the heat transferred by means of electrical charge carriers to be equilibrated through the vibrational energy of the crystal lattice. Therefore, it is advantageous to incorporate thermoelectric semiconductor elements 106,108 that have a reduced vibrational component ($\kappa_{phonon}$) of its thermal conductivity κ and simultaneously have high electrical conductivity as provided by equation 2.

LCD manufacturing methods allow the high quality selective deposition and low-temperature integration of high performance materials having high chemical complexity. The range of materials span metals/superalloys, semiconductors, ceramics (oxide/nitride/carbide/silicide and combinations thereof), and amorphous (glassy/solid solution/disordered solids) structures of these material varieties. Therefore one embodiment of the invention applies LCD methods as described in '112 and '922B applications to form the n-type 106 and p-type 108 semiconducting elements from Skutterudite semiconductor, or modified Skutterudite. The Skutterudite family of thermoelectric semiconductors has thermal conductivities generally in the range of 1.6-1.9 W-m$^{-1}$-K$^{-1}$ and conform with the general Chemical formula $$AB_3 \qquad (6)$$

where A is a metal atom or fractional combination of transitional metal group elements, preferably from the group consisting of, but not limited to: A=Ru, Pa, Fe, Co, Ir, Rh, Ni, Os, Pt,
and,
B is a non-metal or semi-metallic atom or a fractional combination of pnictogen group elements, preferably from the group consisting of, but not limited to: B=Bi, Sb, Te, Pb, Ge, Se, S, As, Si.

In general, thermal conductivity is lower in materials that have weaker interatomic bonding energies (weaker bonds) formed between elements having higher mass, therefore it is advantageous to incorporate materials that comprise elements having a higher atomic mass. The Skutterudite family of semiconductors can be chemically modified by adding alkali elements to further reduce thermal conductivity according to the formulas:

$$Z_2A_8B_{13} \qquad (7)$$

where A is a metal atom or fractional combination of transitional metal group elements, preferably from the group consisting of, but not limited to: A=Ru, Pa, Fe, Co, Ir, Rh, Ni, Os, Pt, B is a non-metal or semi-metallic atom or a fractional combination of pnictogen group elements, preferably from the group consisting of but not limited to: B=Bi, Sb, Te, Ge, Se, S, As, Si, and,
Z is an alkali metal atom or fractional combination of alkali metal element, preferably consisting of the heavier atomic mass element: K, Rb, Cs.

Figure 8A:
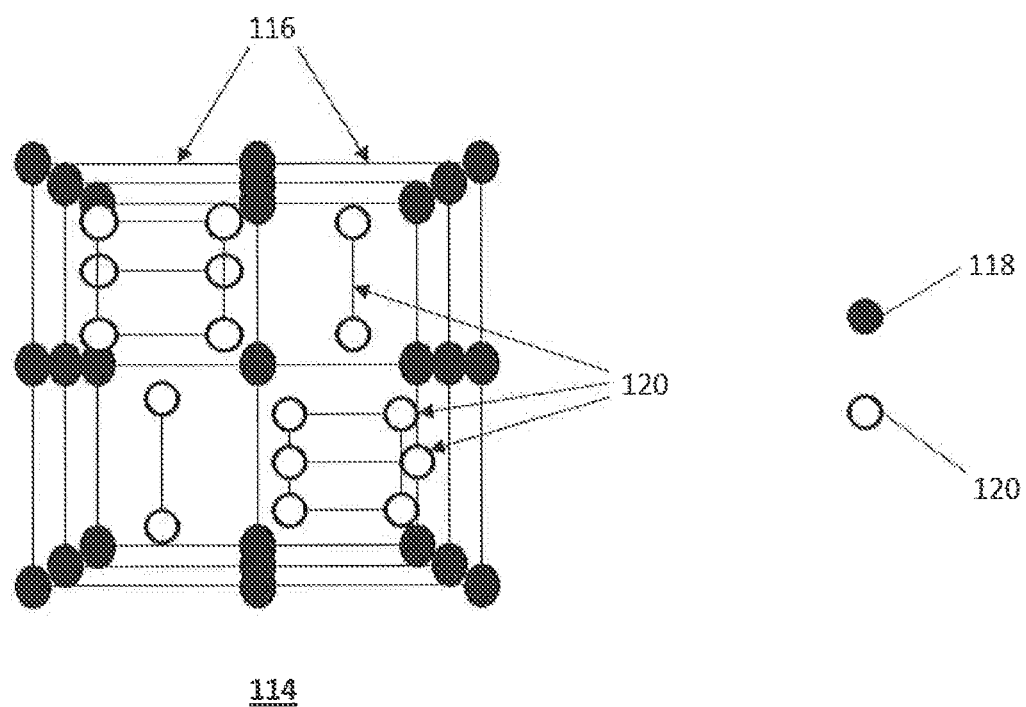
FIGS. 8A,8B,8C illustrates the Skutterudite crystal structure and the basic concepts of scattering and mean-free path as they relate to the conduction of quanta in solids.
Figure 8B:
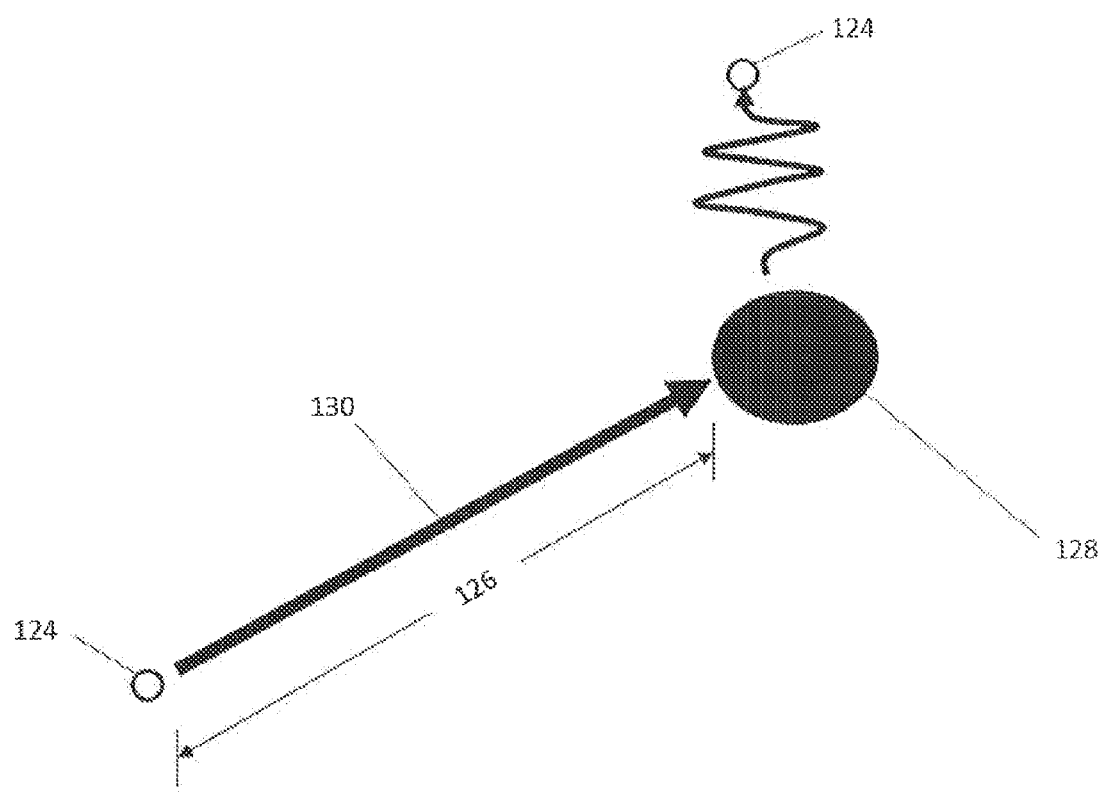
Figure 8C:
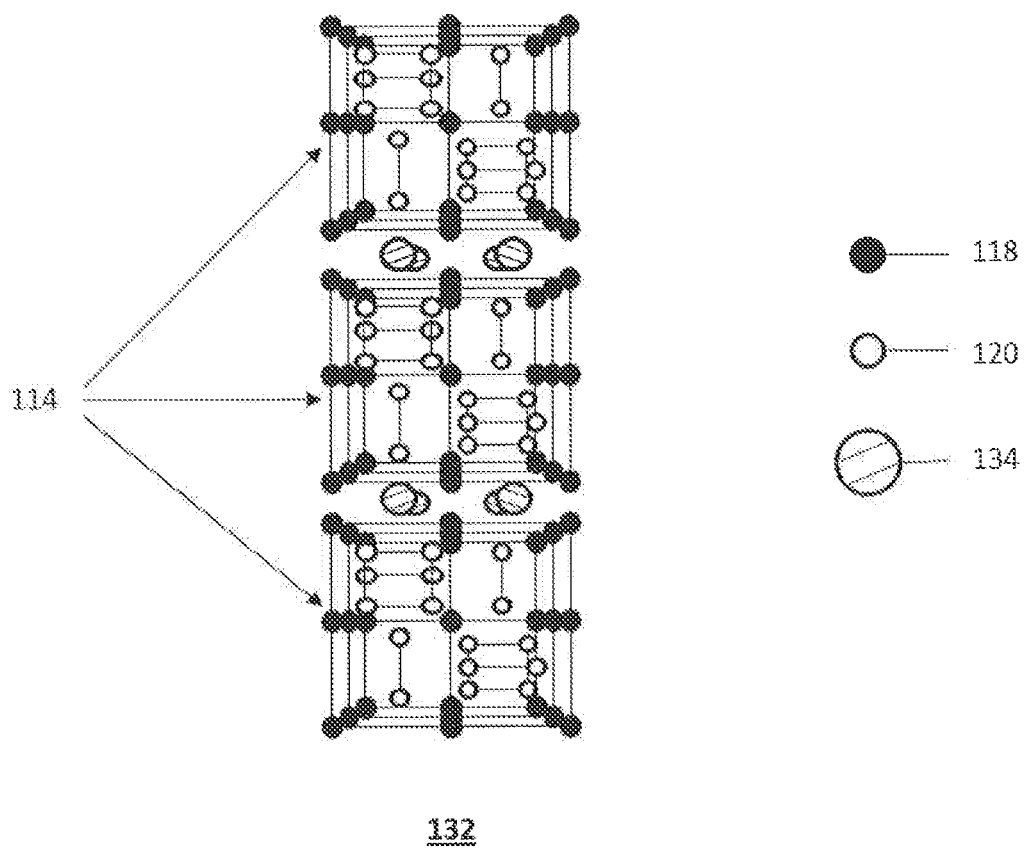

The crystal structure of Skutterudites (illustrated in FIG. 8A) is cubic, having a unit cell 114 consisting of an array of 8 smaller cubes 116 that have transition-metal element atoms (A) 118 at the corner of the smaller cubes 116, wherein 6 of these smaller cubes 116 are filled with almost square rings 120 having pnictogen group element atoms (B) 122 at the corners as illustrated in FIG. 8A. Each one of the six square rings 120 is aligned with one of the faces of the unit cell 114. The conductivity of a quantum particle (electron) or quantum quasi-particle (holes or phonons) 124 within a solid is influenced by the particle's mean free path 126 between scattering centers 128 that disperse the particle's kinetic energy and deflect the quantized particle 124 from its original path 130. (See FIG. 8B). A longer mean free path 126 implies fewer scattering events as the particle transits through the solid, which results in higher charge carrier mobility (μ) and higher electrical conductivity (σ) through equation 4a. The modified Skutterudites (see equation 7 and FIG. 8C) and chemical variants thereof, modify the crystalline structure to form a composite unit cell 132 that comprises atomic layers of alkali ions 134 situated between Skutterudite unit cells 114 as shown in FIG. 8C. A phonon is a quantized lattice distortion. The atomic layers of alkali ions 134 act as scattering centers 128, which shortens the phonon's mean free path 126 to an atomic length. The alkali ions 134 disperse the phonon kinetic energy by rattling around in the "cage" generated by neighboring Skutterudite unit cells 114. Heavier alkali ions disperse more vibrational energy by virtue of their higher atomic mass and thus, are more effective at reducing the thermal conductivity's vibrational component.

Figure 6:
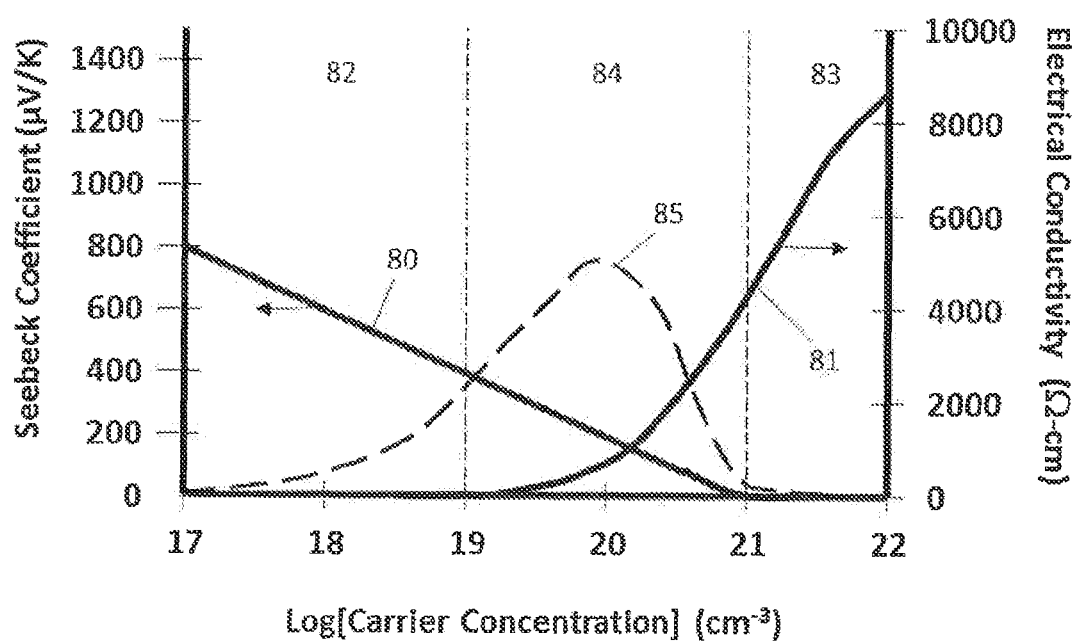
FIG. 6 illustrates the general variance in the Seebeck coefficient, electrical conductivity, and thermoelectric power factor of bulk semiconductors as functions of carrier concentration.

There are numerous applications where Skutterudite and modified-Skutterudite semiconductors may not be an optimal selection to achieve desired thermoelectric system performance, either due to their lower charge carrier mobilities (μ) or a range of operating temperatures that do not match targeted objectives. An important instance of the invention (see FIG. 9) reduces the vibrational component of thermal conductivity of any semiconductor material by applying LCD manufacturing methods to form semiconductor elements 106,108 within a thermoelectric module 100 that have polycrystalline microstructure wherein the major axis of the semiconducting grains 135 has maximal length less than 100 nm, and preferably has a length in the range of 10 nm-50 nm. The grain boundaries 136 reduce the vibrational component of the thermal conductivity by functioning as scattering centers to phonons propagating heat across the semiconductor element 106,108. The semiconducting elements 106,108 may comprise any semiconductor material that can be manufactured using LCD processes, including elemental semiconductors such as silicon (Si), germanium (Ge), alloyed mixtures of elemental semiconductors, complex carbides, complex nitrides, III-V compound semiconductors, II-VI compound semiconductors, IV-VI compound semiconductors, semiconducting Skutterudites or modified Skutterudites, and semiconducting oxides or mixed metal oxides. An additional advantage to LCD processing is the ability to form chemically distinct material layers 137A, 137B,137C in situ within the semiconductor elements 106, 108, and additional distinct material layers 138A,138B, 138C embedded within the electrically conducting elements 139A,139B,139C. These distinct material layers 137A,137B are heavily doped than the main body 137C of the semiconducting elements. This layered configuration allows the more heavily doped regions to minimize the thickness of the depletion zones at the junction with the electrically conducting elements 139A,139B,139C to form a better ohmic contact and reduce resistance throughout the TE circuit. It simultaneously allows the main body of the semiconductor element(s) 106,108 to have reduced carrier concentrations that maximize the Seebeck coefficient (see FIG. 6). The additional distinct material layers within electrically conducting elements 139A,139B,139C comprise a high hardness, low thermal coefficient-of-expansion constraining metal members 138A embedded within low hardness, high expansion, high conductivity members 138B,138C to relieve thermally induced stress within the composite structure as taught in the '252 application.

Figure 3A:
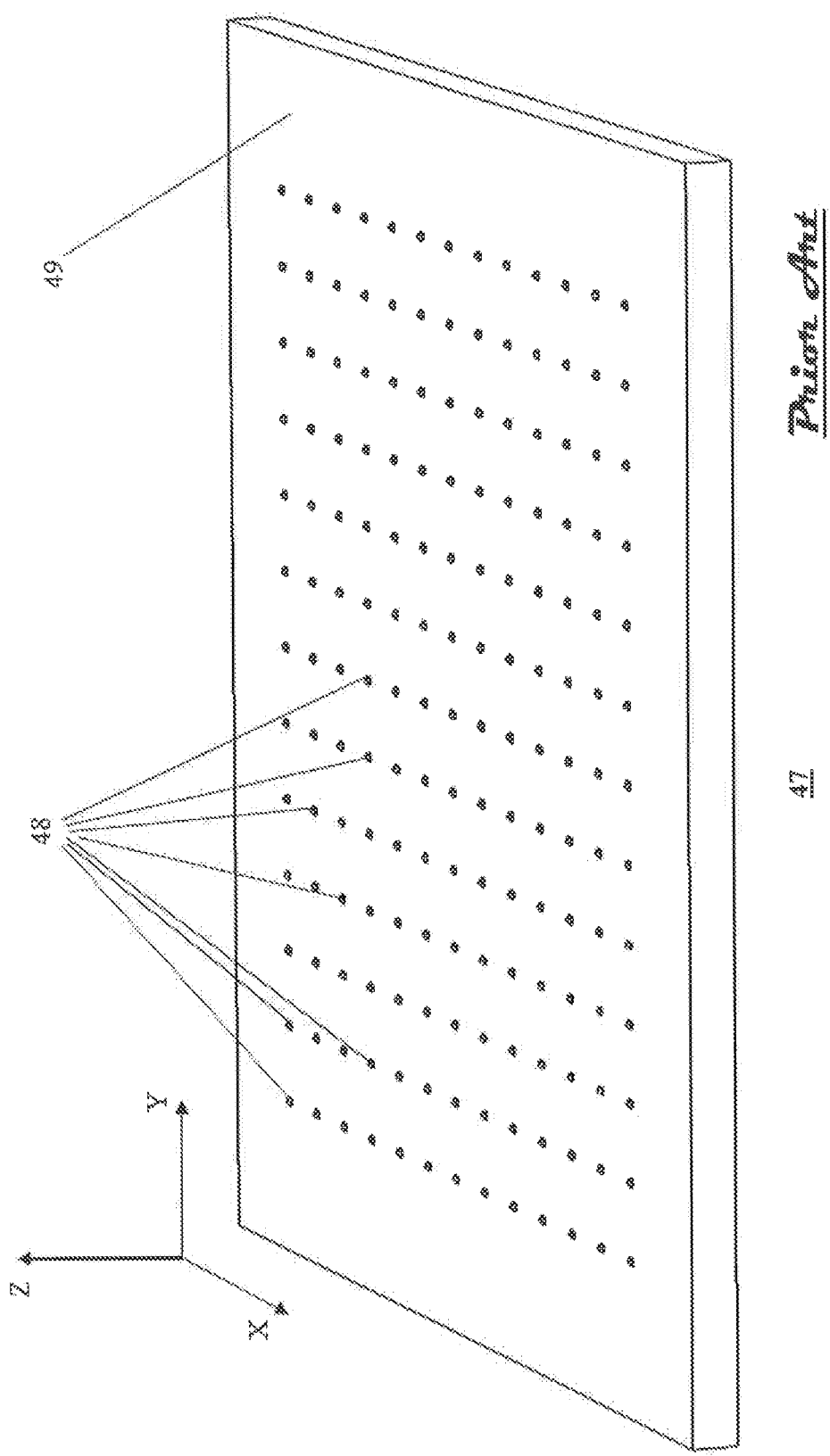
FIGS. 3A,3B depict microscopic structural features of prior art quantum dot superlattice semiconductors.
Figure 3B:
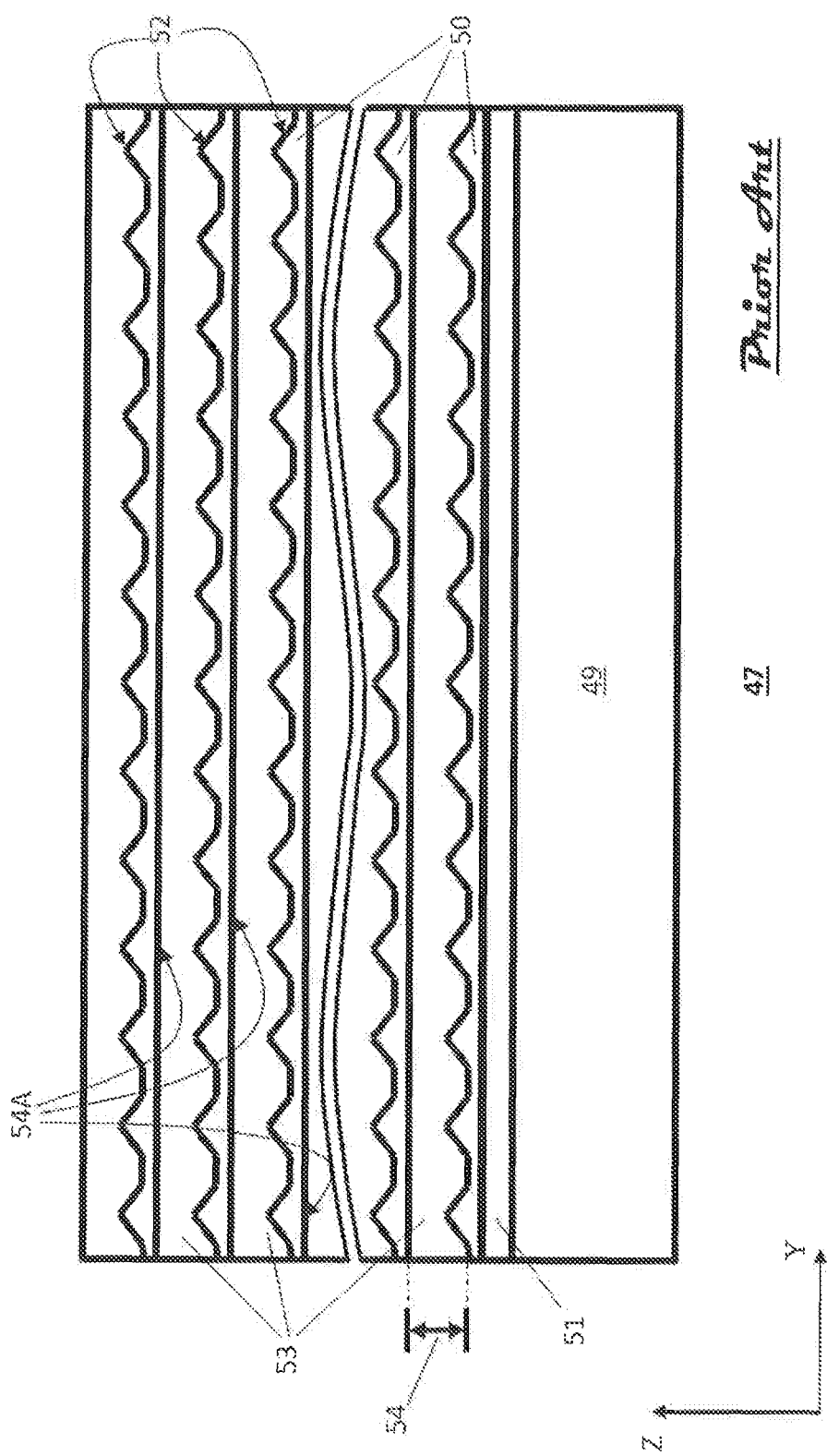

Reference is now made to FIGS. 10A,10B,10C,10D,10E to illustrate a particular embodiment of the invention that applies LCD methods as instructed in application '922B to form semiconductor elements 106,108 having a three-dimensional (3D) microstructure that comprises a uniform distribution of quantum dots 140 to minimize thermal conductance and maximize electrical conductance across the semiconductor element(s) 106,108. The quantum dot 140 consists of a granular semiconductor core 142 having an axial diameter 143 in the range of 10-100 nm. The granular semiconductor core 142 is enveloped by a chemically distinct grain boundary material 144 having a grain boundary layer thickness 145 ranging from 2-20 nm. The grain boundary material 144 may optionally comprise a metallic material or an insulating material. Since LCD manufacturing methods enable the formation of semiconductor material with quantum dots 140 that separated from one another in any physical direction by the grain boundary layer thickness 145, charge transport through resonant tunneling processes is possible in any direction (A-A', B-B', C-C') within the semiconductor element 106,108. (See FIG. 10A). This overcomes a principal limitation of the prior art (see FIGS. 3A,3B) wherein geometric shapes 52 used to form quantum dots are only positioned in close enough proximity to one another on a planar layer surface 54A to favor quantum tunneling between the geometric shapes 52 across the planar layer surface 54A, but the planar layer surfaces 54A are physically separated from one another by a distance 54 that hinders electrical charge transport between planar layer surfaces 54A through resonant tunneling processes.

Figure 10A:
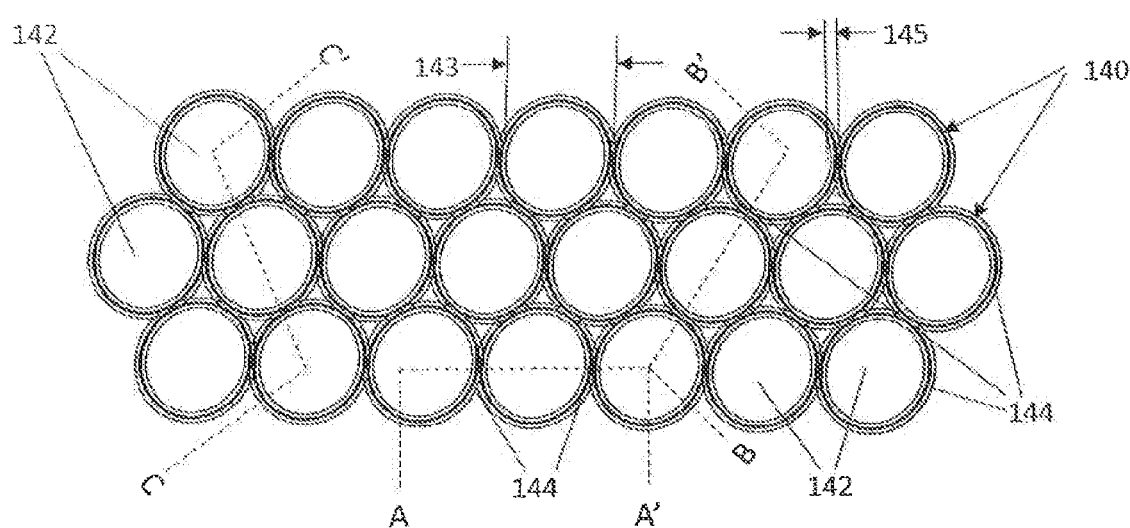
Figure 10B:
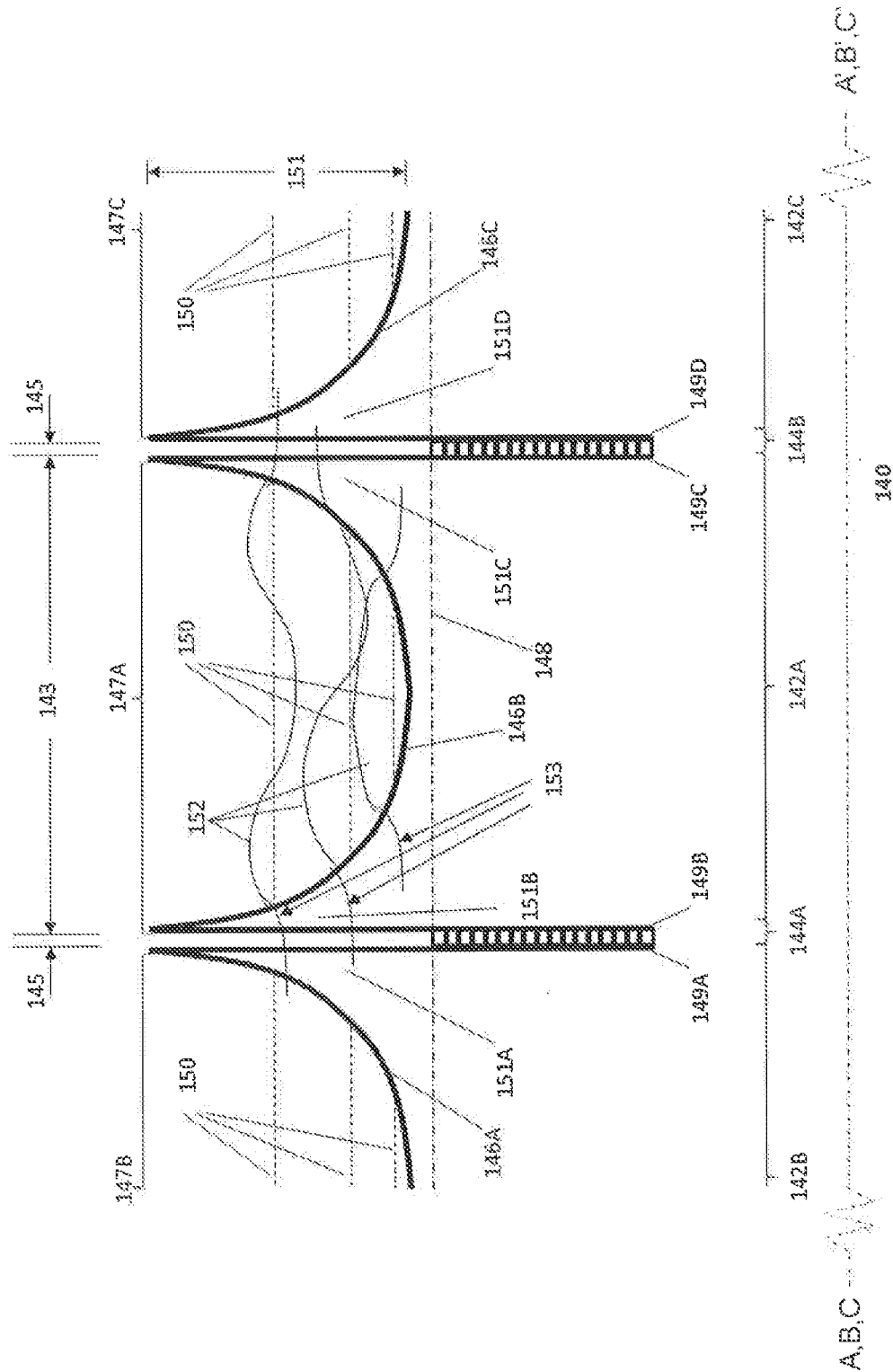

FIGS. 10B,10C illustrate the quantum sub-bands 150 produced within a quantum dot 140. Although only symmetric type-I quantum wells are illustrated herein, it should be assumed that any kind of quantum well, type-I, type-II, symmetric, asymmetric, etc., can formed within a quantum dot 140 by careful selection of the materials used to form the granular semiconductor core 142 and its grain boundary material 144. Furthermore, it is also understood that even though these illustrations depict quantum sub-bands 150 for electron states within the semiconductor conduction bands, the same analysis applies equally to quantized sub-bands for hole states within semiconductor valence bands.

FIG. 10B illustrates the characteristic quantum well structure created when the grain boundary material 144 comprises a metallic medium. In this instance, the electronic energy conduction bands 146A,146B,146C within of the granular semiconducting cores 142A,142B,142C are deformed into parabolic energy wells 147A,147B,147C to equilibrate the Fermi level 148 at the interface(s) 149A, 149B,149C,149D between the granular semiconducting cores and the metallic grain boundary material 144A,144B. Energy sub-bands 150 are created within the parabolic energy wells 147A,147B,147C when the axial diameter 143 assumes nanoscale dimensions. Electrons are generally forbidden within potential harrier regions 151A,151B,151C, 151D bounded by the height metal junction barrier 152 and the band gap defined by the edges of the electronic energy conduction bands 146A,146B,146C. However, because the height of the potential barrier 152 is finite, the probability state functions 152 which determine the physical locations of electrons within the parabolic energy wells 147A,147B, 147C will have tails 153 that determine a finite non-zero probability for the electrons being located within the potential barrier regions 151A,151B,151C,151D.

Similarly, FIG. 10C illustrates the characteristic quantum well structure created when the grain boundary material 144 comprises an insulator or wider band gap semiconducting material. In this instance, a potential barrier is formed by the discontinuity 154 in the electronic energy conduction bands 155A,155B,155C,155D between the granular semiconducting cores 142A,142B,142C and the insulating/wide band gap grain boundary material 144A,144B when the Fermi level 148 is equilibrated at the interface(s) 155A,155B, 155C,155D between the dissimilar materials. Energy sub-bands 150 are created within the square energy wells 156A, 156B,156C when the axial diameter 143 assumes nanoscale dimensions. Electrons are generally forbidden within potential barrier regions 157A,157B bounded by the height of the band edge discontinuity 154 and the grain boundary layer thickness 145. However, because the height of the band edge discontinuity 154 is finite, the probability state functions 158 which determine the physical locations of electrons within the square energy wells 156A,156B,156C will have tails 159 that determine a finite non-zero probability for the electrons being located within the potential barrier regions 157A, 157B.

Figure 4:
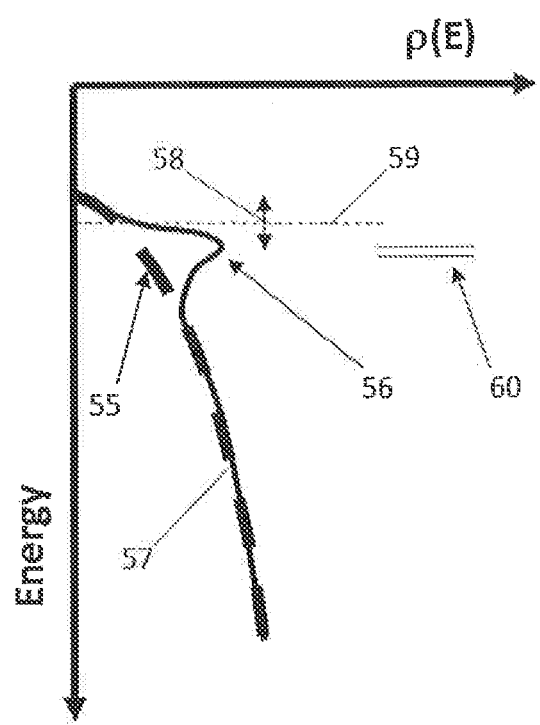
FIG. 4 illustrates modifications to a semiconductor's charge carrier density of states that improve thermoelectric performance by introducing electronic sub-bands that resonate with a valence or conduction band.
Figure 10D:
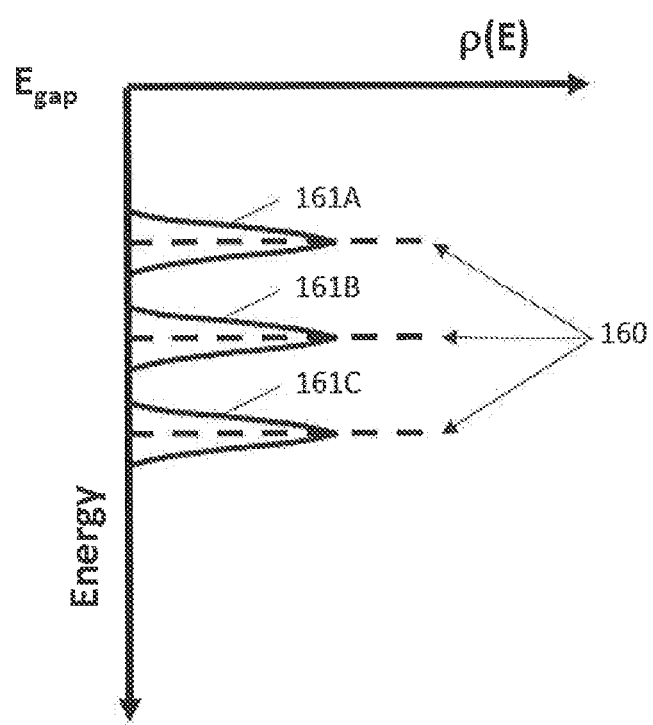

An objective of the invention is to improve thermoelectric performance maximizing electrical conduction and minimizing thermal conduction within the semiconductor elements 106,108. Quantum dots form zero-dimensional (0D) free-electron gases because the electrons (and holes) occupying sub-bands confront potential barriers in all physical directions. This apparent limitation actually improves thermoelectric conduction in two fundamental ways. As shown in equations 5a,5b and FIG. 4, the Seebeck coefficient, S, is improved by introducing sub-bands 60 that closely align with the Fermi level 59 which distort the density of states $\rho(E)$. In bulk materials, the density of states 55 is a slowly varying function with energy and the sub-bands 60 distort the normal density of states 55 by introducing a protrusion 56 that causes the first derivative of the charge carrier density $(dn(E)/dE)$ to have a higher value. As shown in FIG. 10D, in theory, the density of states for 0D free-electron systems are discrete delta functions 160 at energies that match the sub-bands 150. The sub-band energies in quantum well systems are directly related to the widths of the wells and the potential barriers. Although LCD produces polycrystalline grains having an exceptionally high degree of grain-size uniformity, there are minor variances in the size of the grains in a very large volume (relative to the grain size) that causes the density of states functions to broaden into a plurality of protrusions 161A,161B,161C. These protrusions can be engineered into any semiconducting system, rather than being restricted to select dilute alloy compositions that conveniently allow a dopant to be in close proximity with the Fermi level as is available through the prior art. The plurality of protrusions facilitates sub-band alignment with a larger number of material systems.

Figure 10E:
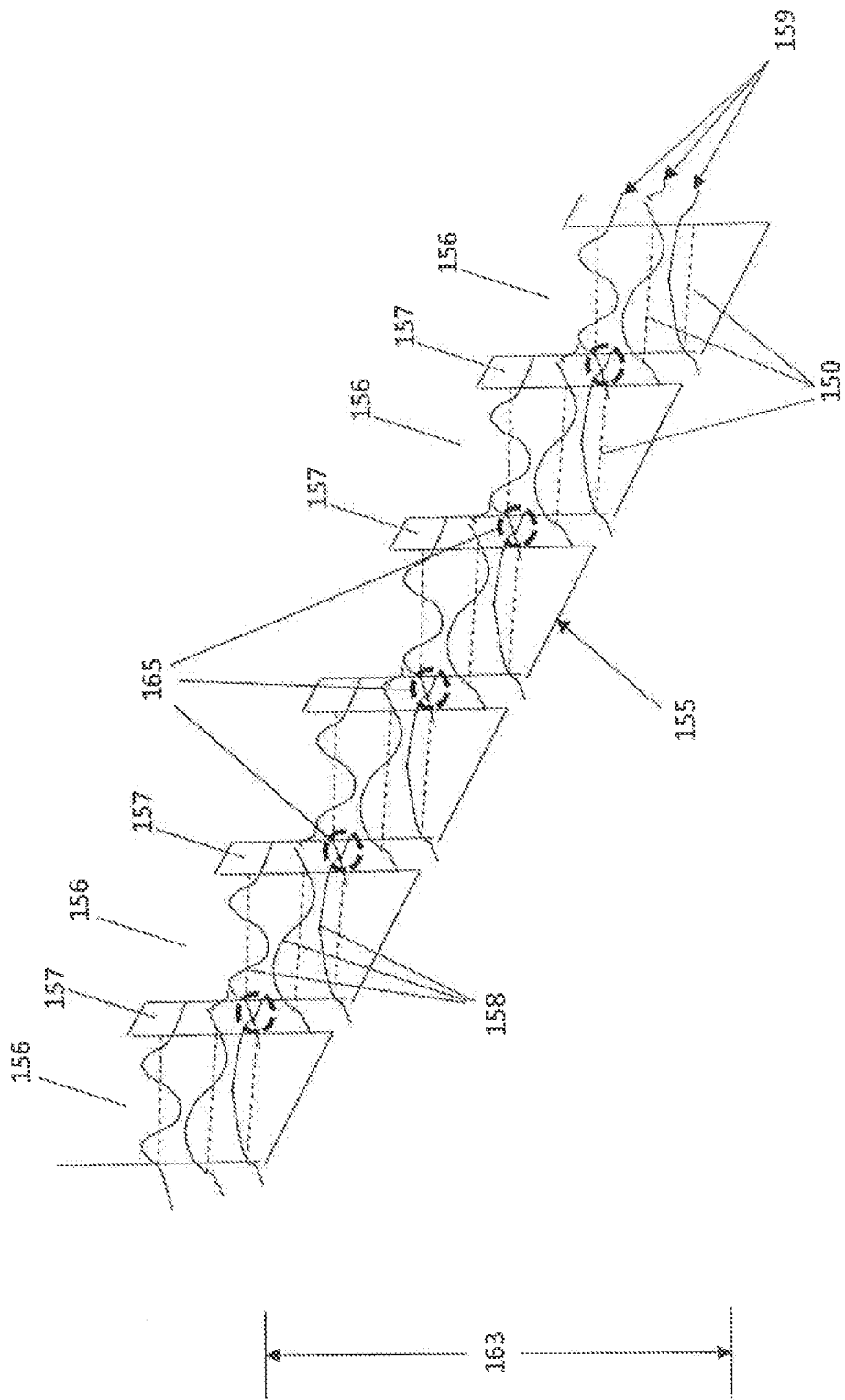

Electrical conductivity in 0D systems is generally frustrated by the potential barriers 157 that uniformly envelop the quantum well 156. FIG. 10E illustrates how select applied voltages 163 that cause the band edges 155 to tilt sufficiently that the tails 159 of the probability state functions 158 with differing sub-bands 150 in adjacent quantum wells 156 overlap 165 within the potential barriers 157 to trigger conditions of resonant tunneling charge transfer through the medium. This resonant condition allows electrons/(holes) to electrically conduct through potential barrier by means of quantum mechanical processes through barriers that scatter phonons and suppress heat transfer. Resonant tunneling conduction processes elevate electron/hole mobilities, which, in turn, enhance electrical conductivity σ(E) as shown by equations 4a,4b.

A further aspect of the invention applied to thermoelectric modules utilizes LCD manufacturing methods as described in de Rochemont '405 to form the upper 180 and lower 182 surface volumes from chemically complex intern ceramic carbides or nitrides commonly known in the literature as MAX phase materials because their chemical formula is described as:

$$M_{(n+1)}AX_n \quad (8)$$

where M is a first row transition-metal element,

A is an "A-group" element found in columns III thru VI of the periodic table, and, X is either carbon (C) or nitrogen (N).

Elemental substitutions within the MAX-phase family can give them wide ranging physical properties, but they are desirable in this instance for being mechanically hard (bulk modulus>GPa), oxidation/corrosion-resistant, damage tolerant materials (typically exhibiting micro-Vickers hardness in the range of 1 GPa-4 GPa), that have excellent thermal conductivity properties, generally in excess of 350 $W \cdot m^{-1} \cdot K^{-1}$. This combination of chemical, mechanical and thermal properties make them ideal for distributing heat to the leading edge of an aerodynamic surface or for distributing beat to or from a thermodynamic reservoir.

Figure 7A:
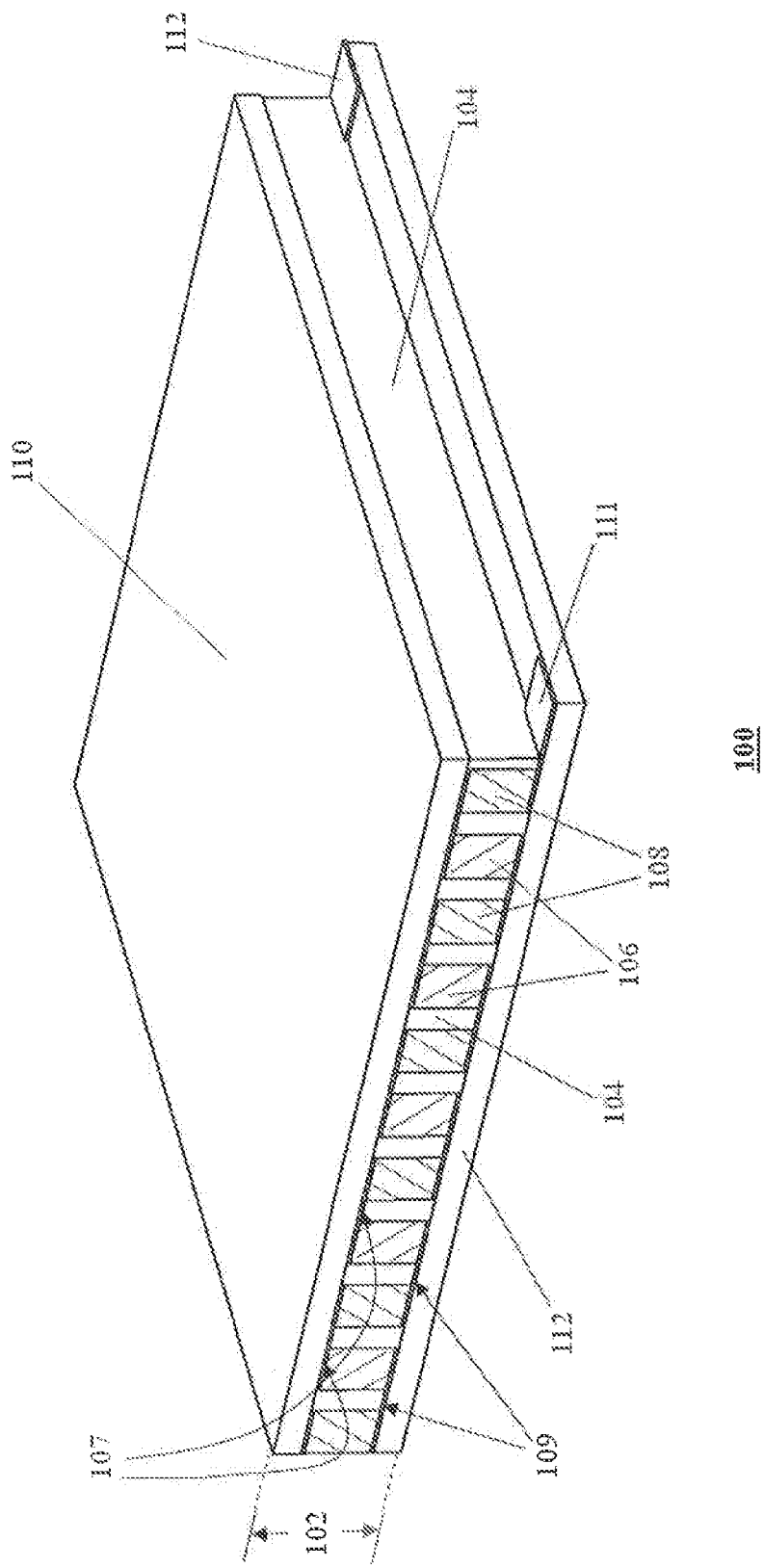
FIG. 7A, illustrates the principal embodiment of the thermoelectric module claimed by the invention.
Figure 7C:
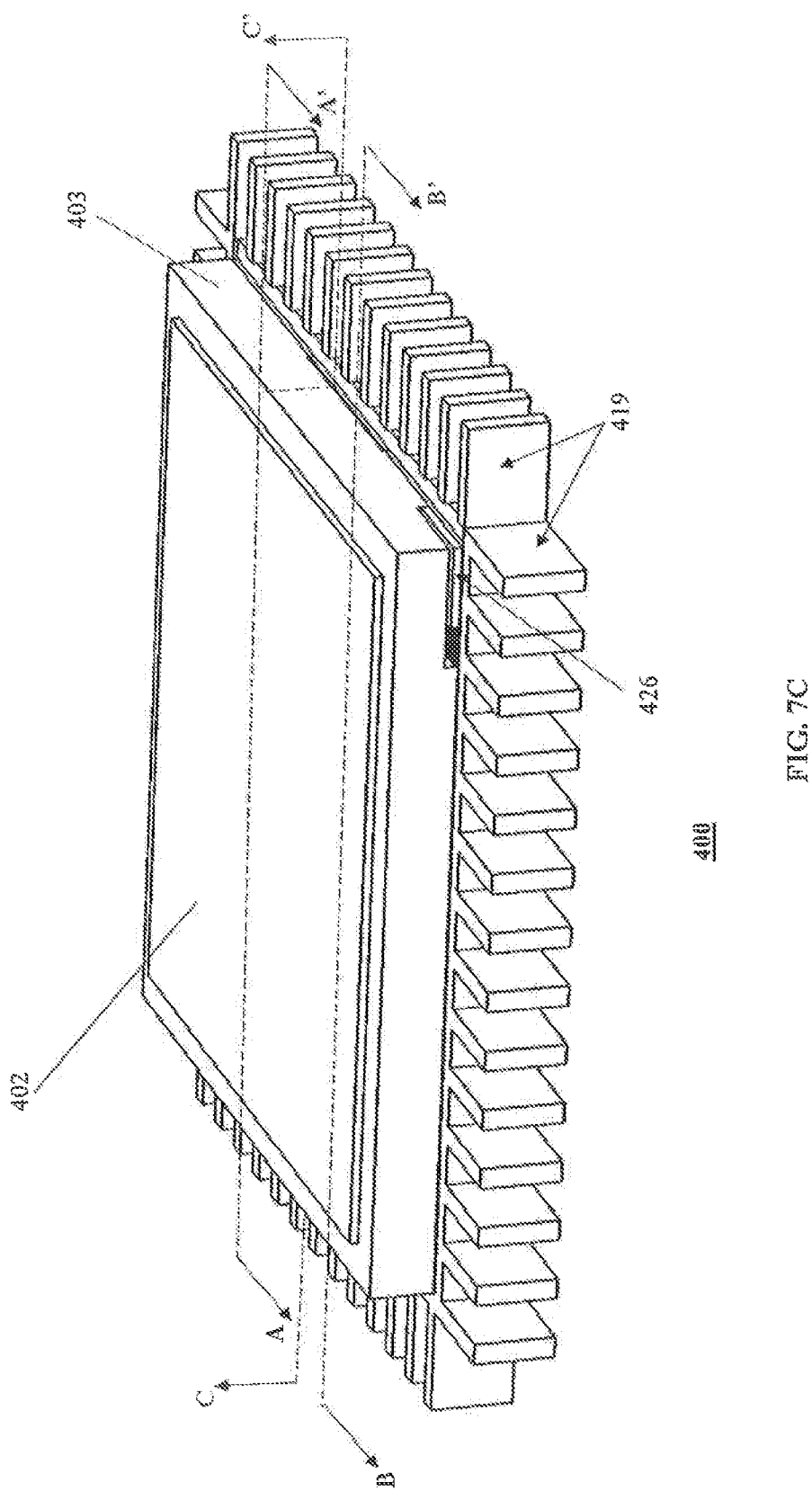
Figure 7D:
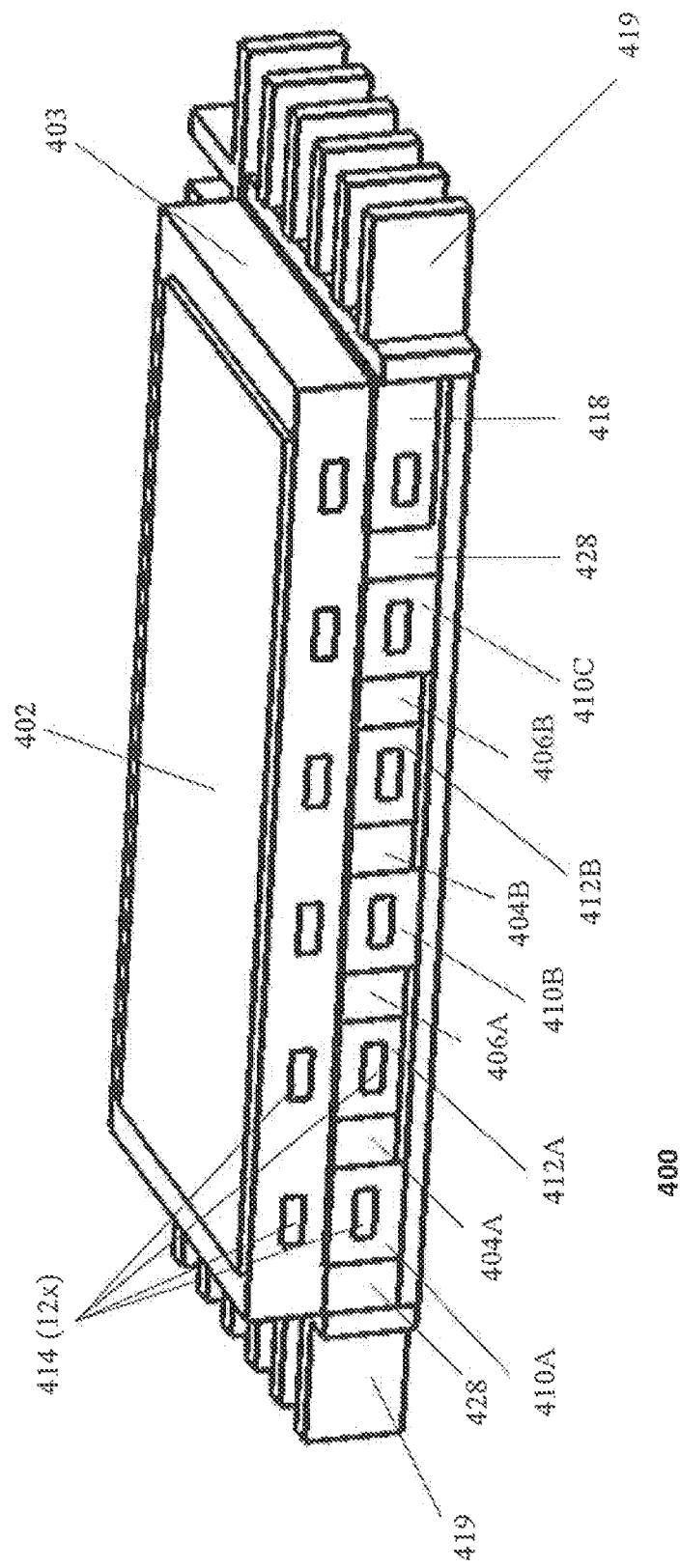
Figure 7F:
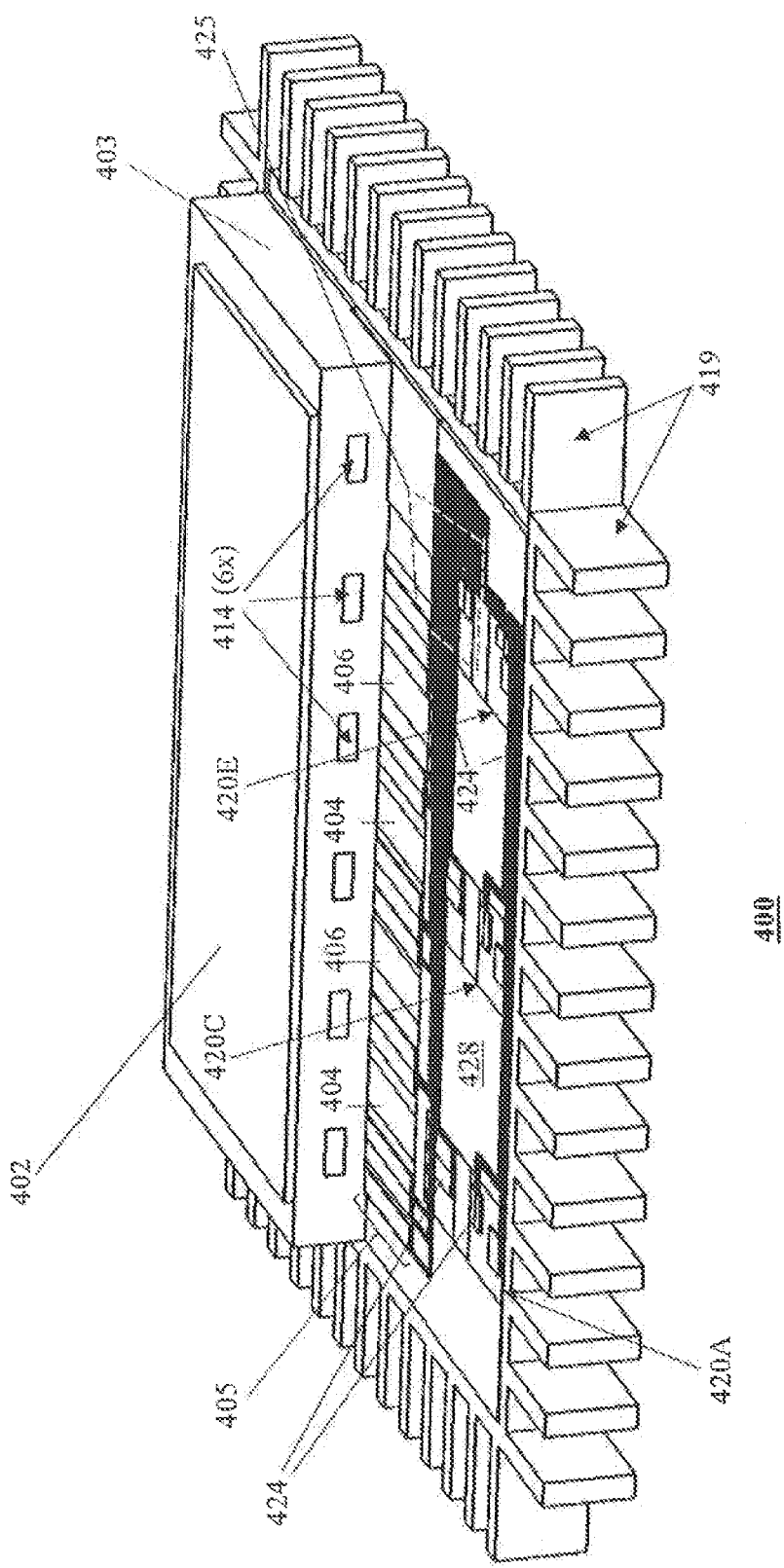

A fully integrated thermoelectric module comprising semiconductor elements having nanoscale microstructure described herein may be configured as the TE module 100 depicted in FIG. 7A wherein the semiconductor elements 106,108 are arrayed in the plane between or it may alternatively be configured as TE circuits within a microelectronic module 400 as illustrated in FIGS. 7B,7C,7D,7E,7F,7G. In this instance it is advantageous to thermally isolate the semiconductor elements 106,108 by, configuring them in series. The thermoelectric system contained within the microelectronic module 400 is particularly useful in microfluidic applications, especially microfluidic applications involving high power density electronics. Integrated circuits will be consuming >700 $W \cdot in^{-2}$ as the industry adopts the 22 nm semiconductor manufacturing node. This threshold will require high-efficiency, low profile thermoelectric systems to optimally manage heat transfer. The microelectronic module 400 may be mounted to an integrated circuit 402, mounted to a chip package 403, or formed upon the backside of the semiconductor wafer prior to dicing semiconductor die. The microelectronic module 400 comprises a first thermoelectric circuit 405 that consists of a plurality of thermally isolated n-type 404A,404B,404C and p-type 406A,406B semiconductor elements arranged in linear fashion. The semiconductor elements 404A,406A,404B,406B, 404C preferably have nanoscale microstructure 408 that minimizes thermal conductivity within the elements, and more preferably have a nanoscale microstructure 408 that comprises a uniform distribution of quantum dots. The semiconductor elements 404A,406A,404B,406B,404C are in electrical and thermal contact with alternating hot 410A, 410B,410C and cold 412A,412B electrodes that contain microfluidic channels 414 embedded within the bodies of the hot 410 and cold 412 electrodes, through which working fluids are passed. The electrodes 410,412 preferably comprise high-thermal and electrical conductivity MAX-phase materials. The microfluidic channels 414 are formed using methods similar to those instructed by the '549 application. Hot working fluid exits the thermal management packaging system 403 after making intimate thermal contact with the integrated circuit 402. The working fluid is then progressively cooled through the various embedded thermoelectric stages 416 contained within the microelectronic module 400. Upon exiting all embedded thermoelectric stages 416 of the microelectronic module 400, the hot working fluid (now cooled) is circulated by a micro-pump 418, preferably a microelectromechanical (MEMS) pump, which may further be in intimate contact with an optional thermal reservoir 419, before the working fluid is recirculated through the thermal management packaging system 403. A plurality of secondary thermoelectric devices 420A,420B,420C,420D, 420E provide additional thermal isolation by cooling the working fluid as it travels through the hot electrodes 421A, 421B,421C of the secondary thermoelectric devices 420A, 420B,420C,420D,420E situated between primary thermoelectric circuit stages 416A,416B,416C,416D,416E. The secondary thermoelectric devices 420A,420B,420C,420D, 420E are configured with n-type and p-type semiconductor elements positioned in parallel so the heat imparted by the working fluid to the hot electrode is directed from the working fluid to a thermal reservoir 419. This configuration ensures the working fluid is at successively colder temperatures as it passes through the various stages 416A,416B, 416C,416D,416E. A system comprising thin film thermocouples 422, electrical traces 424 for TE element control circuitry that is governed by a central control unit 426 regulates the voltages applied to the various stages 416 and the plurality of secondary thermoelectric devices 420A, 420B,420C,420D,420E to actively manage heat transfer from the integrated circuit 402 to the thermal reservoir 419 and to ensure the proper function of the microelectronic module 400. Amorphous silica 428 insulator is used to thermally isolate the hot 410 and cold 412 electrodes from one another, and to thermally isolate the plurality of secondary thermoelectric devices 420A,420B,420C,420D, 420E from the various stages 416A,416B,416C,416D,416E.

Reference is made to FIGS. 11-14 to illustrate the application of the thermoelectric module 100 to de-icing/anti-icing of aerodynamic surfaces. However, it should be noted that all of these embodiments can be applied to generate electrical energy from a heated or cooled fluid (gas or liquid) that traverses across an air-flow surface, like the exhaust gases from a jet turbine or turbo prop-fan engine, or a coolant applied to a heated surface, in the aviation industry, de-icing systems are required to remove all ice particles adhering to any aerodynamic surface prior to take-off. Anti-ice systems are deployed in-flight to prevent ice formation on those surfaces. FIGS. 11A thru 11D chart the surface heat (q [$W \cdot in^{-2}$]) requirements at 23° F. and 4° F. for an aircraft traveling at 175 mph at an altitude of 5,000 ft for "evaporative" and "running-wet" de-ice/anti-icing modes in various weather conditions. Running-wet anti-ice systems only require the aerodynamic surface to be maintained at a temperature slightly above freezing, typically 40-45° F. (4.5-7° C.) to partially evaporate surface water. The main drawback to running-wet systems is that large amounts of runback water flow over the aerodynamic surface. Additional heat must then be applied to a much larger surface area to prevent the icing of runback flows on trailing aerodynamic surfaces. Evaporative mode systems are the cleanest mode of anti-icing systems because they provide sufficient heat to evaporate impinging water/ice crystals upon impact raising surface temperatures to 80° F. (27° C.). At present, evaporative-mode anti-ice systems are normally found on airfoil and engine nacelle inlet leading edges. Engine nacelle inlet areas require anti-icing to be used more frequently than wing surfaces. The engine nacelle inlet leading edge is a large, blunt surface surrounding the inlet to the fan blades in the front of the engine. These surfaces are highly susceptible to ice accretion and typically require pneumatic evaporative-mode anti-icing any time the aircraft is operated in ambient temperatures below 10 deg. C. (50 deg. F.) and visible moisture conditions. The inlet anti-ice system is used to preclude ice build-up on the blunt loading edge of the engine nacelle inlet, since ice forming on the nacelle inlet areas would ultimately shed into the engine fan blades, causing measurable risk of costly or catastrophic engine damage.

Figure 11B:
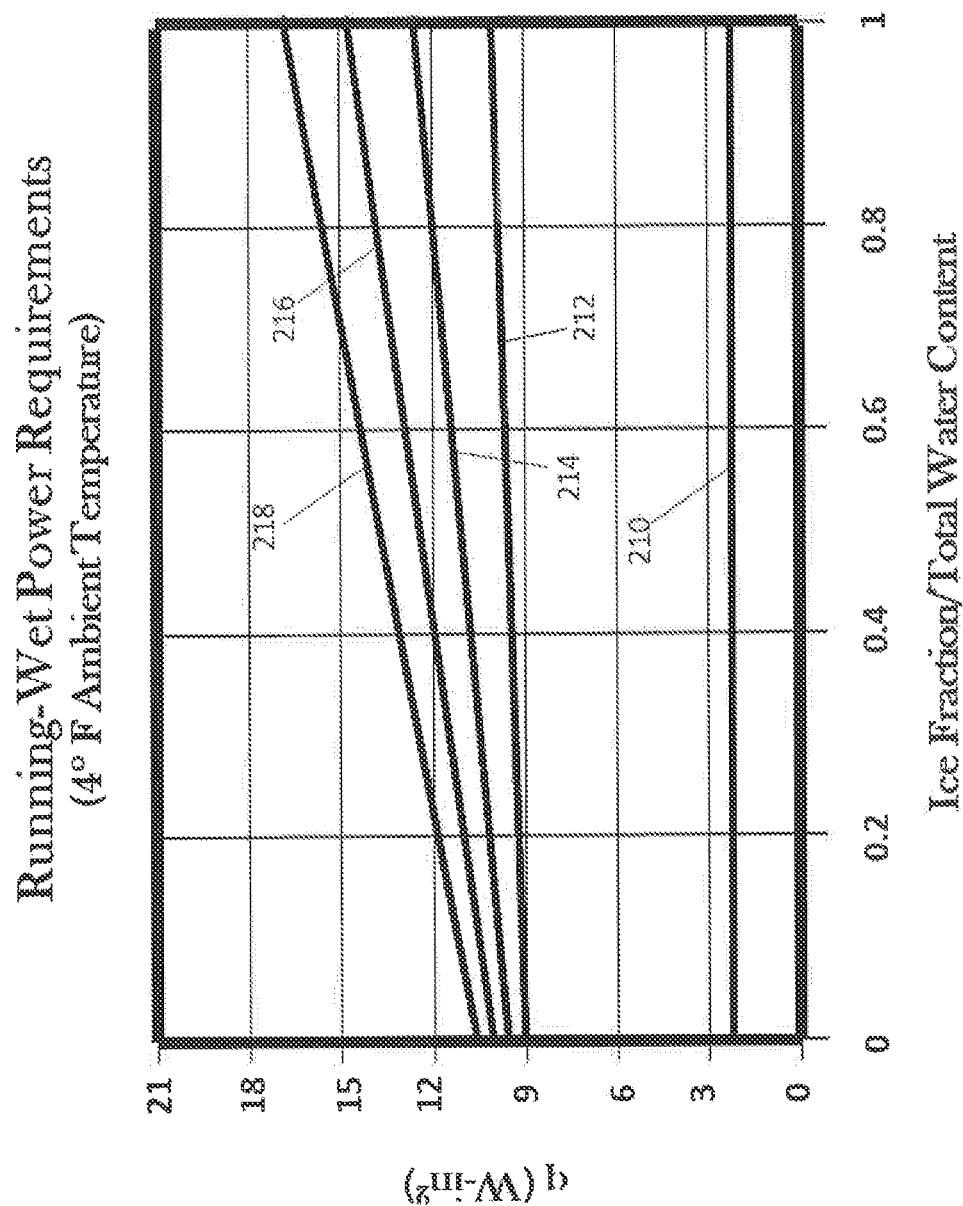
FIG. 11 illustrates the application of the present invention to the leading edge of various aerodynamic surfaces.

FIG. 11A shows the power density required for a running wet system operating in an ambient temperature of 23° F. (−5° C.) for total water density of 0.0 gms-m$^{-3}$ 200, 0.25 gms-m$^{-3}$ 202, 0.5 gms-m$^{-3}$ 204, 0.75 gms-m$^{-3}$ 206, 1.0 gms-m$^{-3}$ 208 as functions of the cloud ice fraction. FIG. 11B shows the power density required for a running wet system operating in an ambient temperature of 4° F. (−15.5° C.) for total water density of 0.0 gms-m$^{-3}$ 210, 0.25 gms-m$^{-3}$ 212, 0.5 gms-m$^{-3}$ 214, 0.75 gms-m$^{-3}$ 216, 1.0 gms-m$^{-3}$ 218 as functions of the cloud ice fraction. FIG. 11C illustrates the power density requirements for a evaporative system operating in an ambient temperature of 23° F. (−5° C.) for total water density of 0.0 gms-m$^{-3}$ 220, 0.25 gms-m$^{-3}$ 222, 0.5 gms-m$^{-3}$ 224, 0.75 gms-m$^{-3}$ 226, 1.0 gms-m$^{-3}$ 228 as functions of the cloud ice fraction. FIG. 11D illustrates the power density required for a evaporative system operating in an ambient temperature of 4° F. (−15.5° C.) for total water density of 0 gms-m$^{-3}$ 230, 0.25 gms-m$^{-3}$ 232, 0.5 gms-m$^{-3}$ 234, 0.75 gms-m$^{-3}$ 236, 1.0 gms-m$^{-3}$ 238 as functions of the cloud ice fraction.

FIGS. 11C,11D show that power density requirements for evaporative de-icing/anti-icing systems remain fairly constant with varying temperatures and ice fractions. FIGS. 11A,11B show that although running-wet systems require lower power density levels, minimum surface heat requirements vary dramatically with ambient temperature and weather conditions (cloud water density and ice fraction). Today's anti-ice systems operate in either "on" or "off" modes, irrespective of atmospheric moisture, solids content, and temperature. As such, there is no means to optimally modulate flight systems to minimize the fuel degrading pneumatic anti-ice system by matching minimum surface heat requirements defined in FIGS. 11A,11B,11C,11D to weather conditions in real-time. It would be desirable to improve aircraft fuel economy by providing pilots/Right systems the means to achieve incremental fuel savings by modulating anti-ice system operation to match atmospheric conditions registered by on-board Doppler radar systems and ambient temperature sensors. An integrated thermoelectric de-ice/anti-ice system provides means for a feedback system that combines on-board Doppler radar/thermal sensors to precisely sense/predict atmospheric conditions and automatically modulate anti-icing systems to provide incremental fuel savings not possible with the pneumatic systems predominantly used on high performance aircraft. Thermoelectric de-ice/anti-ice system would also provide significant fuel savings through reduced system weight. Pneumatic systems are comprised of relatively heavy, high-temperature and high-pressure ducting that ports bleed-air from the pneumatic source (engines) to the various leading edges needing anti-ice protection with an attendant fuel cost due to its draw on engine power when used. Substantial fuel savings, in addition to those mentioned, will be realized over the entire useful life of the aircraft by replacing the pneumatic evaporative systems which presently burden large commercial and many smaller corporate size high-performance aircraft every minute they are in-flight with these lighter weight thermoelectric skins.

Current thermoelectric de-icing systems are based on resistive joule-heating, which utilize composite sheet materials as the heating elements. Heat is generated by passing an electrical current through the resistive material embedded within the sheet. Ice prevention systems that rely on Joule heating typical provide a few watts of thermal energy per square inch to an aerodynamic surface. This method is insufficient for use as evaporative-mode anti-ice, or ground and in flight de-icing systems which require 20-70 W-in$^{-2}$ as illustrated in FIGS. 11C,11D. The low efficiency Joule heating systems generally require a large power plant, which is not available on general aviation aircraft. Furthermore, the local temperatures generated when driving power densities higher than 30-40 W-in$^{-2}$ using Joule-heating systems are beyond the limits of typical aircraft construction materials.

Figure 12A:
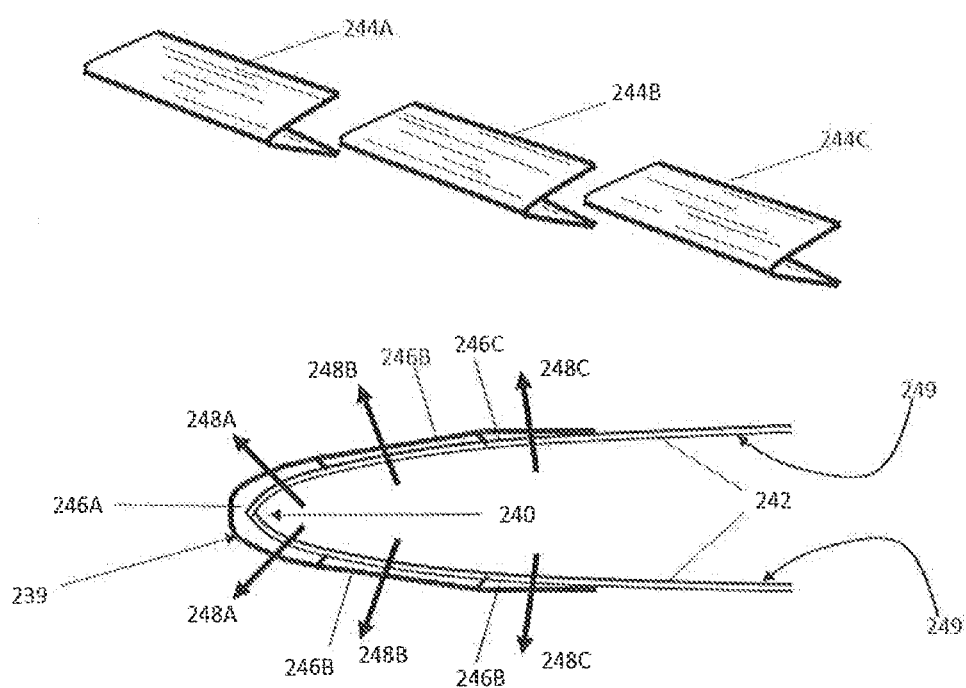
FIG. 12 illustrates the application of the present invention to other aircraft systems.
Figure 12B:
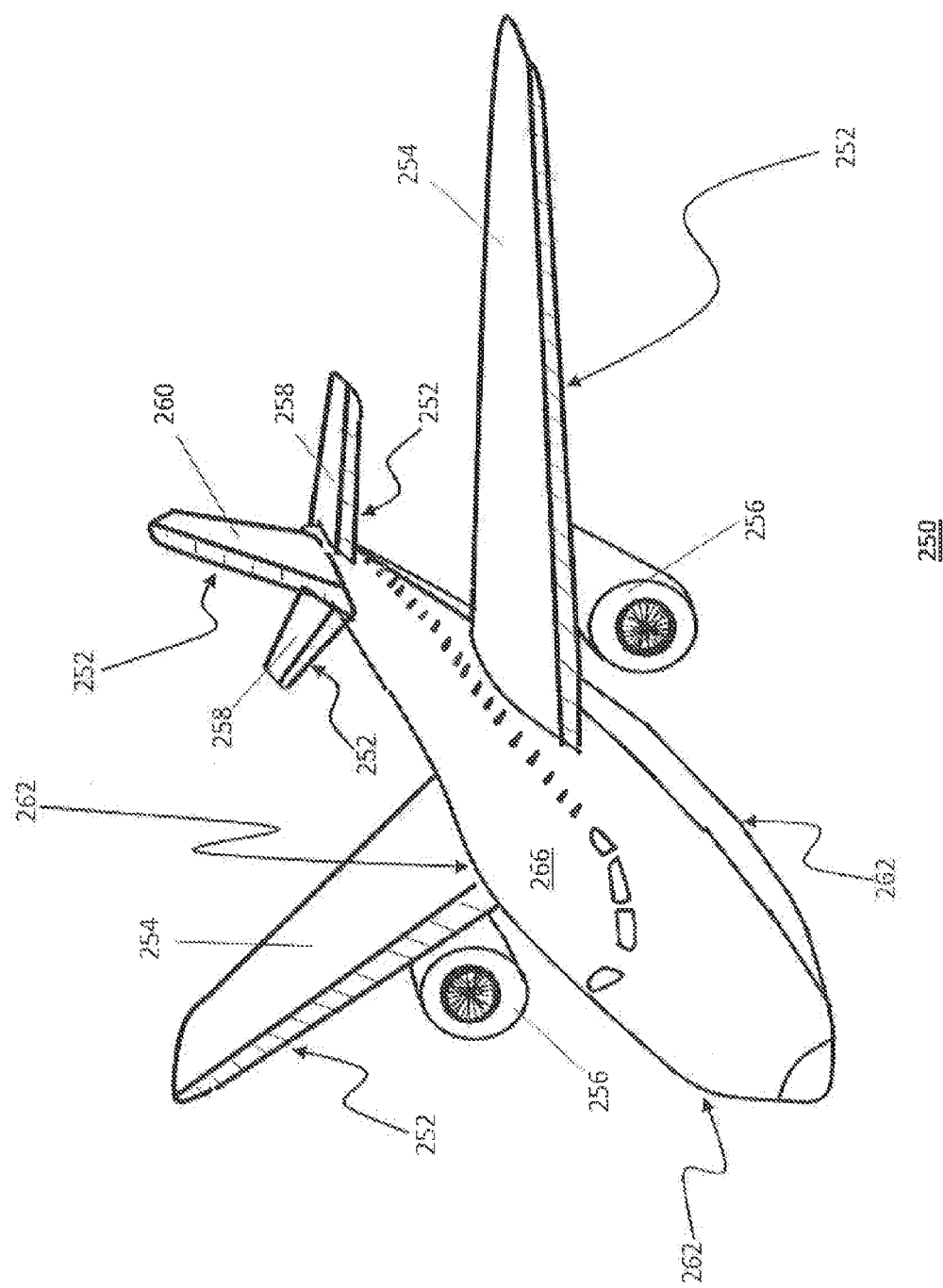
Figure 12D:
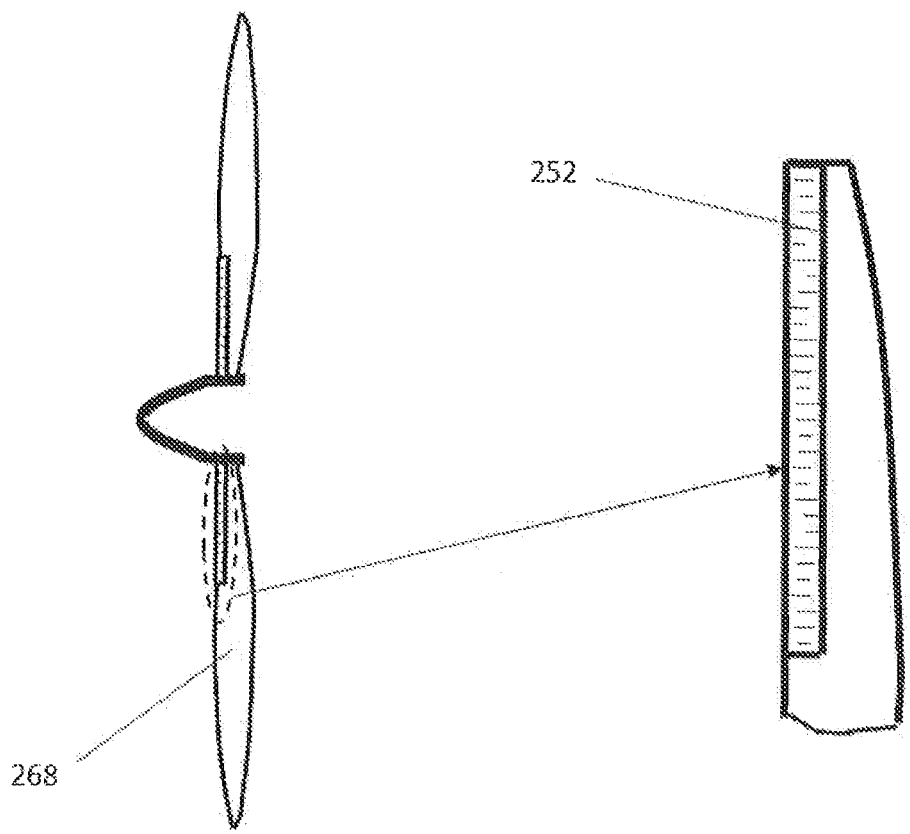
Figure 12E:
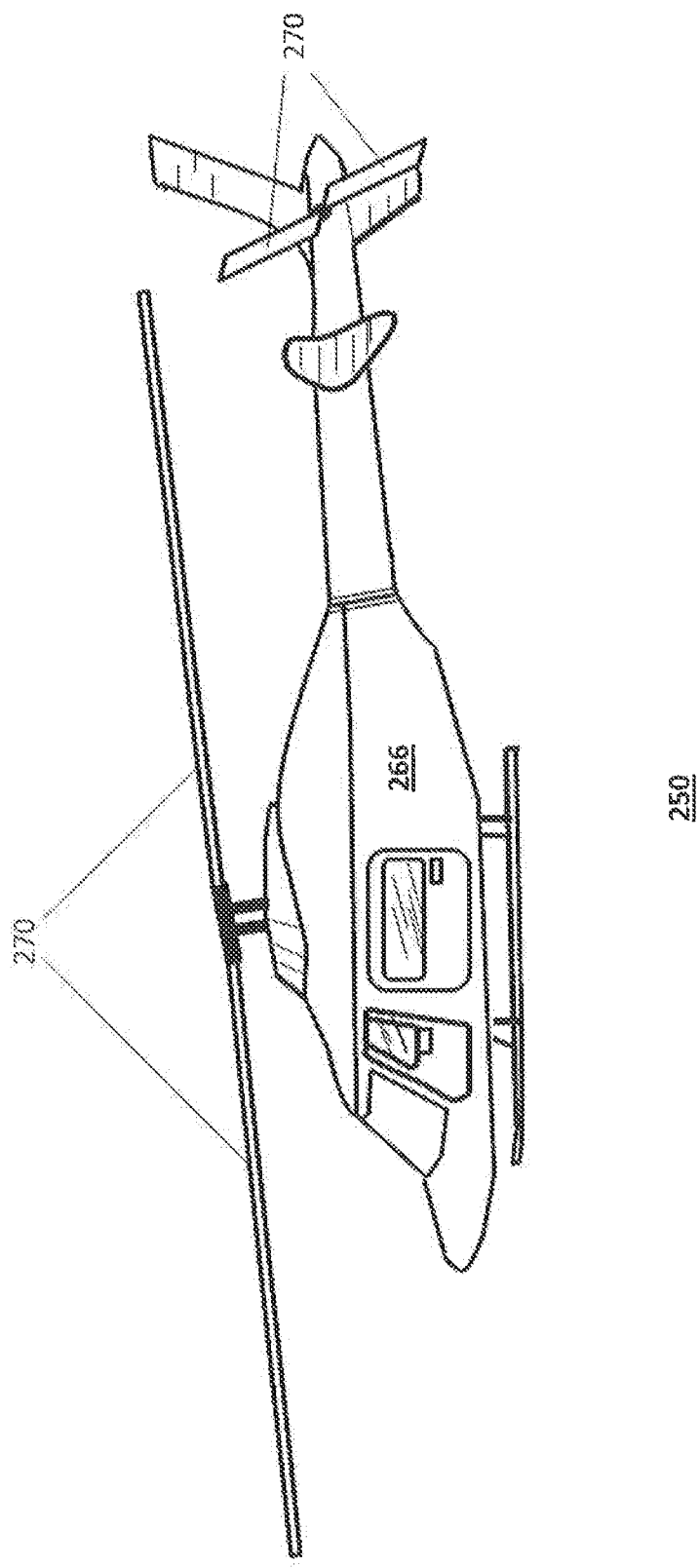

Reference is now made to FIGS. 12A,12B,12C,12D,12E to illustrate the preferred locations to apply pliable or conformal high efficiency thermoelectric skins 239 on aircraft for the purpose of anti-icing the leading edge 240 of an aerodynamic surface 242 such as a wing shown as a cross-section FIG. 12A. A plurality of pliable or conformal high-efficiency thermoelectric skins 244A,244B,244C are applied to form a multiplicity of ice-shedding zones 246A,246B, 246C having varying heat transfer quotients 248A,248B, 248C. Heat transfer quotients are moderated by varying the number of layers of thermoelectric skins 244A,244B,244C applied over the surface of a given ice-shedding zone 246A,246B,246C, wherein a larger number of thermoelectric skin layers 244A,244B,244C are successively applied in ice-shedding zones 246A,246B,246C requiring a higher heat transfer quotient. A maximal thermoelectric heat transfer quotient 248A is applied through ice-shedding zone 246A to supply evaporative-mode anti-icing to the surface area in immediate proximity to leading edge 240. Lower heat transfer quotients 248B,248C are generated by applying a fewer number of thermoelectric skins 244A,244B,244C in ice-shedding zones 246B,246C that comprise runback areas. The heat transfer quotients 248B,248C are configured to allow ice-shedding zones 246B,246C to operate in running-wet mode, or allow certain areas the option to operate in running-wet or evaporative anti-icing modes. Thermoelectric skins 239 used as anti-icing systems would be applied to all leading edges of any aerodynamic surface of any aircraft or flight system 250. This includes the leading edges 252 on wings 254, the inlet areas of engine nacelles 256, the empennage comprising the horizontal 258 and vertical stabilizers 260, balance horns 262 or any high-lift leading edge devices, such as an LE Krueger flap (not shown) that are integral to the design of nearly every large and most every small high-performance aircraft produced today, contours 264 in the fuselage 266 that are purposefully designed to function as lifting surfaces. Thermoelectric skins 239 may also be applied as anti-icing systems to the leading edges 250 of propeller 268 or helicopter rotor 270 blades, or minor aerodynamic surfaces 272, such as winglets, canards, or antenna and instrumentation housings.

The application of thermoelectric skins 239 need not be limited to the leading edges 252 of a flight system's 250 aerodynamic surfaces. Thermoelectric skins 239 can be usefully applied on the interior surface 249 of a wing 254 or the fuselage 266 to keep the temperature of volatile fuels stored in the tanks below flash points by pumping the fuels' internal heat to the flight system's 250 exterior regions. This is not an option with heat-generating resistive (Joule) ice prevention systems. As power generating systems, thermoelectric skins may also be applied to any flight system 250 surface over which a temperature differential exists, including but not limited to the engine exhaust ducts, galley systems, and portions of the fuselage 266 in contact with the cabin housing (not shown), to supplement on board power systems. In addition to anti-icing, efficient thermoelectric skins have value an ground-based de-icing. The aviation industry de-ices the fleet with ethylene glycol liquid sprays, which pose environmental risks and erode aircraft economic productivity due to lost time and added cost. Military helicopters are grounded in ice-producing atmospheric conditions because current de-icing systems are not reliable. Therefore, a need for a high efficiency de-icing system that is conformal to aerodynamic surfaces is clearly demonstrated. In this instance, thermoelectric skins 239 would be applied to the entirety of the fuselage. Methods advanced by GKN Aerospace (Redditch, U.K.) that form thermoelectric elements by incorporating molten liquid metals sprayed on a fiber fabric produce leading edges that consume 45 kW to 75 kW to provide de-icing service restricted to a temperature range of 45° F. to 70° F. (7.2° C. to 21.1° C.) on the Boeing 787 airframe. A complete anti-icing solution utilizing the GKN Aerospace thermoelectric technology on-board the 787 Dreamliner™ would require 150 kW to 200 kW, which is beyond the available power budget. Therefore, methods and means to embed higher efficiency thermoelectric systems within a carbon composite aerodynamic surface that would allow full anti-icing solutions to the leading edges of a system comparable to the 787 Dreamliner™ that requires 45 kW to 75 kW to operate is desirable.

Figure 1C:
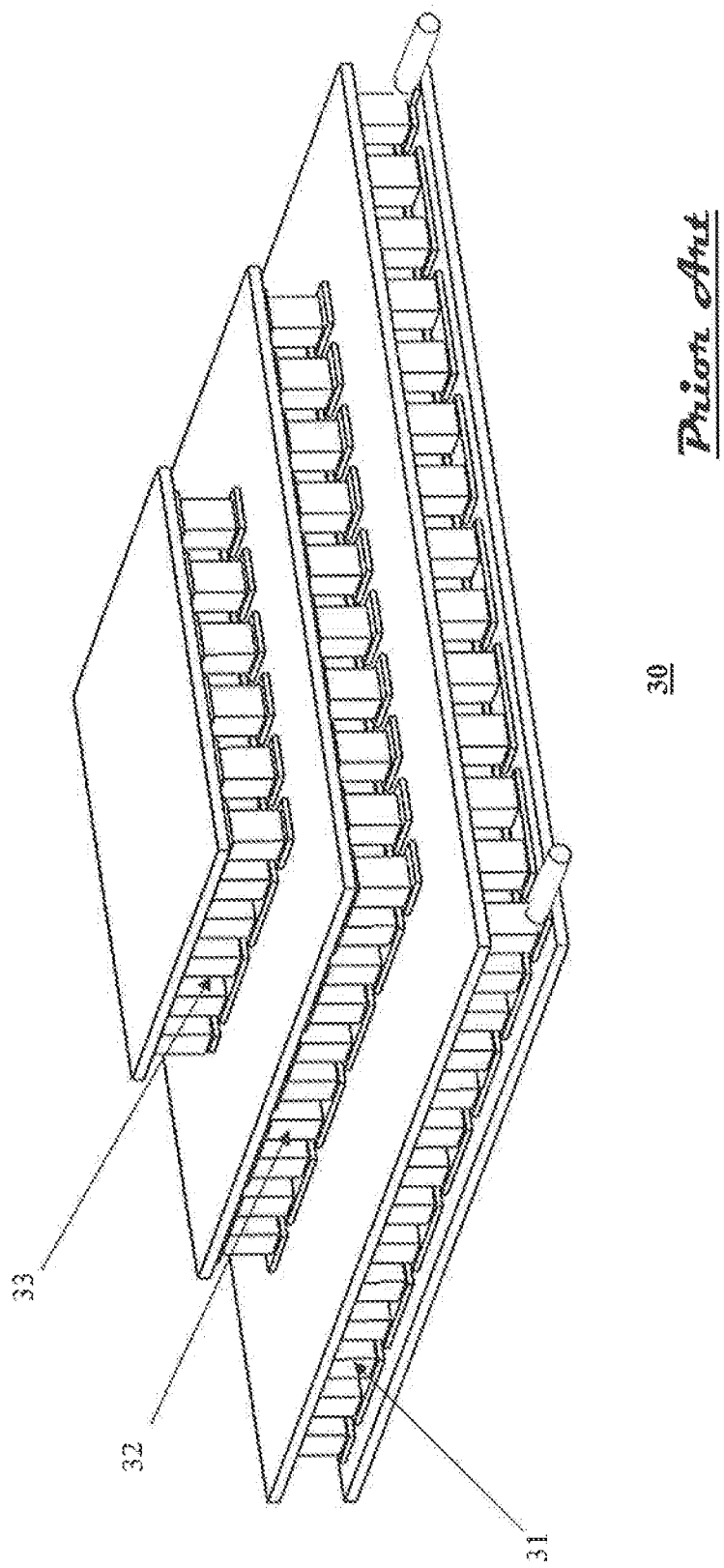
Figure 1D:
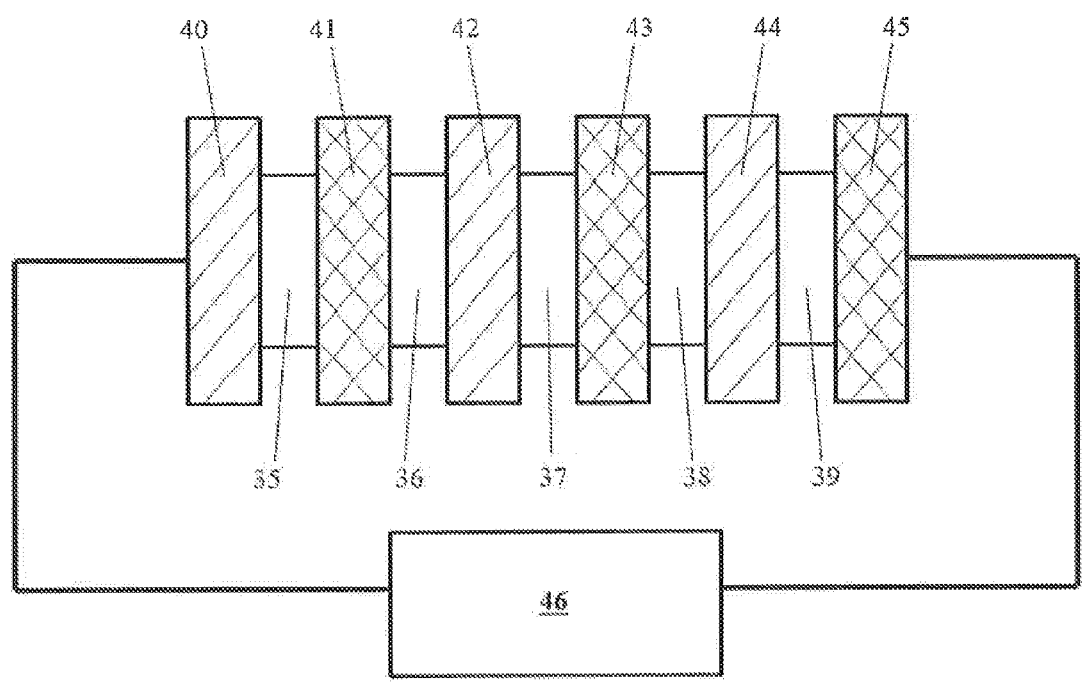
Figure 2:
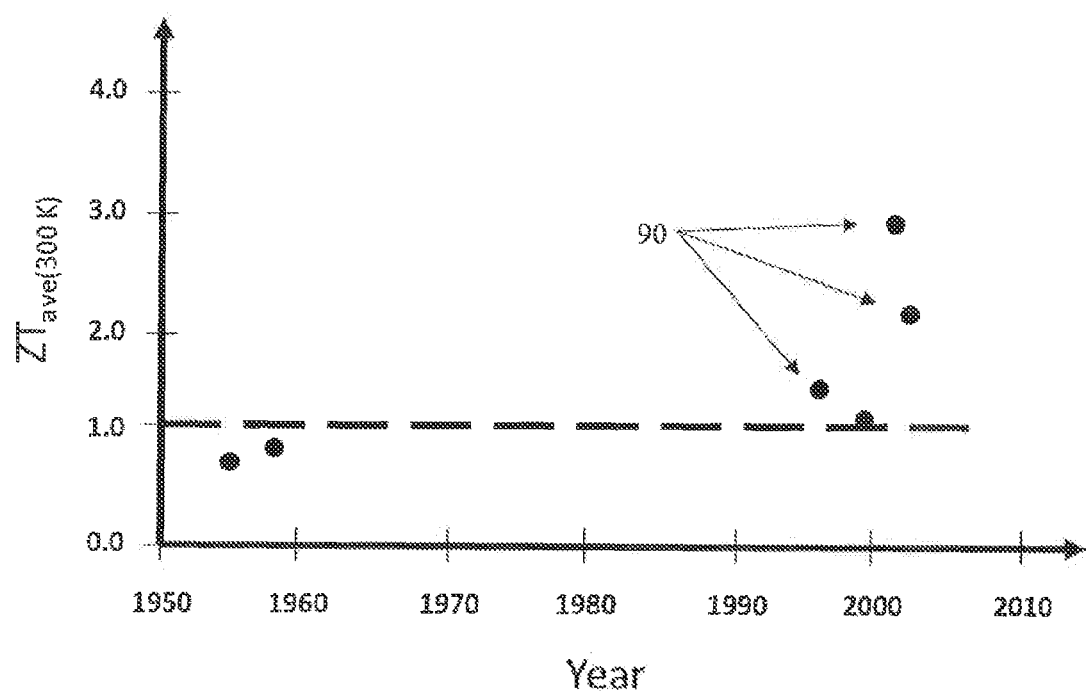
FIG. 2 depicts the enhanced thermoelectric figures of merit that have resulted from better understanding and control of nanoscale features embedded within the semiconductor elements.
Figure 13:
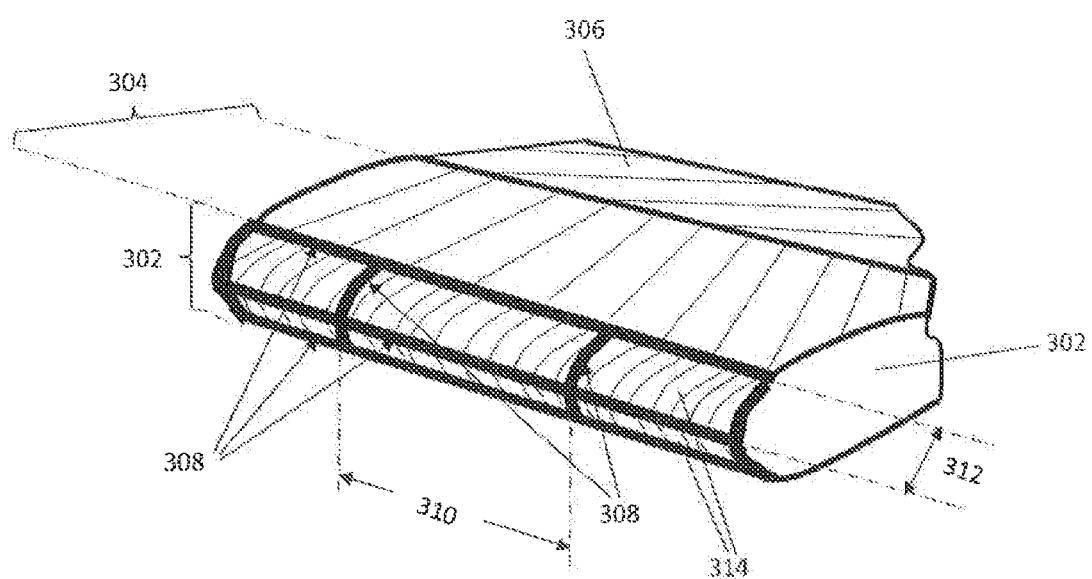
FIG. 13 illustrates general features of a thermoelectric skin applied to the leading edge of an aerodynamic surface.

Reference is now made to FIGS. 12A and 13 to illustrate general features of a pliable thermoelectric skin 244A,244B, 244C mounted upon an aerodynamic surface 300 of any flight system 250. Each pliable thermoelectric skin 244A, 244B,244C forms a thermoelectric circuit similar in principle to the thermoelectric module 100 displayed in FIG. 7A. One or more thermoelectric skins 244A,244B,244C are stacked on the surface of the aerodynamic surface 300 to form the thermoelectric ice prevention (anti-icing/de-icing) system. Higher layer counts produce greater thermal quotients per unit area of aerodynamic surface as illustrated in principle by the module 30 in FIG. 1C. Higher efficiency thermopower materials also increase thermal quotients per unit area of aerodynamic surface. The layer count, total thickness, and precise chemical makeup of the thermoelectric skins 244A,244B,244C, are determined by the thermal mass of the aerodynamic surface, the geometrical and operational characteristics (including available power) of the flight system 250, as well as other aeronautical and cost considerations. A plurality of thermoelectric skins 244A, 244B,244C, yielding higher thermal quotients per unit area, are applied to high ice prevention regions 302 that require evaporative-mode anti-icing systems. High ice prevention regions 302 typically comprise the leading edges 252 on wings 254, the inlet areas of engine nacelles 256, and the empennage surfaces 258,260. One some aircraft they may also include specific contours 262 of the fuselage 266. Moderate ice prevention regions 304 require running wet anti-icing systems, so a lesser plurality of thermoelectric skin 244A,244B,244C layers, or even a single skin layer if thermal transfer parameters permit, are applied to these regions. Unless the aircraft is configured for complete de-ice, low ice prevention regions 306, which generally comprise trailing edges of the aerodynamic surface 300, are not covered by any thermoelectric skins 244A,244B,244C. A thermoelectric de-icing system would essentially cover the complete fuselage 266 of the flight system 250, and plurality of thermoelectric skins 244A,244B,244C would be required in the low ice prevention regions 306 if the de-icing system was required to completely de-ice the flight, system 250 over very short time intervals.

An embodiment of the invention allows the ice prevention system to operate in an energy conservation mode by embedding parting strips 308 into the thermoelectric skins 244A,244B,244C. Should there be need or desire to conserve power while performing anti-icing it can be achieved by carefully configuring electrical circuit connections within the skin. In the energy conservation mode, higher electrical power in amounts sufficient to operate in evaporative mode is delivered to the semiconductor elements embedded within the areas delineated by the parting strips 308. The parting strips 308 are separated by distances 310,312 that are sufficient to loosen and break away all ice chunks formed within the remaining surface areas 314 bounded by the parting strips 308 without completely melting it and evaporating it. Energy is conserved by routing lower levels of power to the remaining surface areas 314 in amounts sufficient to melt the interfacial bonds between the skin surface and the formed ice (running-wet mode) to keep the aerodynamic surface free of ice without fully evaporating it. The energy conservation mode can be hardwired to be a permanent characteristic of the skin, or it may be a programmable option of the power supply regulating currents through the thermoelectric skins. Over time, the high thermal conductivity of MAX-phase surface volumes brings the entire exterior skin surface temperature to the temperature transferred through the parting strips through thermal equilibration, but at a lower rate than would be achieved through a non-energy conserving mode.

Figure 14A:
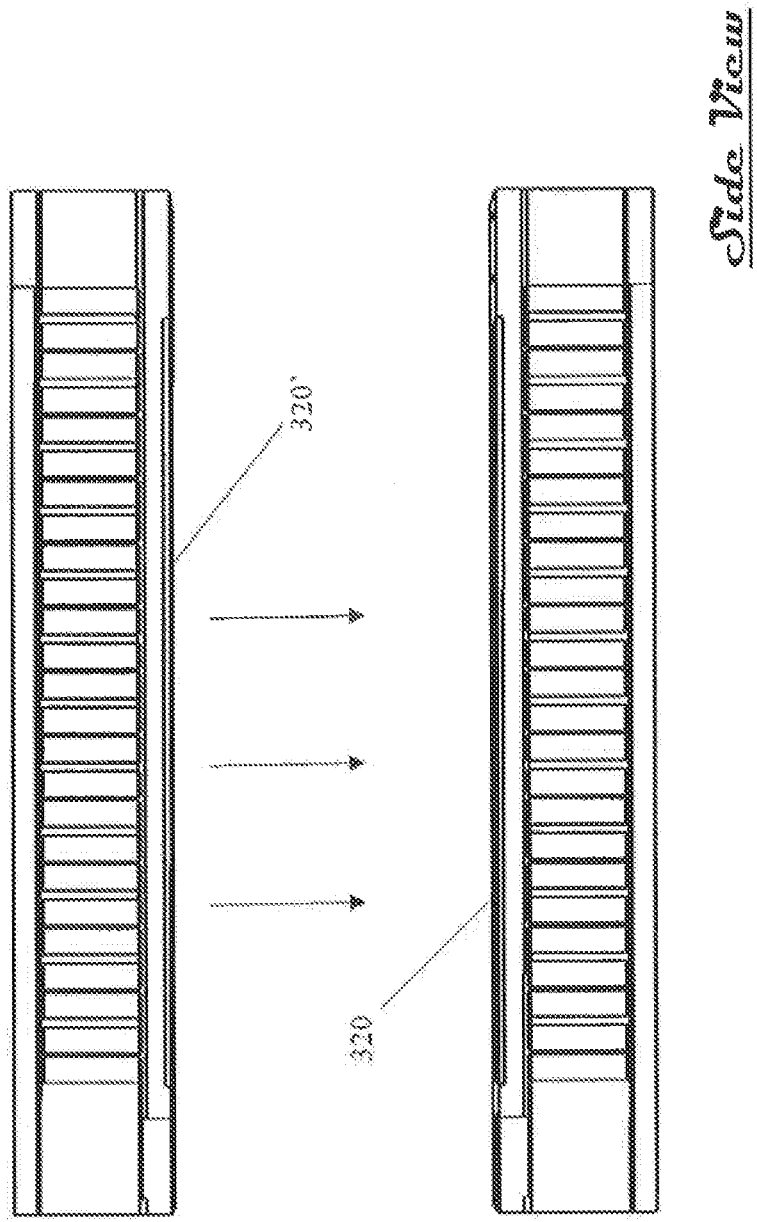
FIGS. 14A thru 14O illustrate methods claimed to form pliable thermoelectric skins.
Figure 14B:
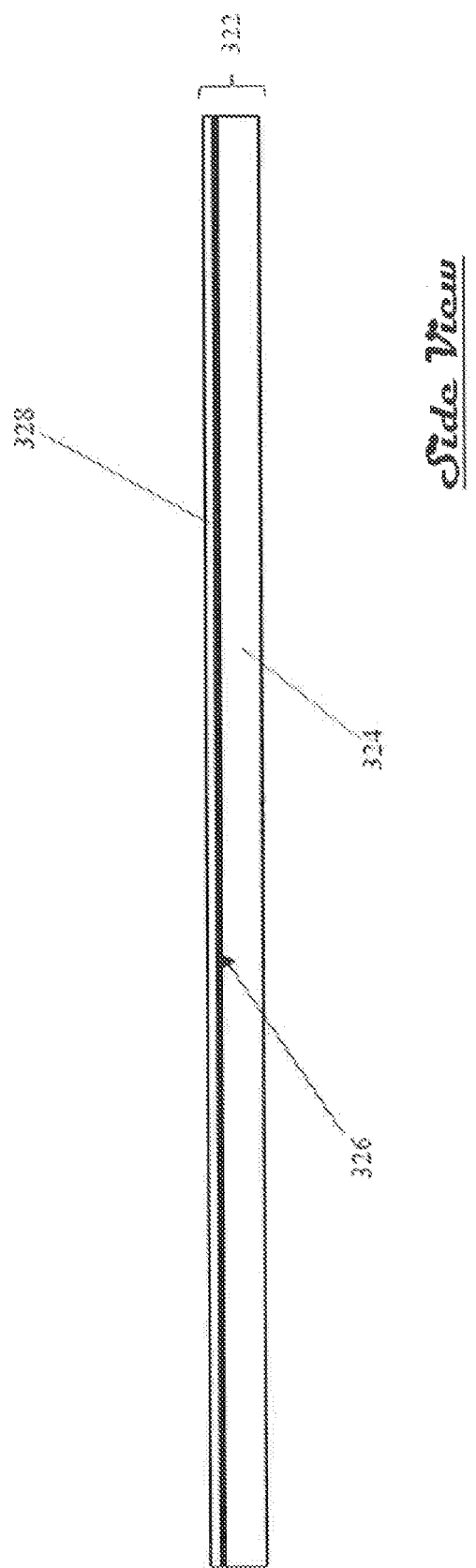
Figure 14C:
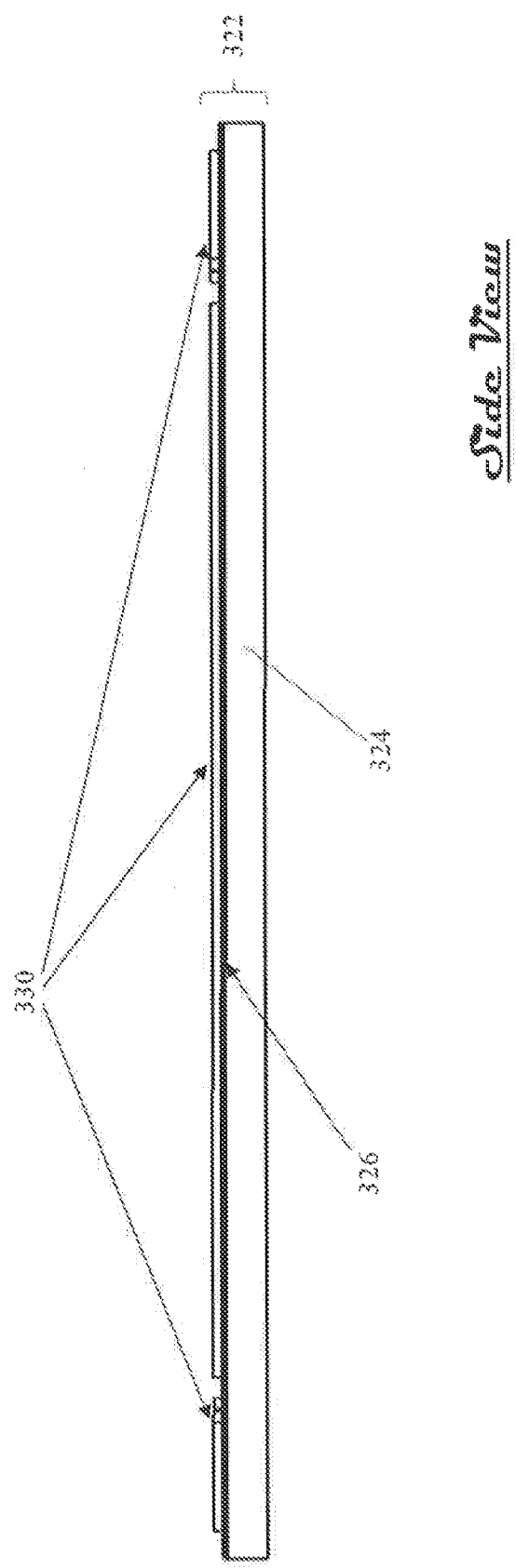
Figure 14D:
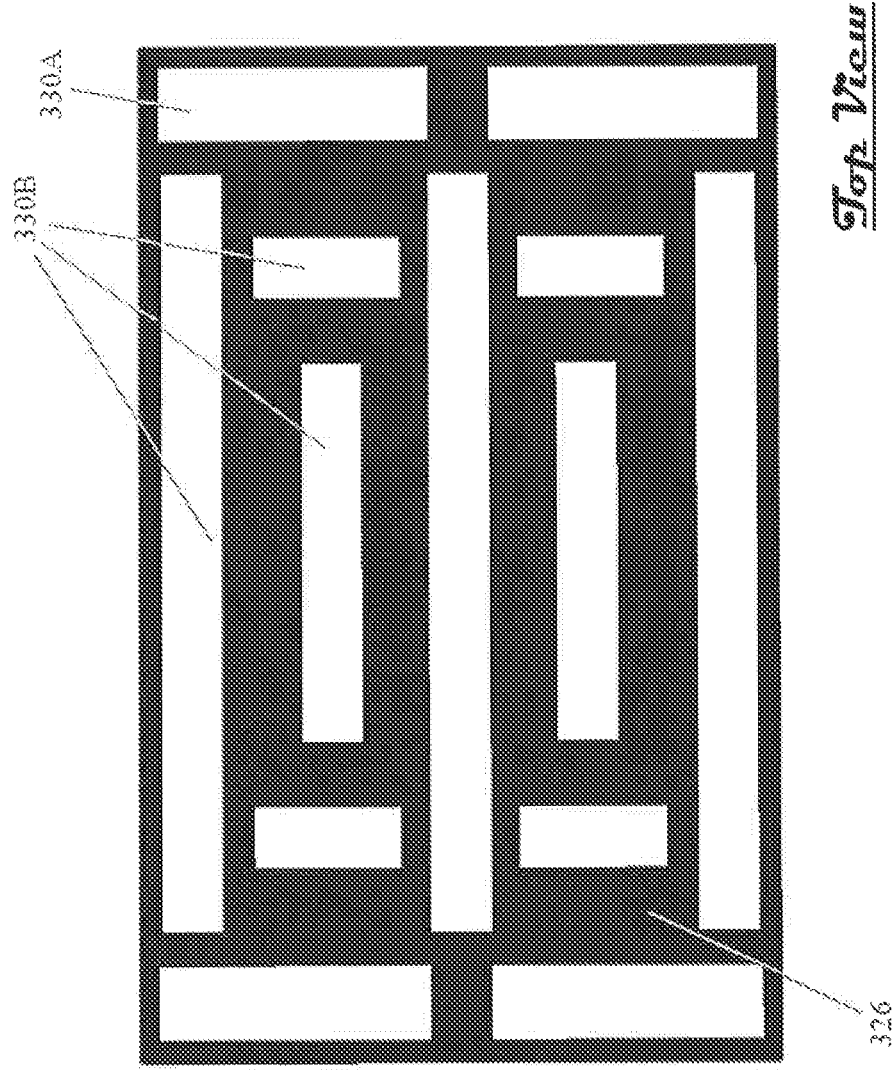
Figure 14H:
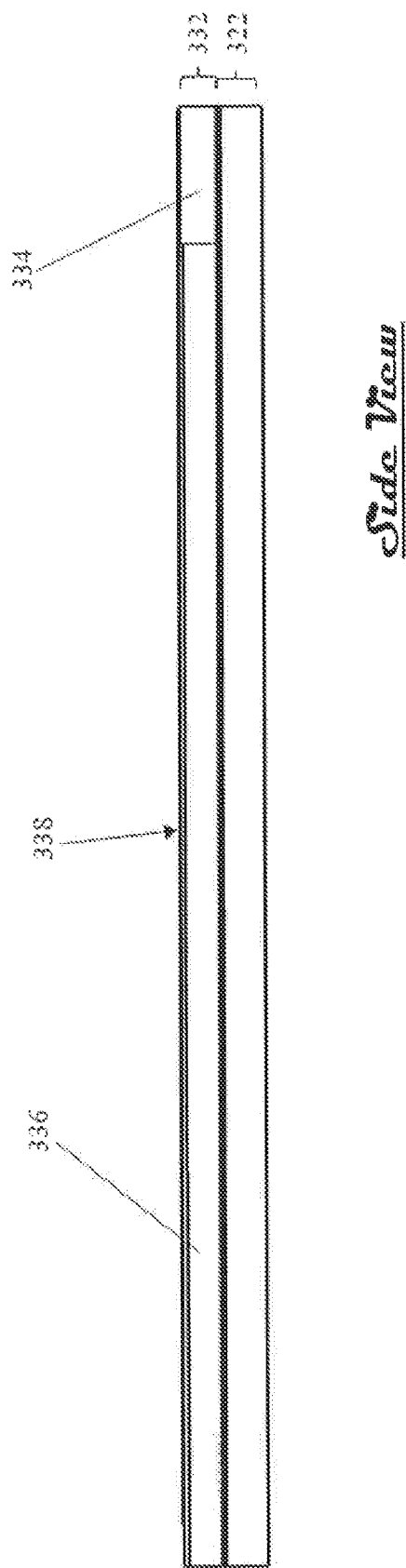
Figure 14F:
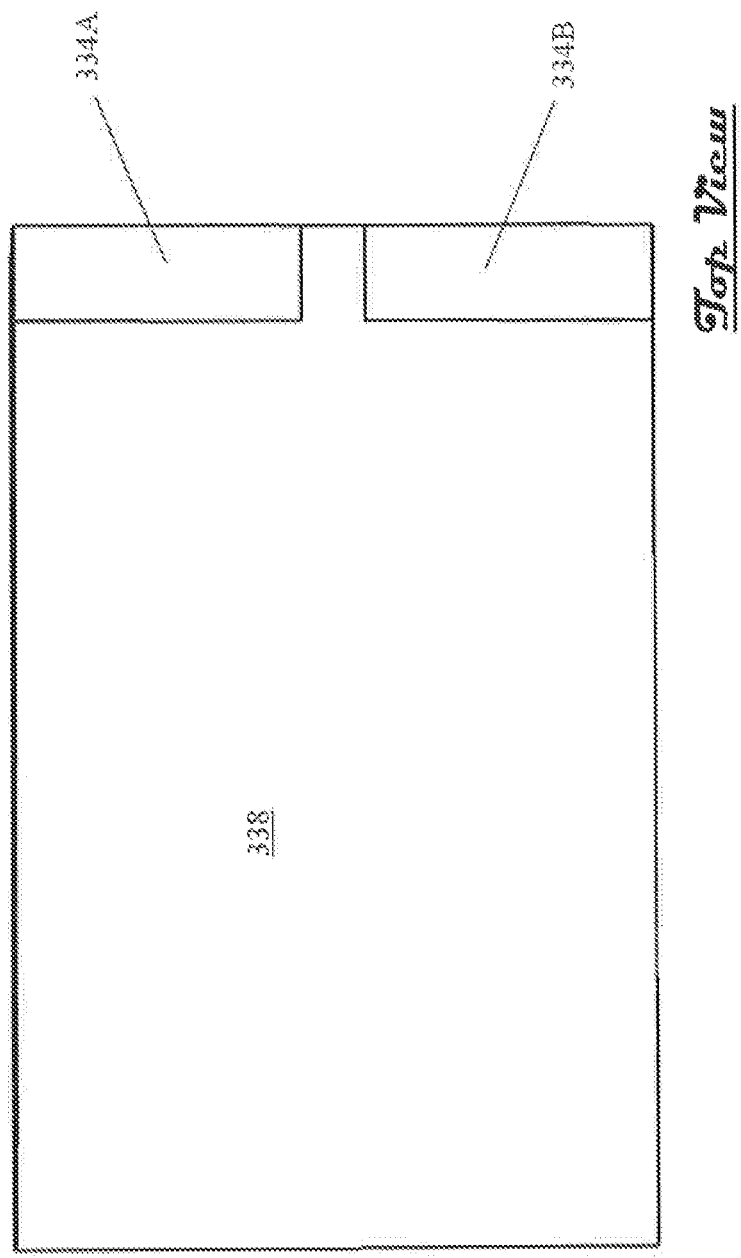
Figure 14G:
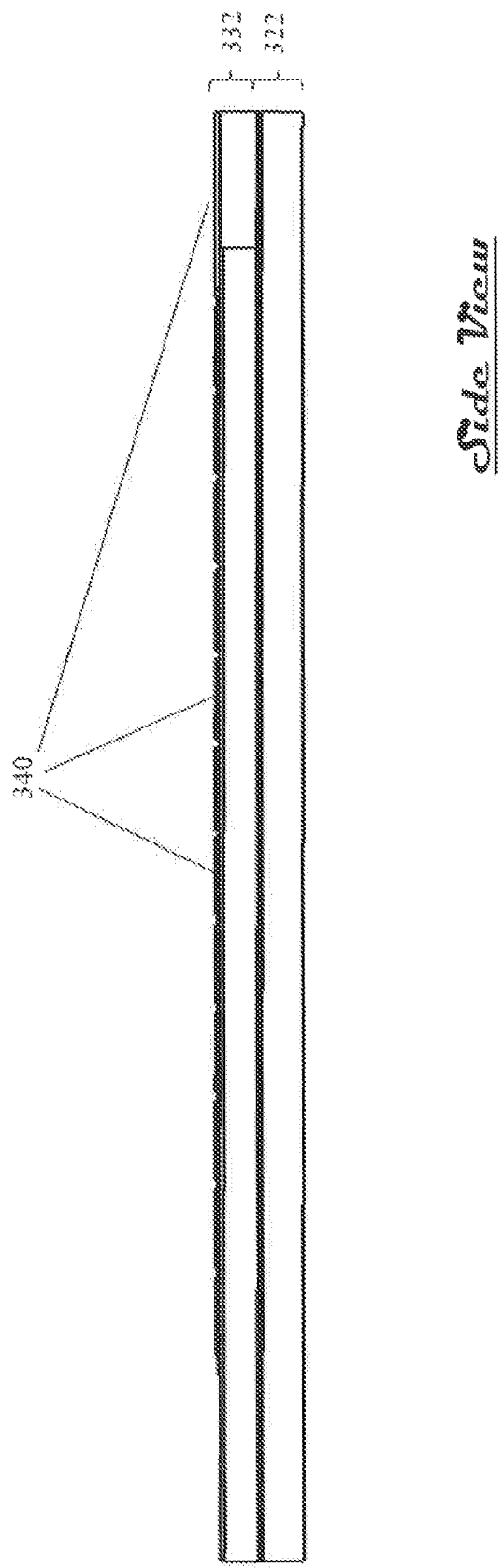
Figure 14H:
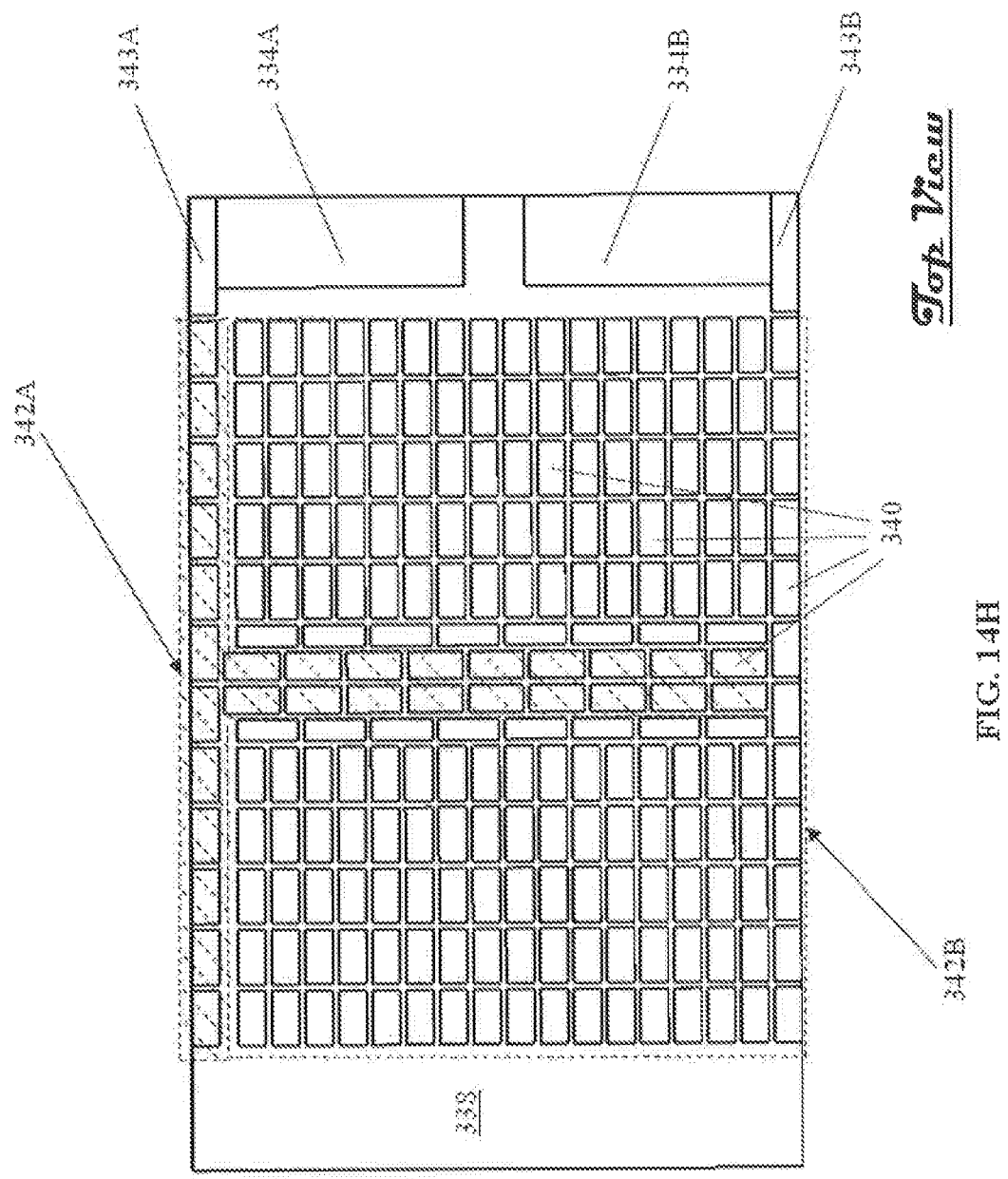
Figure 14I:
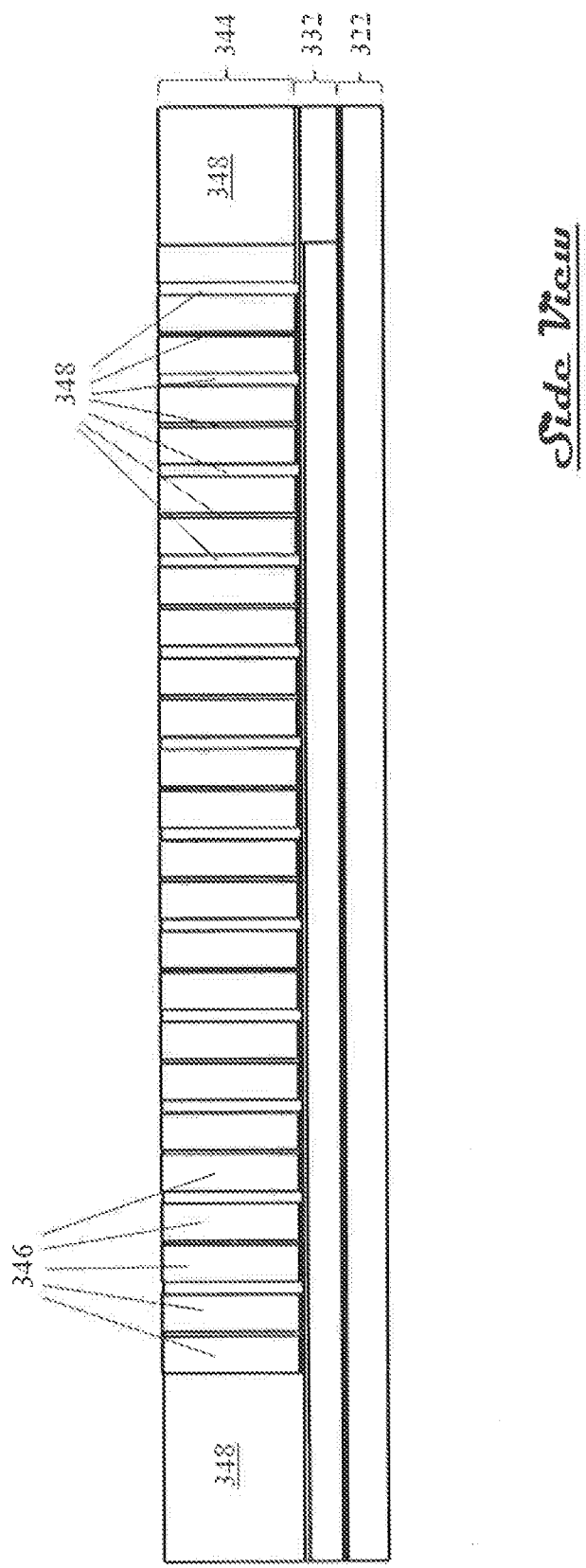
Figure 14J:
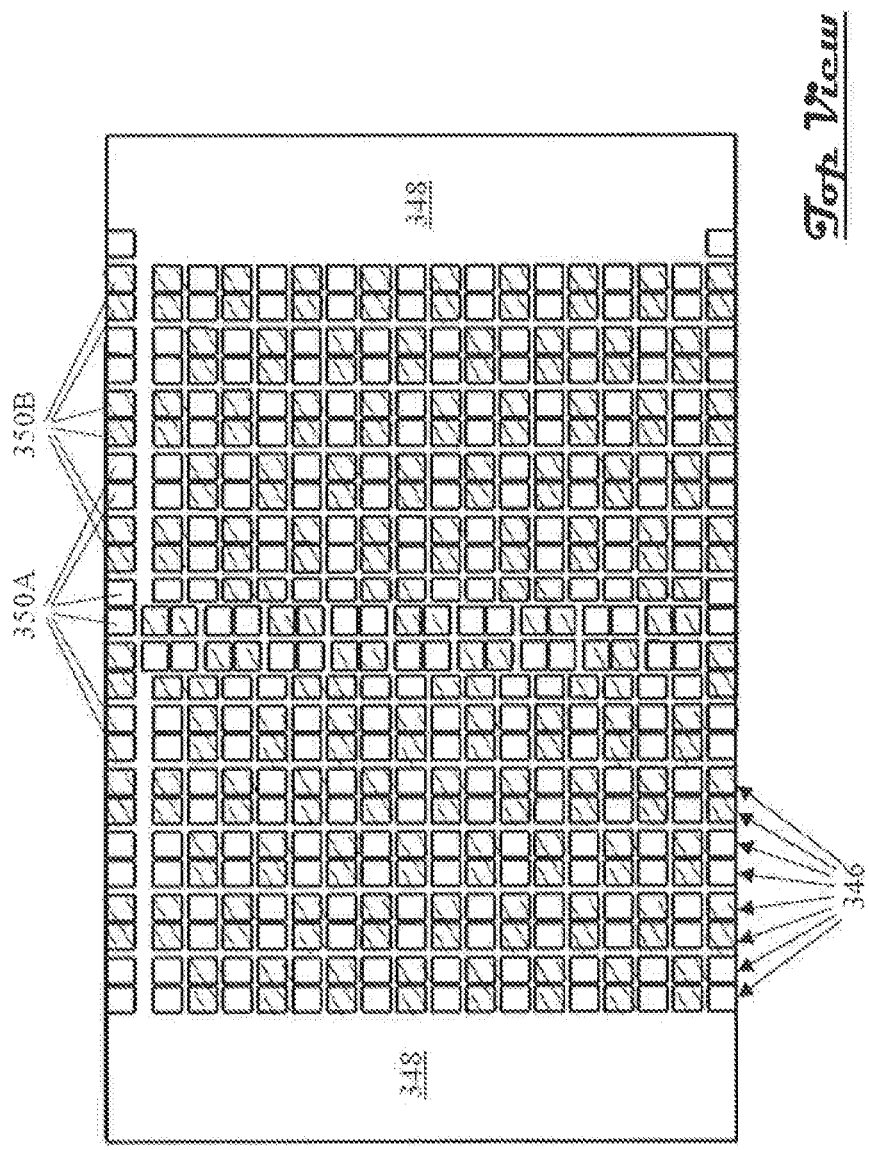
Figure 14K:
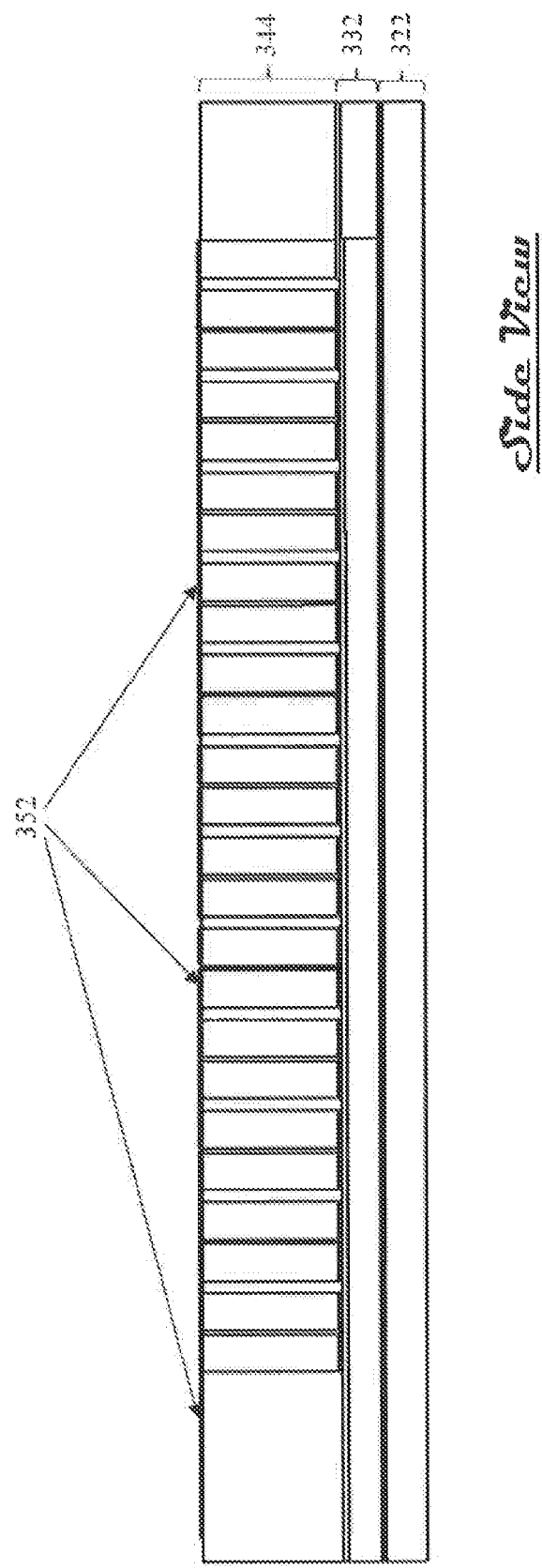
Figure 14L:
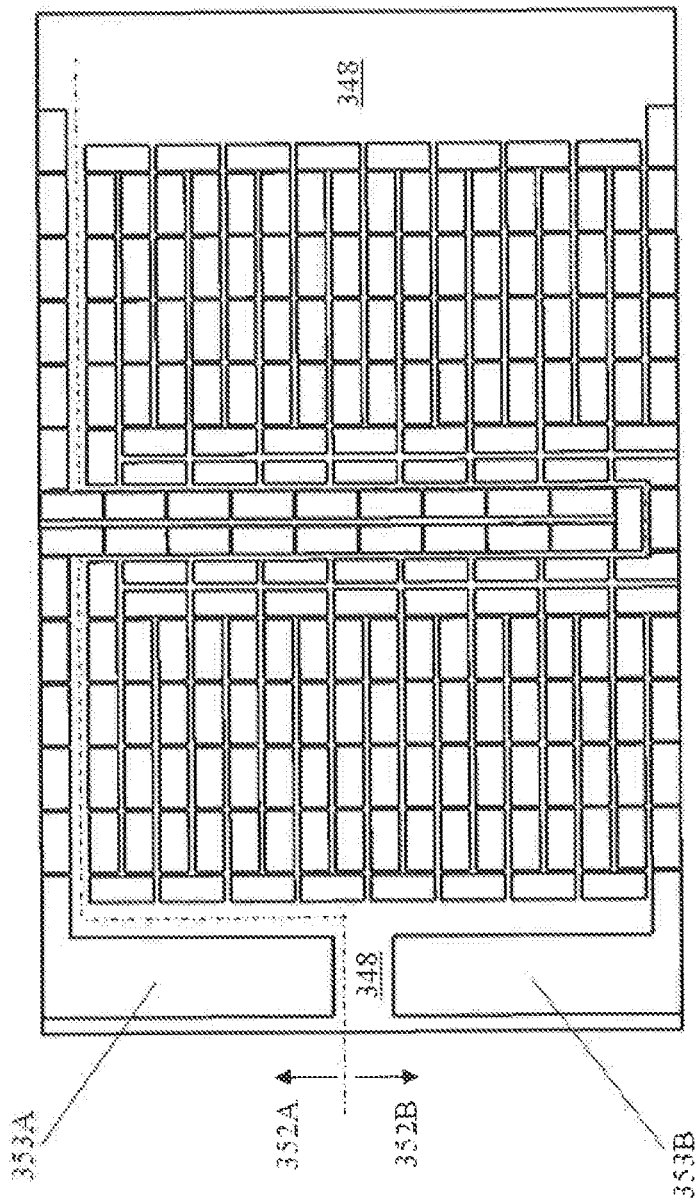
Figure 14M:
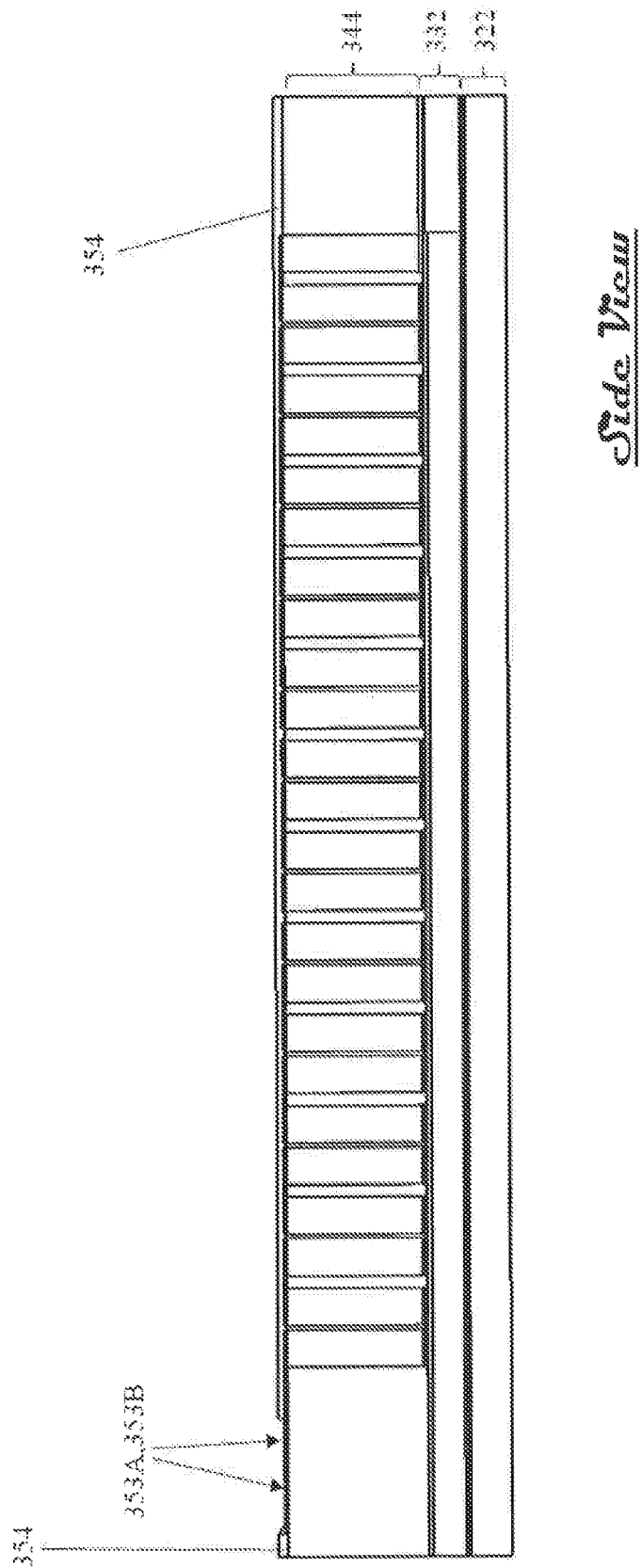
Figure 14N:
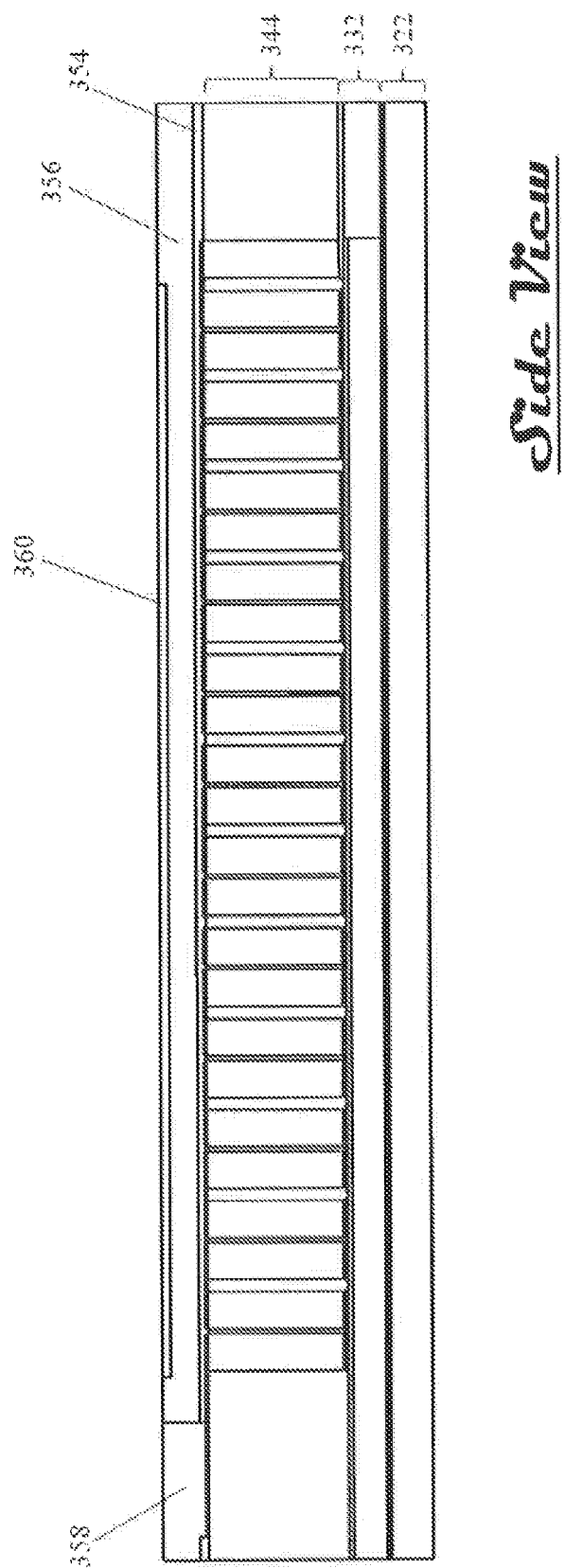
Figure 14O:
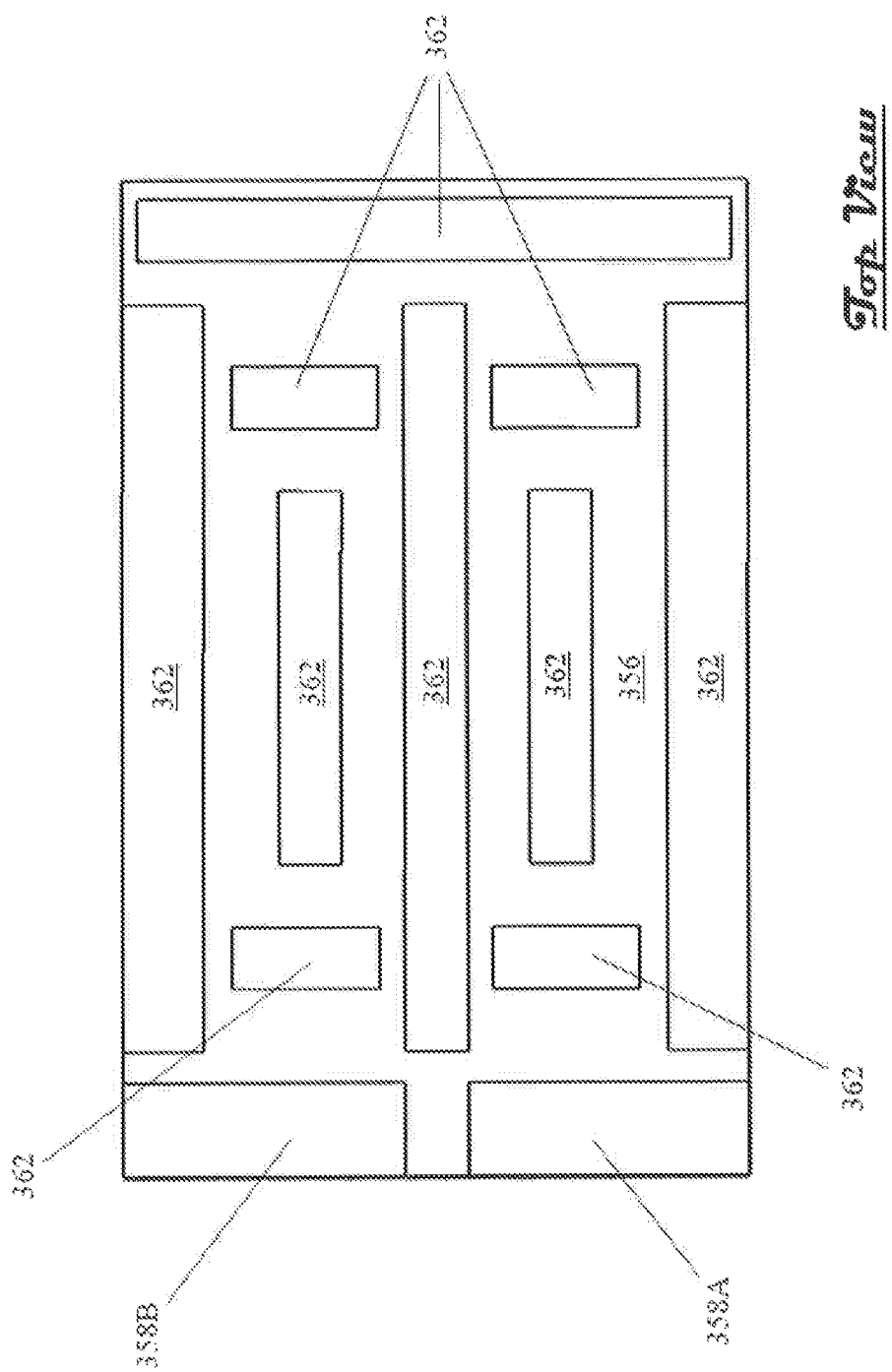

The fabrication of a pliable high-efficiency thermoelectric skin 320 is illustrated in FIGS. 14A thru 14O. The flexibility of LCD spray technologies allow the methods articulated in FIG. 14A through FIG. 14O and the accompanying passages below to be applied to forming thermoelectric skins 320 directly upon an aerodynamic surface by selectively depositing and plasma annealing deposited material through contoured masks. Methods to form the thermoelectric skin 320 as a workable sheet are described herein to illustrate their compatibility with modern aircraft construction methods by incorporating the thermoelectric system within aerodynamically shaped multi-ply structures comprising carbon fiber, glass fiber and epoxy being adopted in wing slats and empennage surfaces of large commercial aircraft.

The pliable thermoelectric skins 320 are formed upon an easily separable base substrate 322 such as a peel-apart foil comprising a sacrificial carrier substrate 324, a separable chromate layer 326, and a surface adhesion layer 328 shown in FIG. 14B. The surface adhesion layer 238 does need not to be more than 5 μm thick. The material that forms the sacrificial carrier substrate 324 and surface adhesion layer 328 should be identical (or nearly identical) to the material that forms the aerodynamic surface 300 (FIG. 13) when the thermoelectric skins 320 are adhered directly to that surface by means of a metallurgical bond (see discussion below). In these cases, if the aerodynamic surface is composed of aluminum, titanium, or alloys thereof, then the carrier substrate 322 and surface adhesion layer 326 should be composed of identical or nearly identical compositions of those surface metals or alloys thereof. In instances where it is desirable to embed the thermoelectric skins within a carbon composite, the material forming the carrier substrate 322 and the surface adhesion layer 326 should comprise a mechanically hard material, like titanium, and that material should be sprayed using LCD or molten metal techniques, on to the base carbon composite stack prior to forming the final assembly (see FIGS. 15A thru 15E). When bonded directly to a lower level thermoelectric skin 320 in the stack, the surface adhesion layer 328 should be the same as the high electrically conductivity material, preferably copper, used to form the electrical connections between the semiconductor elements 328A,328B,328C,328D integrated into the thermoelectric skin 320. The surface adhesion layer 326 is patterned to forum interlayer bonding areas 330. (See FIGS. 14C&14D). The bonding areas 330 are used to provide mechanical adhesion and, in some instances, to make electrical contact with additional bonding areas 330' integrated within additional thermoelectric skins 320' that are placed adjacent to or within a stacked assembly of the thermoelectric skins 320 as discussed below.

LCD manufacturing methods, described in greater detail in applications '698, '159, '042, '405, '012, '112, '222, 922A, and '922B incorporated herein by reference, are used to form a first composite layer 332 that consists of a first electrical contact 334 consisting of highly electrically conductive material that is selectively deposited on bonding areas 330A, and a bottom surface volume 336 comprising a MAX-phase material. It is preferable to subdivide the first electrical contact 334 into at least two (2) distinct contact pads 334A,334B, wherein the contact pad 334A forms the input to a thermoelectric circuit that would receive higher electrical power to form parting strips 308, while the other contact pad 334B services circuit elements in the remaining areas 314. The MAX-phase material may contain aluminum nitride (AlN), which has relatively high thermal conductivity (70-210 $W \cdot m^{-1} \cdot K^{-1}$ in polycrystalline phases) for an electrically insulating ceramic, however, it is more frequently desirable to maximize thermal transfer using MAX-phase materials that have the highest possible thermal conductivity ($\geq 300$ $W \cdot m^{-1} \cdot K^{-1}$) in this instance it is preferable to insert an electrically insulating medium 338, such as an aluminum nitride containing MAX-phase material, between material elements comprising the first electrical contact 334A and the bottom surface volume 336 as depicted in FIGS. 14E&14F. The layer thickness of the first composite layer 332 may range from 1-15 μm depending upon the mechanical strength desired from the body, but could optimally have a layer thickness in the range from 2.5-7 μm.

LCD manufacturing methods are used to fort a lower patterned trace layer 340 of electrically conductive material as shown in FIGS. 14G,14H. The lower patterned trace layer may be electrically insulated from an electrically conducting bottom surface volume 336 by a thin (0.2-2 μm) patterned trace insulator layer (not shown) comprising aluminum nitride MAX-phase material. The lower patterned trace layer 340 is used to form half of the electrical wiring that connects semiconducting thermoelectric elements. The lower patterned trace layer may also be segregated into two separate circuits 342A,342B having separate input pads 343A,343B in electrical communication with first electrical contacts 334A,334B, respectively, to allow higher power to be routed to regions that are used as parting strips 308 though the primary circuit 342A, and lower power to be routed to remaining areas 314 though the secondary circuit 342B. The total thickness of the lower patterned trace layer 340 and thin patterned trace insulator layer will be determined by the current load, but should be less than 2-10 μm.

Figure 9:
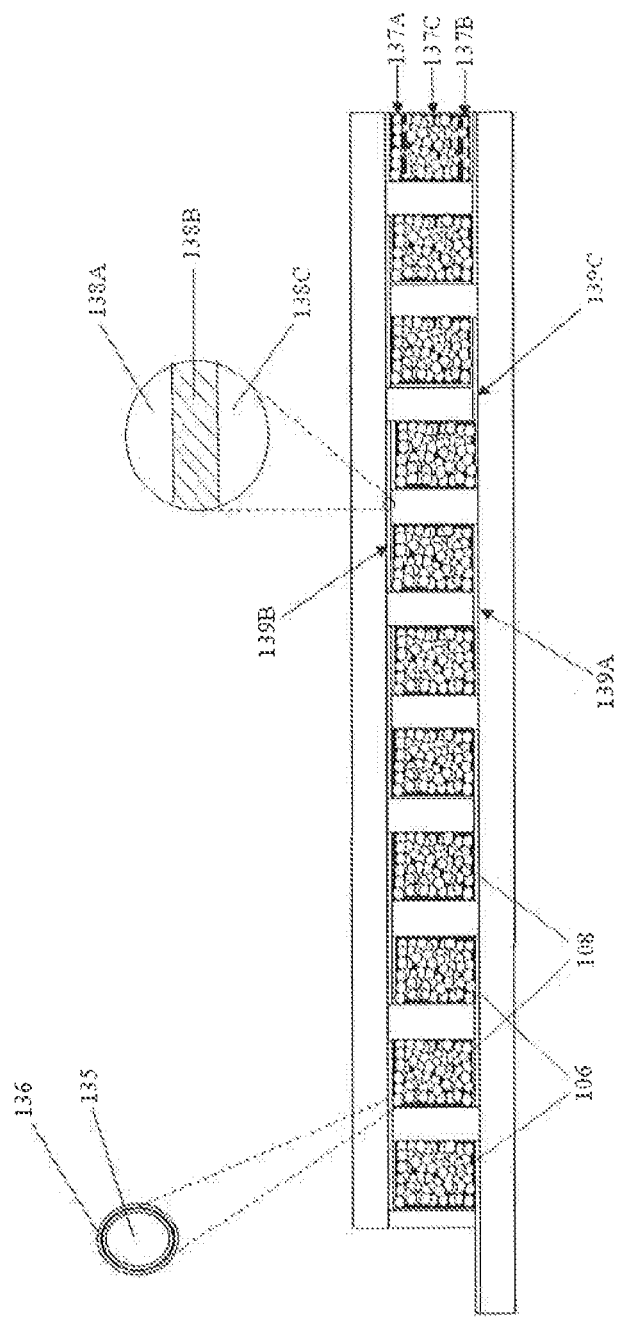
FIG. 9 illustrates a preferred microstructure for semiconductors employed in the invention.

LCD methods are used to reduce the probability for breaks in the patterned trace layers by embedding a low expansion member as depicted in FIG. 9 to form a mechanical constraint within the electrically conductive material forming the patterned trace layers or any other component member that has a sufficiently high coefficient of thermal expansion ("CTE") to induce a gross thermal expansion mismatch with other materials integrated into the thermoelectric skin. The purpose of the mechanical constraint is to reduce thermally induced stress within the thermoelectric skin under operating conditions as instructed in the '715 and '432 applications. The material used for the low expansion member is selected to have a higher hardness and lower coefficient of thermal expansion and may comprise a high hardness, low-CTE medium metal, such as tungsten, molybdenum, titanium, or an alloy, such as invar, kovar, or a suitable superalloy. The mechanical constraint layer 138B is spray deposited through a mask having an identical layout to the patterned trace layers, but having narrower trace widths upon a lower patterned trace layer 340. The mechanical constraint is then covered by an enveloping lower patterned trace layer.

Figure 5A:
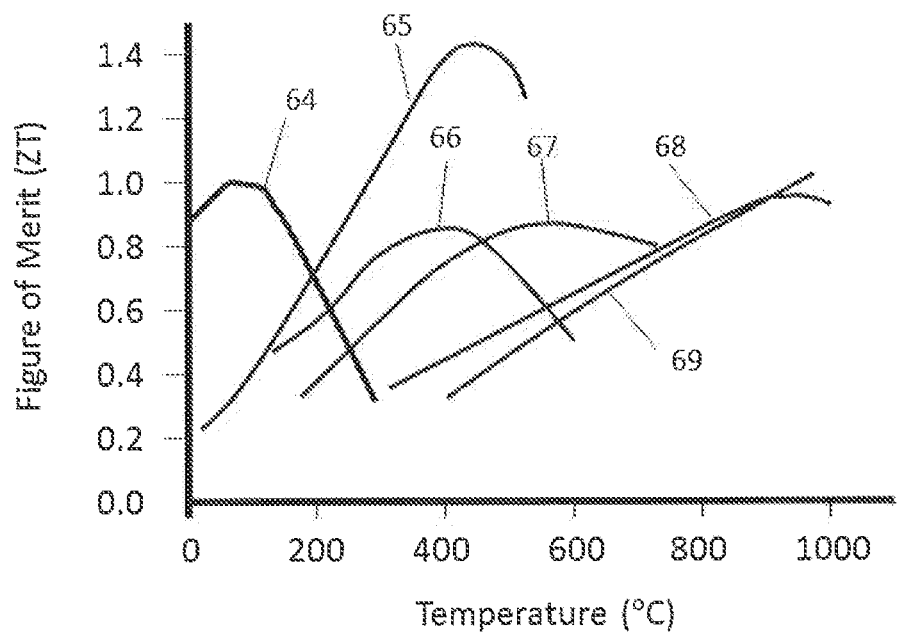
FIGS. 5A,5B depict thermoelectric performance of various n-type and p-type semiconductor families as functions of temperature.
Figure 5B:
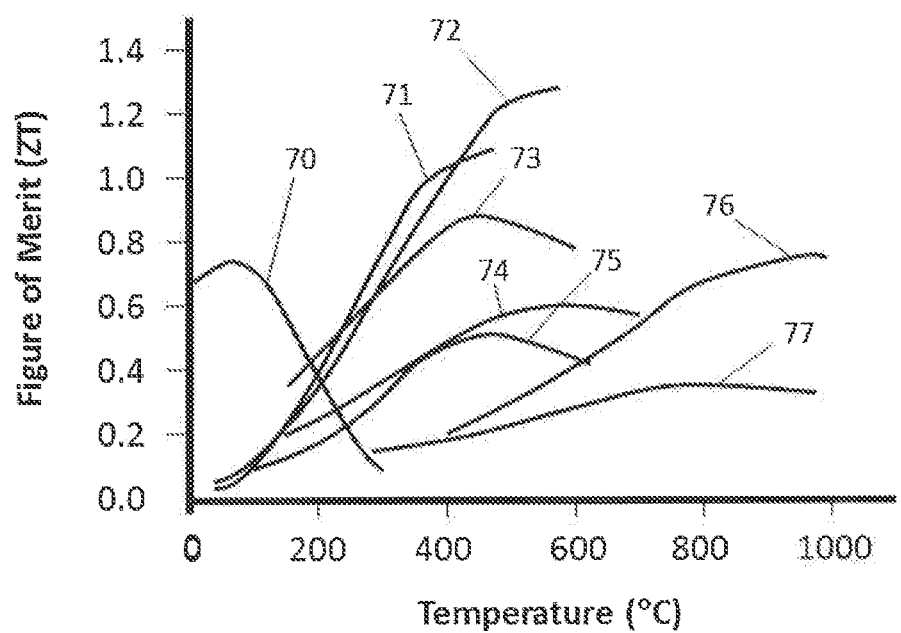

FIGS. 14I,14J depict a main thermoelectric body layer 344 consisting of an array of thermoelectric elements 346, comprising n-type and p-type semiconductor material, and a thermally and electrically insulating dielectric medium 348, preferably an amorphous silica dielectric medium, all formed by selective deposition LCD manufacturing methods. The desired temperature range over which anti-icing or de-icing systems might be expected to operate in some applications may be quite broad (−60° F. to 80° F., or −51° to 26.7° C.). As illustrated in FIGS. 5A,5B different semiconductor compositional families may be more or less optimal over the entire desired range of operating temperatures, particularly in power generation applications. Therefore, a specific embodiment of the invention divides the array of thermoelectric elements 346 into sub-arrays 350A,350B, wherein the first sub-array 350A consists of semiconducting materials or quantum-well structures having a density of states, $\rho(E)$, and Fermi functions, $f(E)$, (see equations 4&5) that optimize thermoelectric performance over a lower range of desired operating temperatures, while the second sub-array 350B consists either of a different semiconducting material, or the same semiconducting material as that in the first sub-array 350A which has a different quantum-well structure that modifies the density of states, $\rho(E)$, and Fermi functions, $f(E)$, to optimize thermoelectric performance over the higher range of desired temperatures. This concept may be extended to include a plurality of sub-arrays comprising a plurality of semiconducting materials having density of states, $\rho(E)$, and Fermi functions, $f(E)$, that are optimized to function over a plurality of temperature bands within the desired range of operating temperatures. A thermoelectric module containing a plurality of sub-arrays 350A,350B to optimize efficiency over a wide band of operating temperatures is particularly useful in power generation applications.

The steps to complete the thermoelectric skin 320 include forming an patterned electrically conductive layer 352 for the upper traces of the primary 352A and secondary 352B circuits, having primary circuit 353A and secondary circuit 353B output pads (see FIGS. 14K,14L), an electrically insulating trace medium 354 (if necessary) (see FIG. 14M), an upper surface volume 356 that preferably comprises a MAX-phase material, a second electrical contact(s) 358 (358A,358B), and a surface adhesion layer 360 used to form vertical bonding areas 362 (See FIGS. 14N,14O). The separable base substrate 322 is subsequently removed prior to assembling the pliable thermoelectric skin 320 into a stack or mounting it onto an aerodynamic surface 300. The second electrical contact(s) 358 vertical bonding areas 362 are used to form metallurgical bonds with other thermoelectric skins 320' when forming stacked thermoelectric circuits.

The second electrical contact 358 represents the termination of the thermoelectric circuit contained within the skin. It may be connected to ground or to the electrical input of another thermoelectric skin. As such, it is preferable to locate the second electrical contact 356 (356A,356B) on an opposing end of the thermoelectric skin 320 from the first electrical contact 334 (334A,334B) to facilitate electrical registration between the different thermoelectric skins 320, 320', whether they are either assembled in a vertical stack or placed adjacent to one another across a surface. (See FIG. 14A). When forming vertical stacks of thermoelectric skins, it is recommended to interleave mirror image sheets 320' to assure circuit integrity and strong metallurgical bonding between sheets in the stack.

Figure 15A:
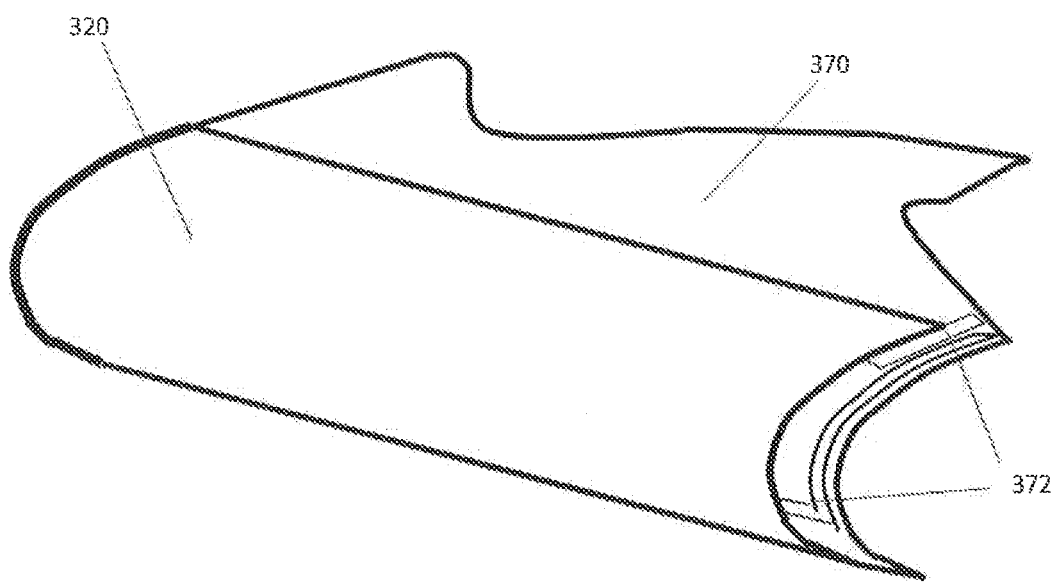
FIGS. 15A,15B,15C,15D illustrate methods to form a high efficiency composite thermoelectric circuit as an integral member of an aerodynamic surface.
Figure 15B:
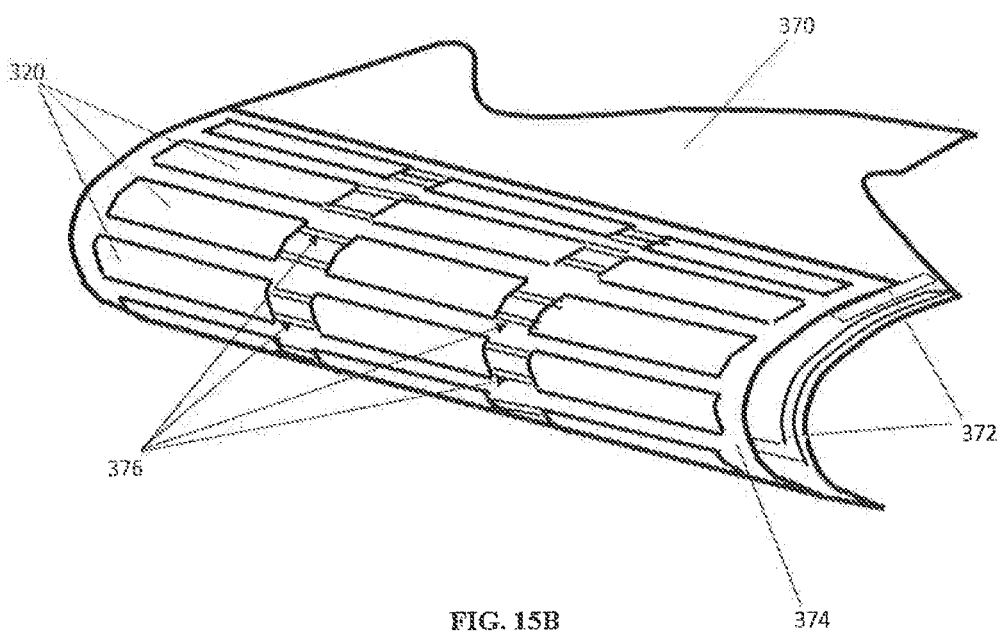

Reference is now made to FIGS. 15A,15B,15C,15D to illustrate methods used to embed pliable thermoelectric skins 320 within a carbon composite aerodynamic surface 300. The use of modular components has become a preferred manufacturing method to facilitate assembly and repair of the aerodynamic surface 300 and to provide wider dynamic range over the flight system's control surfaces. Reference is now made to FIG. 15A, to illustrate the assembly of a thermoelectric skin 320 into a modular component 370, such as a wing slat, that subsequently is used to form the aerodynamic surface 300. The same methods (discussed below) that integrate a plurality of thermoelectric skins 320 into a modular component 370 are adapted to mount the thermoelectric skin directly on the aerodynamic surface 300. A pliable thermoelectric skin 320 may be given physical dimension that is sufficiently large to substantially encompass the entire surface of the modular component 370, so it can be mounted as a single piece as shown in FIG. 15A. An electrical harness 372 is affixed to the modular component that maintains electrical communication to the flight system's power bus (not shown). Alternatively, a plurality of pliable thermoelectric skins 320 made to smaller physical dimension can be mounted piecewise onto the modular surface 370 as shown in FIG. 15B. In this instance the electrical harness 372 is in electrical communication with a sheet harness 374 that contains surface wiring traces 376 that electrically connect adjacent thermoelectric skins 320.

Figure 15C:
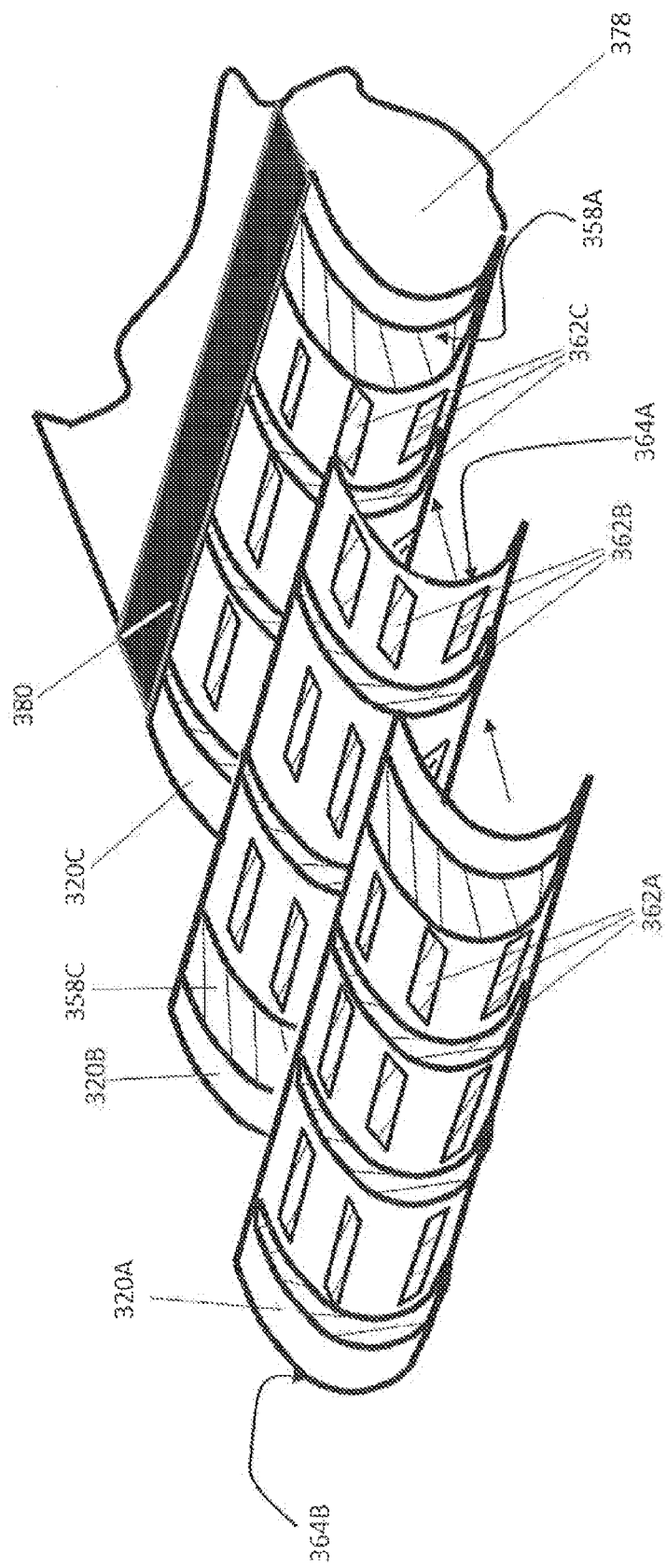

A preferred embodiment of the invention Shown in FIG. 15C embeds a plurality of thermoelectric skins 320A,320B, 320C within a carbon composite material used to form an aerodynamic surface 300, such as a wing slat. Wing slats are repositionable sections of the leading edge of a wing's aerodynamic surface 300. A male shaping tool 378 forms a mold that conforms to pre-specified curvatures of the leading edges across the width of the slat. The thermoelectric skins 320A,320B,320C are overlaid in succession upon a hardened stack of the carbon-fiber expoxy prepreg materials 380 shaped by the male shaping tool 378. Methods similar to those detailed in the '646 and '099 applications are used to form metallurgical bonds between the vertical bonding areas 362A, 362B, 362C,372D,362E and electrical contacts 358 used to form surface adhesion regions 360 between thermoelectric skin layers 320A, 320B, 320C in the fully assembled stack. The thermoelectric circuit is most easily completed when the electrical contacts 358B,358D on the inner surfaces 364A,364B are patterned as mirror image counterparts to the electrical contacts 358A,358C on the surface to which the inner surface 364A,364B is bonded as illustrated in FIG. 14A.

The methods to form metallurgical bonds between thermoelectric skins 320A,320B,320C distribute nanoparticles 382 that have the same or similar composition as the metallurgical material forming the bonding areas 362A, 362B, 362C and the electrical contacts 358A,358B,358C, 358D,358E. The steps of attaching the nanoparticle 382 to the surface comprise first forming a colloidal suspension of the nanoparticles in a dilute epoxy and applying nanoparticle-laden epoxy to the desired surface areas. The coated surfaces are then heated at a moderate rate ($\leq 5°$ C.-min$^{-1}$) to 120° C.-150° C. to evaporate the epoxy's solvent. The epoxy is then deflagrated by heating the surfaces to 400° C. to attach the nanoparticles to the desired surfaces. Smaller nanoparticles 382 will have lower melting temperatures due to their higher surface activation temperature. Therefore, it is desirable to use nanoparticles that have diameters in the range of 10-40 nm to activate metallurgical bonding at temperatures in the range of 300° C.-350° C. The metallurgical bonds are formed by aligning and pressing the prepared thermoelectric skins 320A,320B,320C together with a female tool (not shown) and heating the assembly to temperatures in the range of 300° C.-350° C. to form the metallurgical bonds between the bonding areas 362 and electrical contacts 358 within the stack, making it a solid structure matching the pre-specified curvatures of the aerodynamic surface 300. The bottom thermoelectric skin in the stack 320C is affixed to the hardened stack of carbon fiber/epoxy prepreg 380 by forming a metallurgical bond as described above with a metallization layer sprayed onto the hardened stack carbon fiber/epoxy prepreg 380.

Figure 15D:
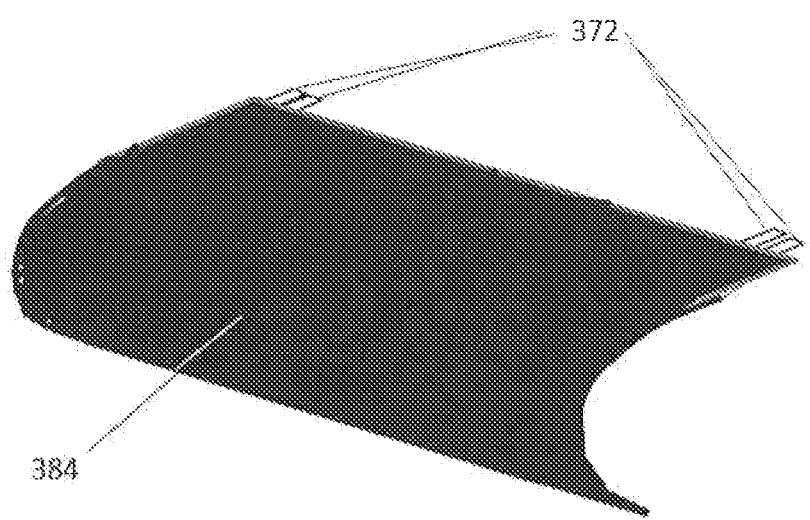

The composite structure is completed by attaching the electrical harnesses 372 to the top and bottom thermoelectric skins in the stack and overlaying the structure with additional layers of ply stack carbon fiber/epoxy prepreg 384. The total number of carbon fiber layers in the finished aerodynamic surface 300 should fall in the range between 15-25 layers. The total number of layers in the finished composite ultimately depends upon the strength and structural requirements of the application for which it is intended. It is recommended to insulate the thermoelectric skins from the carbon fiber with layers of dry woven glass fiber fabric to prevent any galvanic corrosion that might occur between the metallization in the thermoelectric skins 320 and the carbon fiber in the composite stack. While unidirectional or woven carbon fiber/epoxy prepreg layers may be used toward the bottom of the stack, woven carbon fiber is preferred for the layers on top of the thermoelectric skins 320. The entire assembly is the covered with a caul plate (not shown) that forms the exterior surface of the aerodynamic leading edge 252 and is vacuum bagged and cured in autoclave, or cured without means of an autoclave when the epoxy prepreg allows it. FIG. 15D illustrates the completed aerodynamic surface with an internal thermoelectric circuit after it is removed from the molding tool 378.

While the invention is described herein with reference to the preferred embodiments, it is to be understood that it is not intended to limit the invention to the specific forms disclosed. On the contrary, it is intended to cover all modifications and alternative forms failing within the spirit and scope of the appended claims.

What is claimed is:

1. A microelectronic circuit module comprising:
a heat producing semiconductor chip mounted on a packaging element that has micro-channels through which a working fluid is passed to collect and transfer heat from the semiconductor chip;
a thermoelectric module comprising a network of micro-channels embedded within silica dielectric through which the heated working fluid is circulated; and
a first thermally isolated thermoelectric circuit embedded within silica dielectric that consists of a linear array of MAX-phase electrodes interleaved between alternating n-type and p-type semiconducting elements,
wherein the MAX-phase electrodes contain micro-channels through which the working fluid is circulated and progressively cooled.

2. The module of claim 1, further comprising a set of thermally isolated secondary thermoelectric circuits embedded within the silica dielectric adjacent to the first thermoelectric circuit and consist of a n-type and p-type semiconducting elements configured in parallel between MAX-phase electrodes,
wherein a hot electrode of the secondary thermoelectric circuits contain micro-channels through which the working fluid is passed and cooled, and a cold electrode of the secondary thermoelectric circuits is in thermal communication with a thermal reservoir.

3. The module of claim 2, further comprising a controller circuit that monitors the temperature of the various MAX-phase electrodes and adjusts the voltage drops across the different thermoelectric circuits used in the circuit.

4. The module of claim 1, further comprising a MEMS pump adapted for circulating the working fluid.

5. The module of claim 1, wherein the silica dielectric includes distributed added crystalline compounds arranged to improve thermal insulation over that of pure amorphous silica.

6. The module of claim 5, wherein the crystalline compounds include skutterudite crystals separated by atomic layers of alkali ions.

7. The module of claim 1, farther comprising first and second, thermally conductive, surface volumes, each in thermal communication with a separate respective first and second electrically conductive patterned trace layers and connected between the alternating n-type and p-type semiconducting elements.

8. The module of claim 7, further comprising input and output ports providing external electrical connection to at least one of the first or second patterned trace layers.

9. The module of claim 7, Wherein the first and second surface volumes comprise a MAX-phase materials.

10. The module of claim 9, further comprising an insulating layer comprising an aluminum nitride MAX-phase material that electrically insulates the first and second surface volumes from their respective first and second patterned trace layers.

11. The module of claim 7, wherein the first or second surface volume forms a leading edge of an air-flow surface.

12. The module of claim 1, wherein the n-type and p-type semiconducting elements are formed from materials selected from the group consisting of: Skutterudites (AB3), complex Skutterudites ($Z_2A_8B_{13}$), elemental group IV semiconductor Si, Ge, alloyed group IV semiconductor consisting of Si, Ge, Sn, Bi, III-V compound semiconductor, II-VI compound semiconductor, IV-VI compound, metal oxide and mixed metal oxide semiconductor materials.

13. The module of claim 1, wherein the semiconducting elements have carrier concentrations in the range of $10^{17}$ to $10^{19}$ carriers-$cm^{-3}$.

14. The module of claim 1, further comprising ohmic contacts formed in the semiconducting elements having heavily doped layers in the range of $10^{19}$ to $10^{21}$ carriers-$cm^{-3}$, that electrically connect the semiconductor elements to the first and second patterned trace layers.

15. The module of claim 1, wherein the semiconducting elements have a polycrystalline microstructure wherein the size of polycrystalline gains is less than 100 nm.

16. The module of claim 15, wherein the polycrystalline grains form quantum dots comprising a semiconducting granular core with a chemically distinct grain boundary material.

* * * * *